US011765916B2

(12) United States Patent
Iizuka et al.

(10) Patent No.: US 11,765,916 B2
(45) Date of Patent: Sep. 19, 2023

(54) MEMORY DEVICE AND METHOD OF MANUFACTURING MEMORY DEVICE

(71) Applicant: Kioxia Corporation, Tokyo (JP)

(72) Inventors: Takahiko Iizuka, Yokohama Kanagawa (JP); Daisaburo Takashima, Yokohama Kanagawa (JP); Ryu Ogiwara, Yokohama Kanagawa (JP); Rieko Funatsuki, Yokohama Kanagawa (JP); Yoshiki Kamata, Tokyo (JP); Misako Morota, Tokyo (JP); Yoshiaki Asao, Kawasaki Kanagawa (JP); Yukihiro Nomura, Tokyo (JP)

(73) Assignee: Kioxia Corporation, Tokyo (JP)

( * ) Notice: Subject to any disclaimer, the term of this patent is extended or adjusted under 35 U.S.C. 154(b) by 28 days.

(21) Appl. No.: 17/348,839

(22) Filed: Jun. 16, 2021

(65) Prior Publication Data
US 2021/0399049 A1 Dec. 23, 2021

(30) Foreign Application Priority Data

Jun. 17, 2020 (JP) ................................ 2020-104662
Jan. 25, 2021 (JP) ................................ 2021-009629

(51) Int. Cl.
*G11C 11/00* (2006.01)
*H10B 63/00* (2023.01)
(Continued)

(52) U.S. Cl.
CPC ......... *H10B 63/845* (2023.02); *G11C 13/003* (2013.01); *G11C 13/0004* (2013.01);
(Continued)

(58) Field of Classification Search
CPC ... H01L 27/249; H01L 27/2454; H01L 45/06; H01L 45/144; H01L 45/1683;
(Continued)

(56) References Cited

U.S. PATENT DOCUMENTS

| 5,894,447 A | 4/1999 | Takashima |
| 9,025,369 B2 | 5/2015 | Takashima |

(Continued)

FOREIGN PATENT DOCUMENTS

| JP | 2011146631 A | 7/2011 |
| JP | 2019192869 A | 10/2019 |

OTHER PUBLICATIONS

Kinoshita, et al., "Scalable 3-D vertical chain-cell-type phase-change memory with 4F2 poly-Si diodes", VLSI TechnoloQy (VLSIT), pp. 35-36, 2012.

*Primary Examiner* — Viet Q Nguyen
(74) *Attorney, Agent, or Firm* — Holtz, Holtz & Volek PC

(57) ABSTRACT

A memory device includes: a first interconnect; a second interconnect; a first string and a second string whose first ends are coupled to the first interconnect; a third string and a fourth string whose second ends are coupled to the second interconnect; a third interconnect; and driver. The third interconnect is coupled to second ends of the first and second strings and to first ends of the third and fourth strings. Each of the first, second, third, and fourth strings includes a first switch element and a memory cell coupled in series. The memory cell includes a second switch element and a resistance change element coupled in parallel. The third interconnect is coupled to the driver via the first interconnect or the second interconnect.

22 Claims, 62 Drawing Sheets

(51) Int. Cl.
  *G11C 13/00* (2006.01)
  *H10N 70/00* (2023.01)
  *H10N 70/20* (2023.01)

(52) U.S. Cl.
  CPC ........ *G11C 13/004* (2013.01); *G11C 13/0069* (2013.01); *H10B 63/34* (2023.02); *H10N 70/066* (2023.02); *H10N 70/231* (2023.02); *H10N 70/8828* (2023.02); *G11C 2213/75* (2013.01)

(58) Field of Classification Search
  CPC . G11C 13/0004; G11C 13/003; G11C 13/004; G11C 14/0069; G11C 2213/75
  USPC ........................................................ 365/163
  See application file for complete search history.

(56) References Cited

U.S. PATENT DOCUMENTS

| | | | |
|---|---|---|---|
| 9,679,650 B1 | 6/2017 | Sakui | |
| 9,966,136 B2 | 5/2018 | Ogiwara et al. | |
| 10,651,239 B2* | 5/2020 | Yamamoto | H01L 27/2436 |
| 10,686,012 B2* | 6/2020 | Murooka | H01L 45/06 |
| 10,832,742 B2* | 11/2020 | Ota | H01L 27/2436 |
| 10,930,847 B2* | 2/2021 | Yamaguchi | G11C 13/0026 |
| 11,017,854 B2* | 5/2021 | Suzuki | G11C 13/0028 |
| 11,081,526 B2* | 8/2021 | Yamamoto | H01L 45/141 |
| 11,373,703 B2* | 6/2022 | Domae | G11C 13/0069 |
| 2011/0175157 A1 | 7/2011 | Sekine et al. | |
| 2017/0287980 A1* | 10/2017 | Fantini | H01L 27/2427 |
| 2017/0309324 A1* | 10/2017 | Kumar | H01L 45/12 |
| 2019/0333928 A1 | 10/2019 | Nagashima et al. | |
| 2020/0098827 A1* | 3/2020 | Murooka | H01L 45/1233 |
| 2020/0403035 A1* | 12/2020 | Ogiwara | H01L 45/1233 |
| 2022/0367568 A1* | 11/2022 | Ogiwara | H01L 45/1206 |

\* cited by examiner

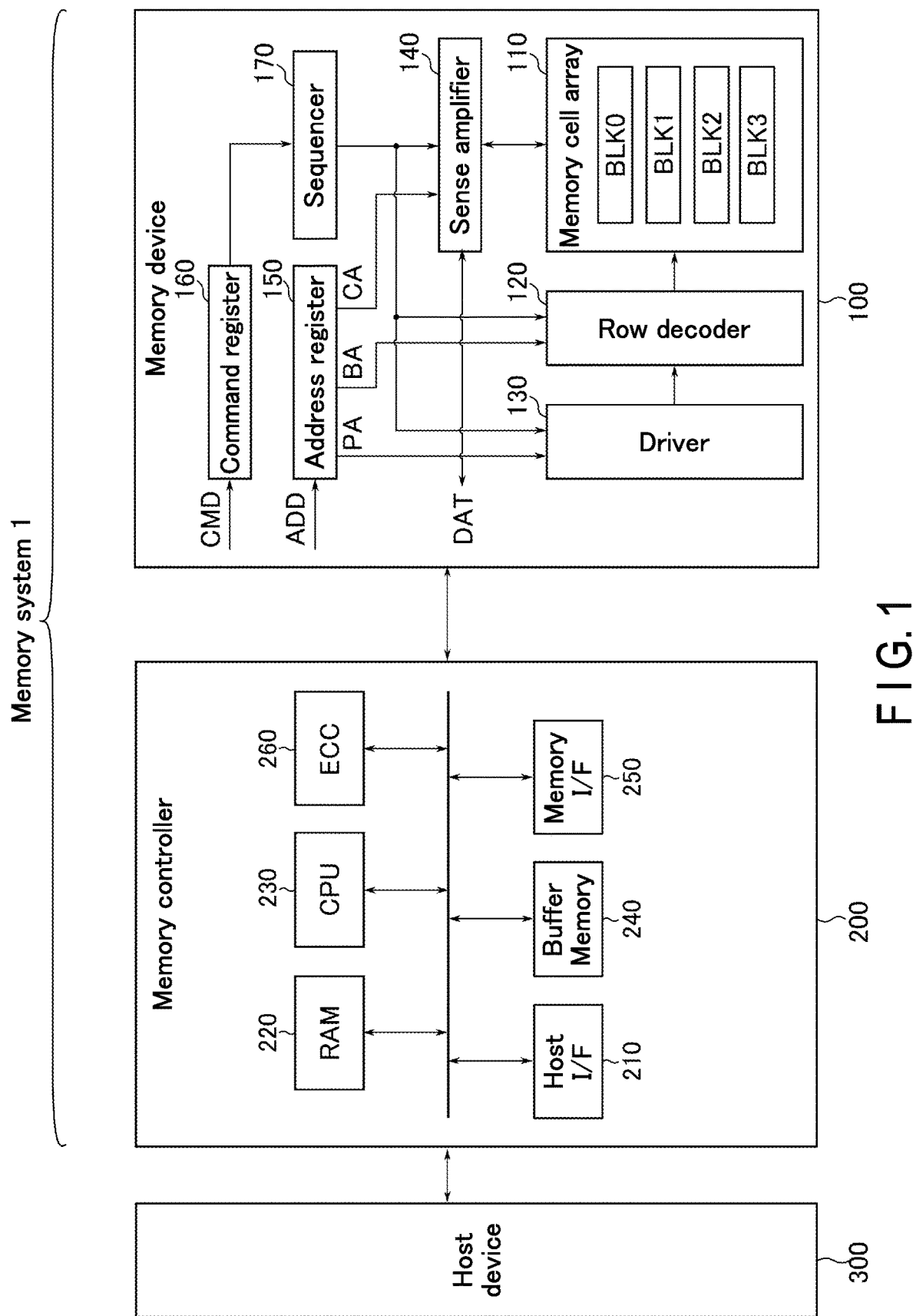
F I G. 1

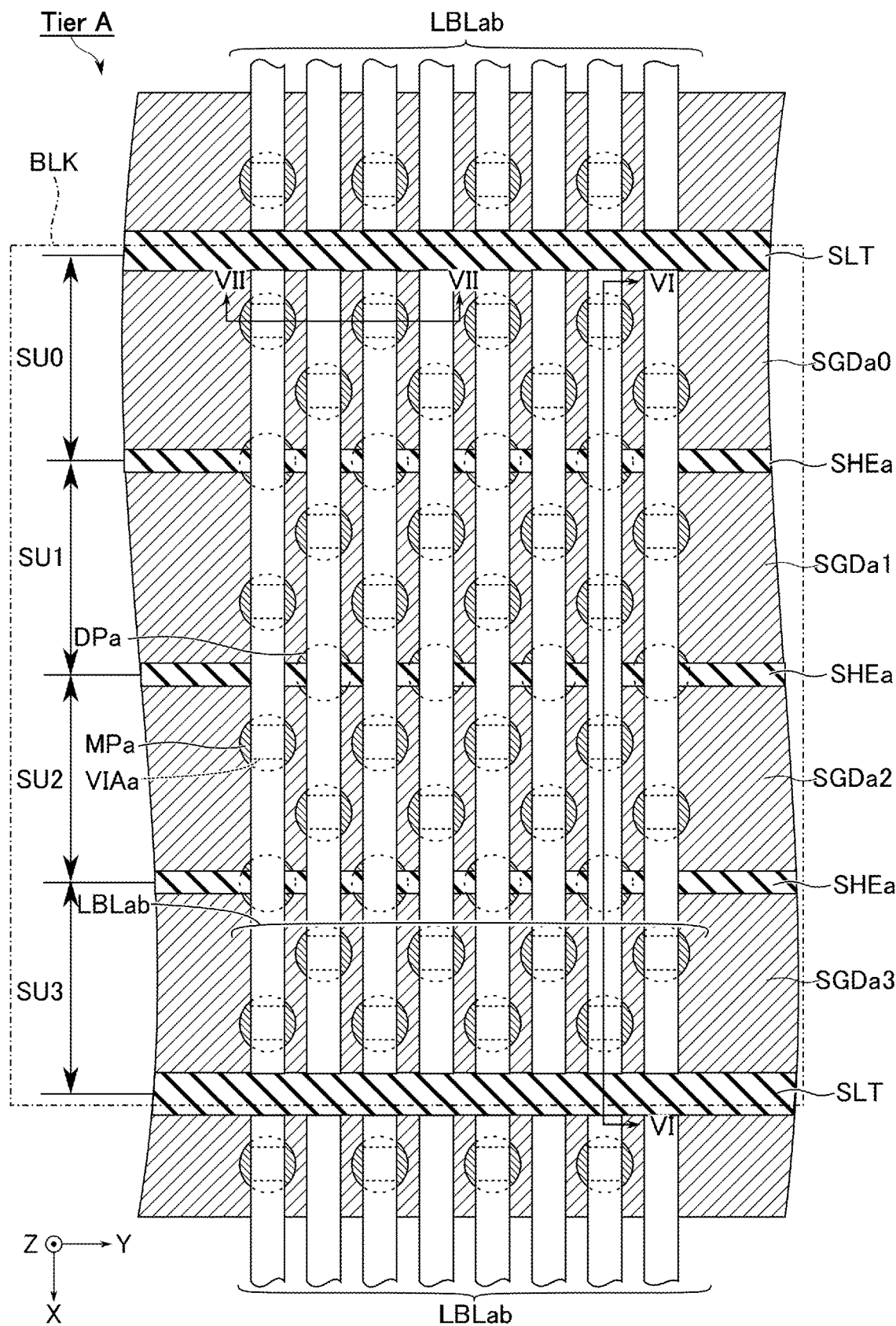
F I G. 4

(A)
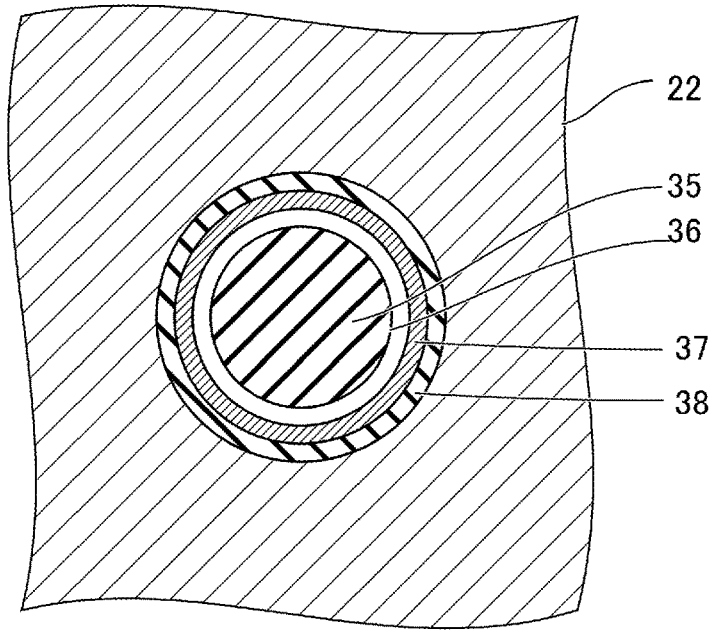
(B)
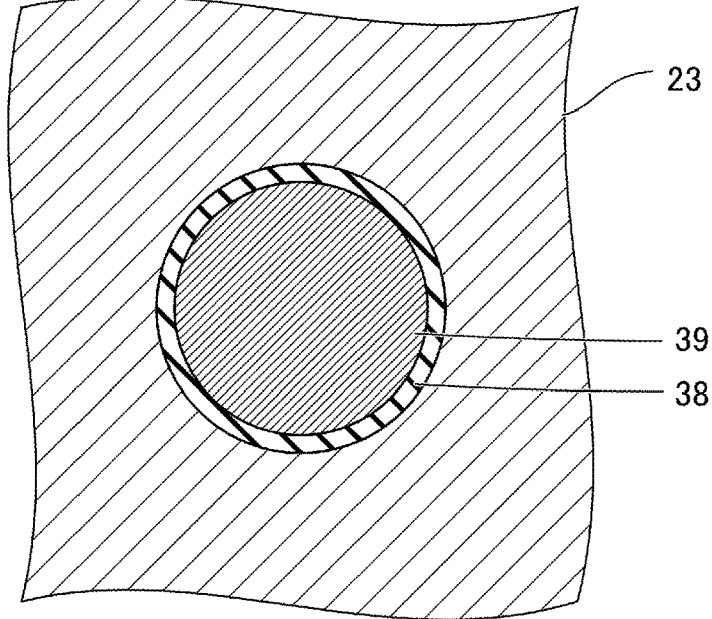
FIG. 8

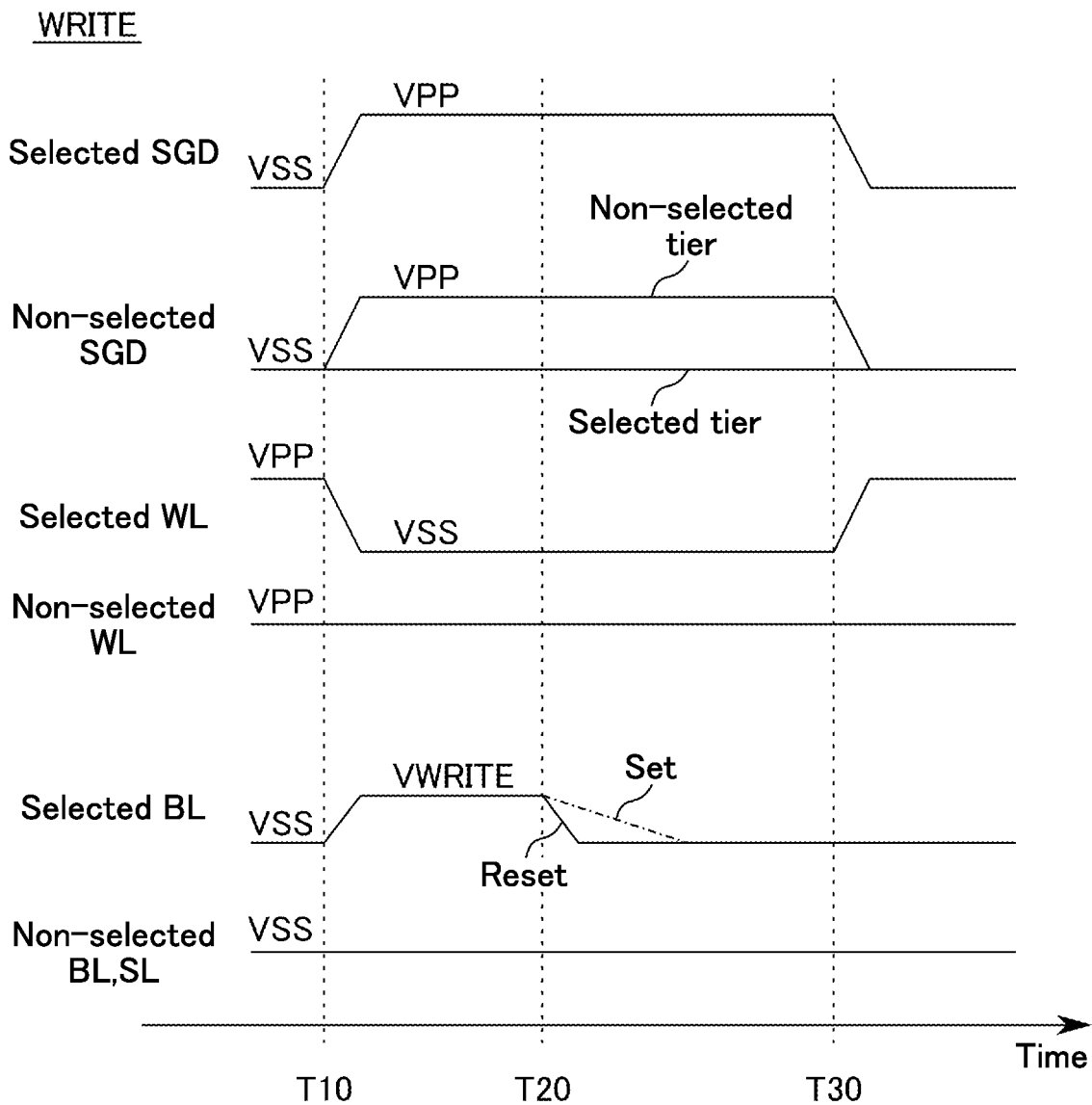
F I G. 9

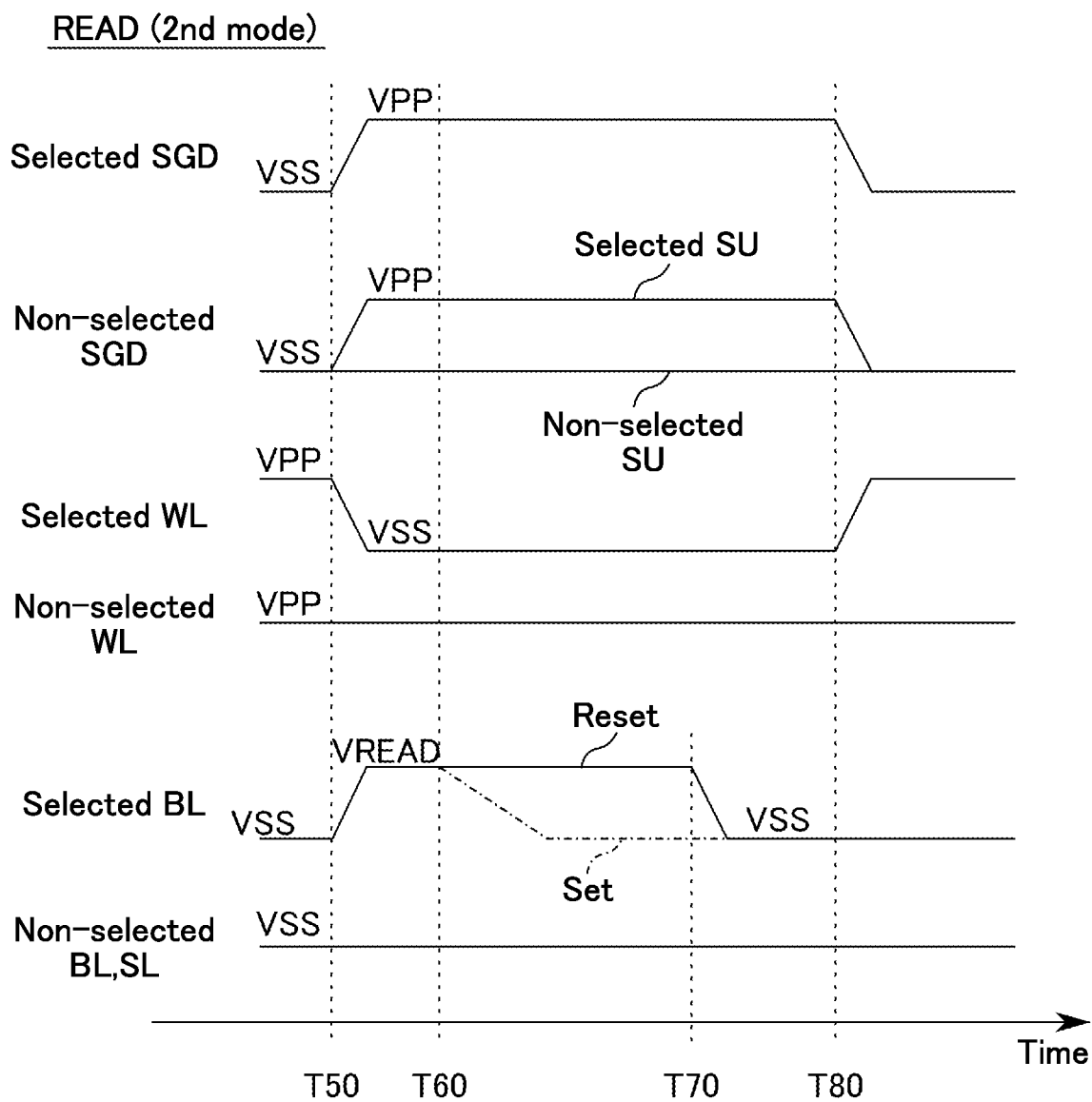
F I G. 11

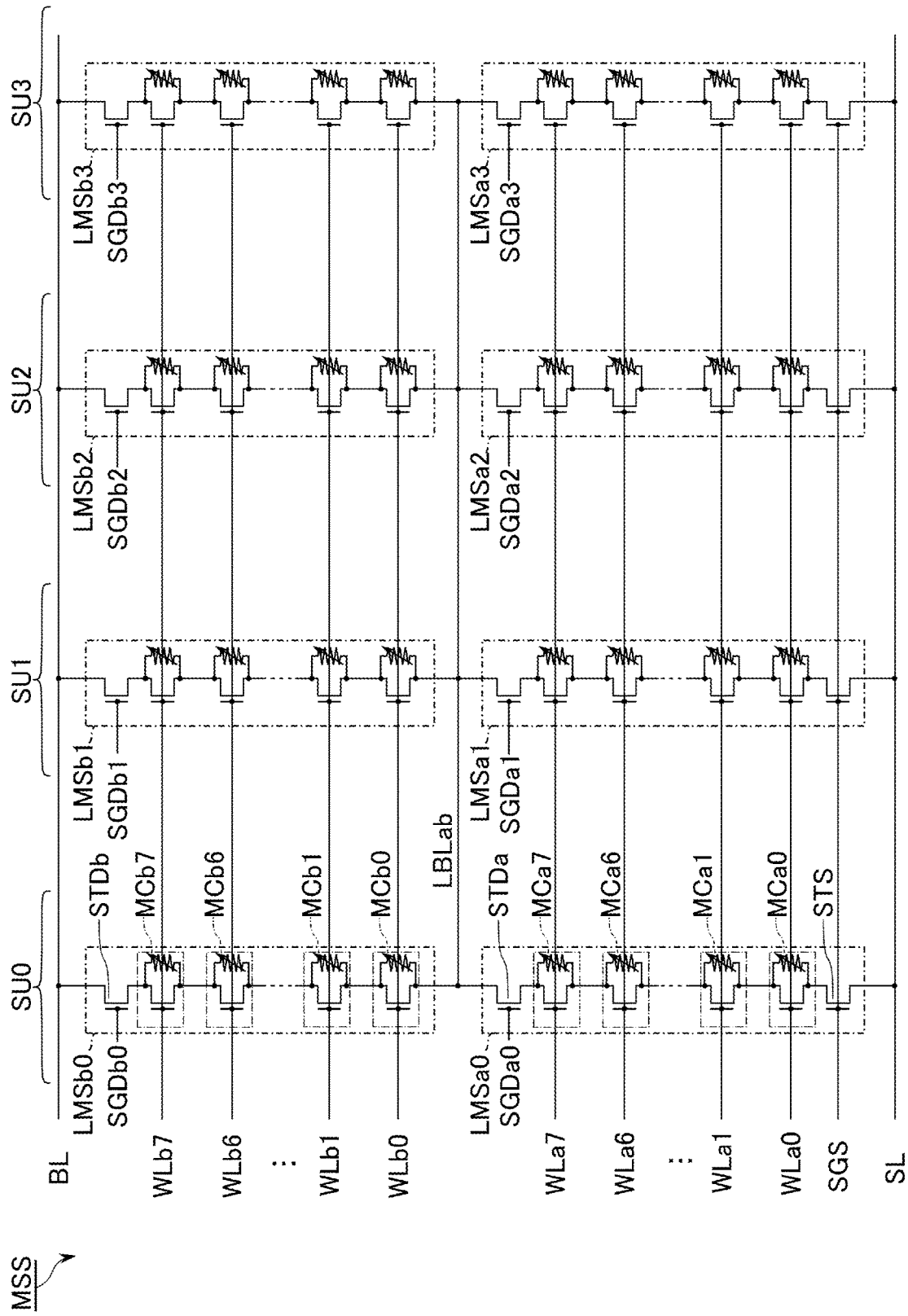
F I G. 14

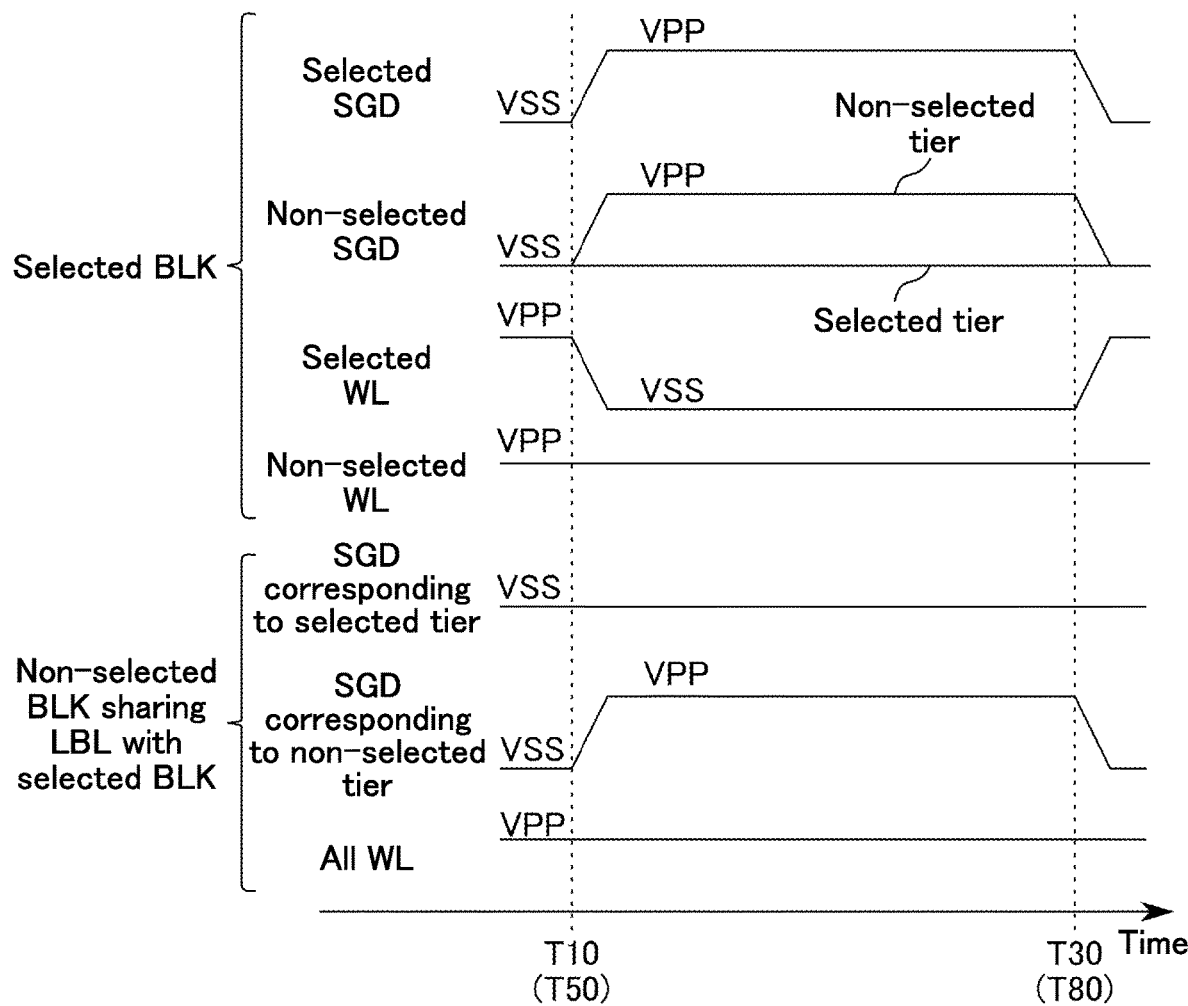
F I G. 25

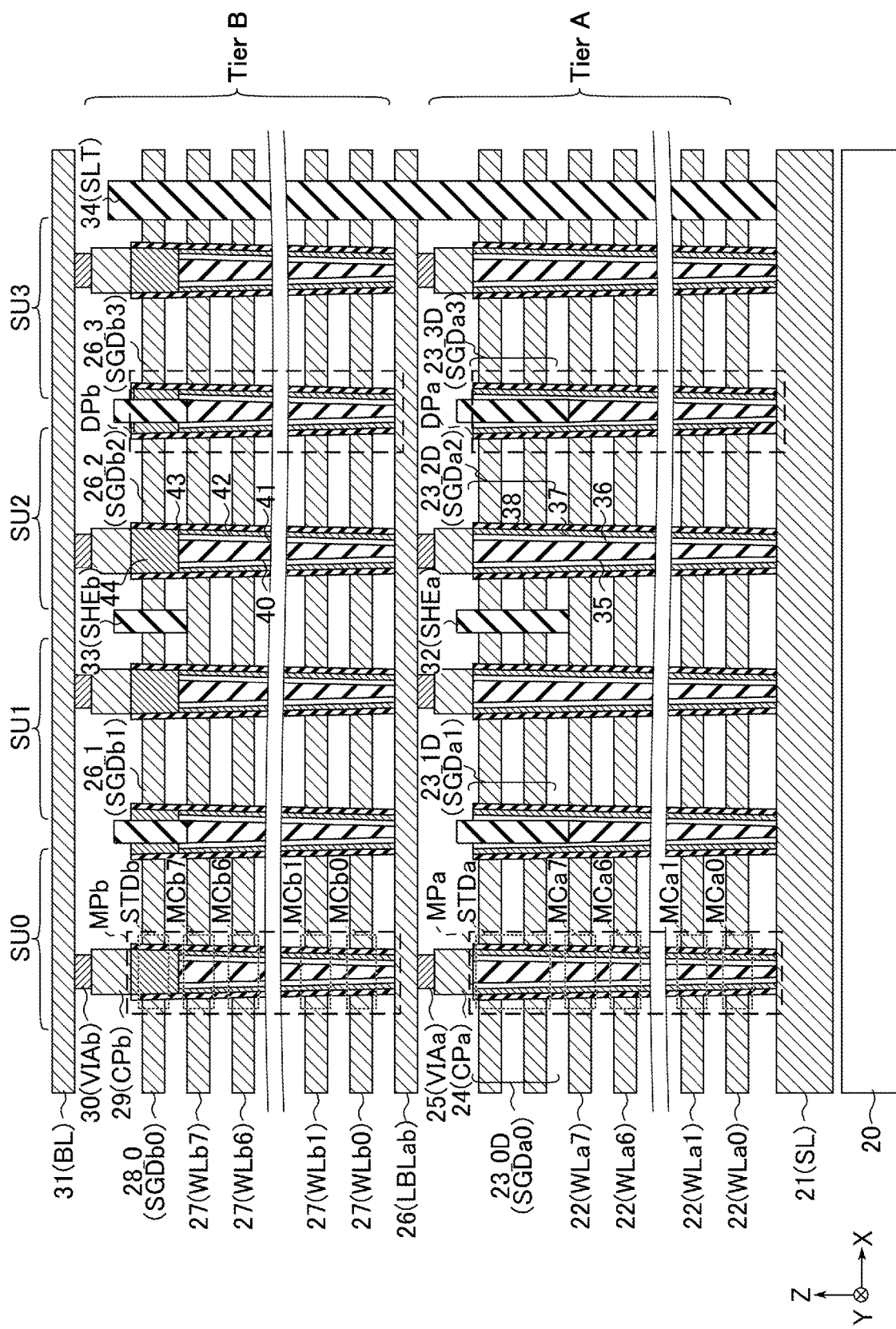
F I G. 30

F. I. G. 31

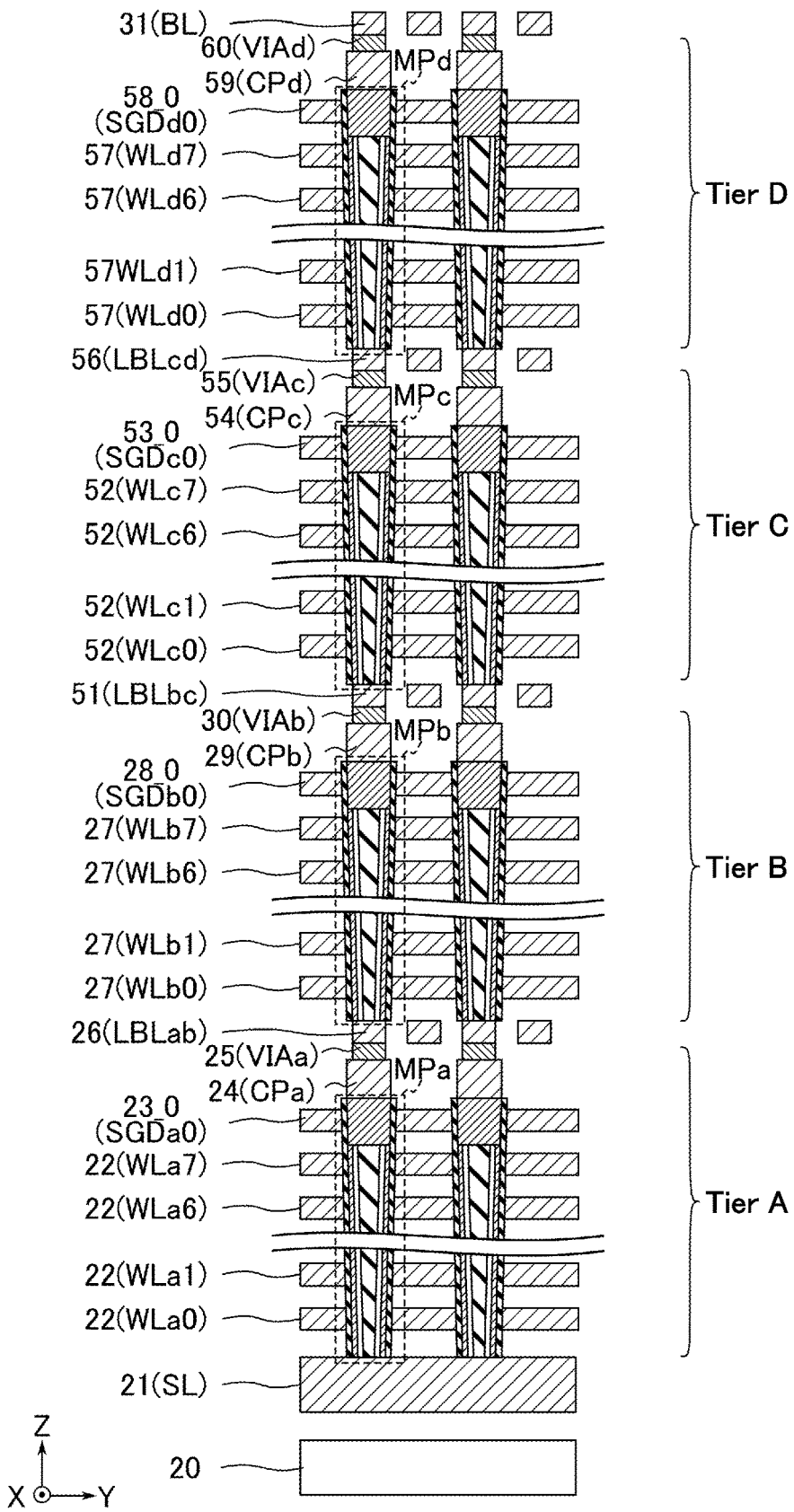
F I G. 33

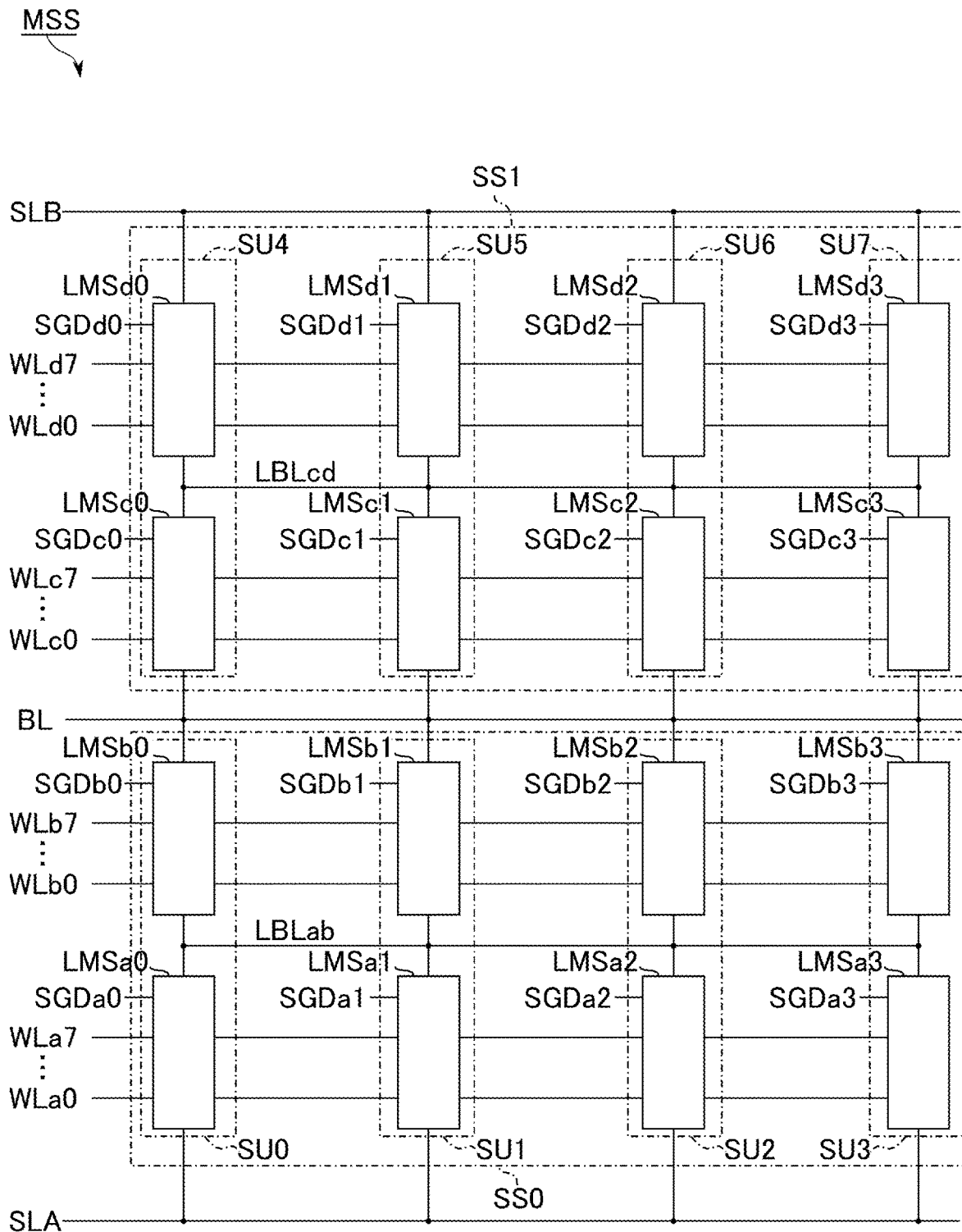
F I G. 34

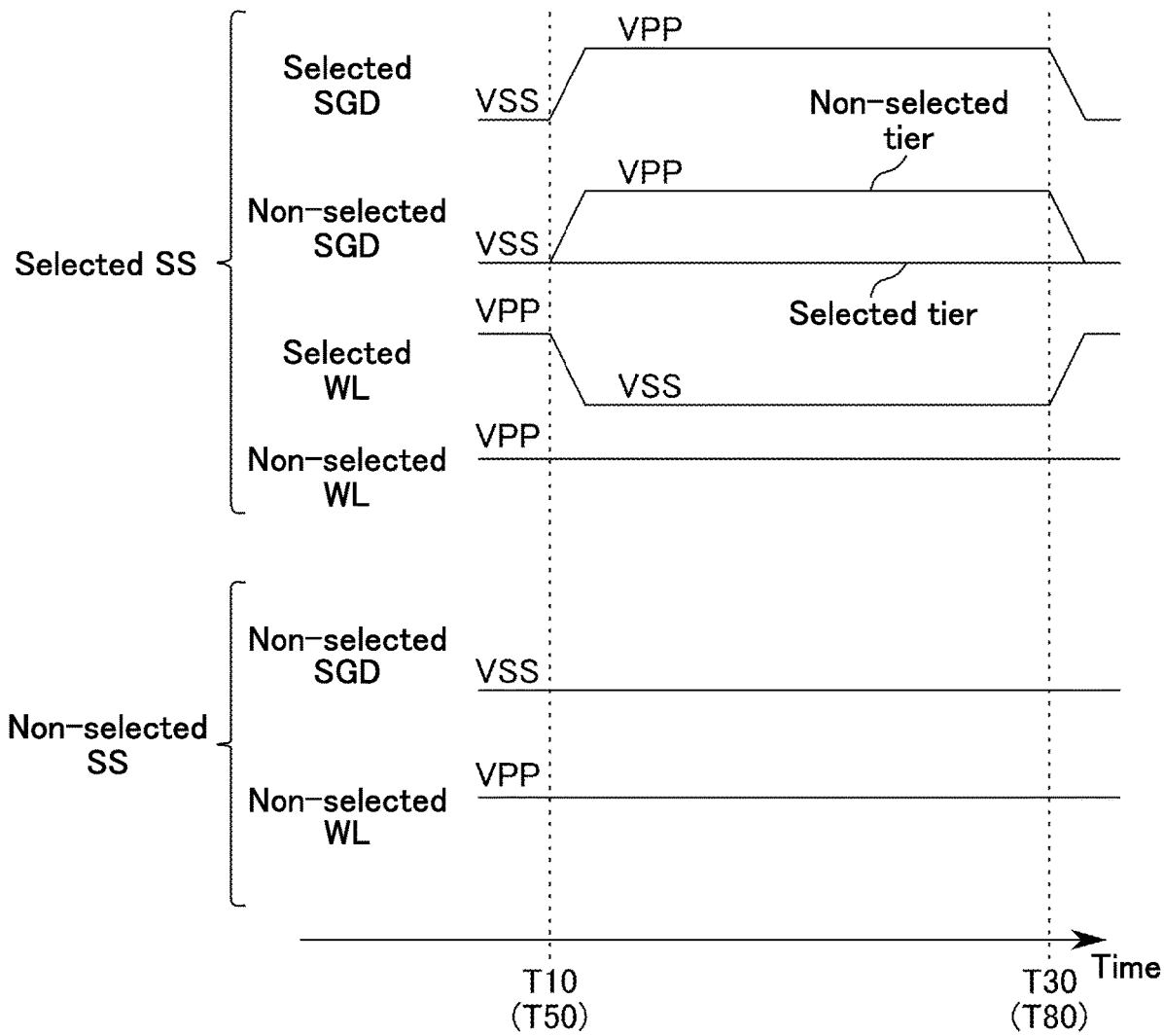
F I G. 36

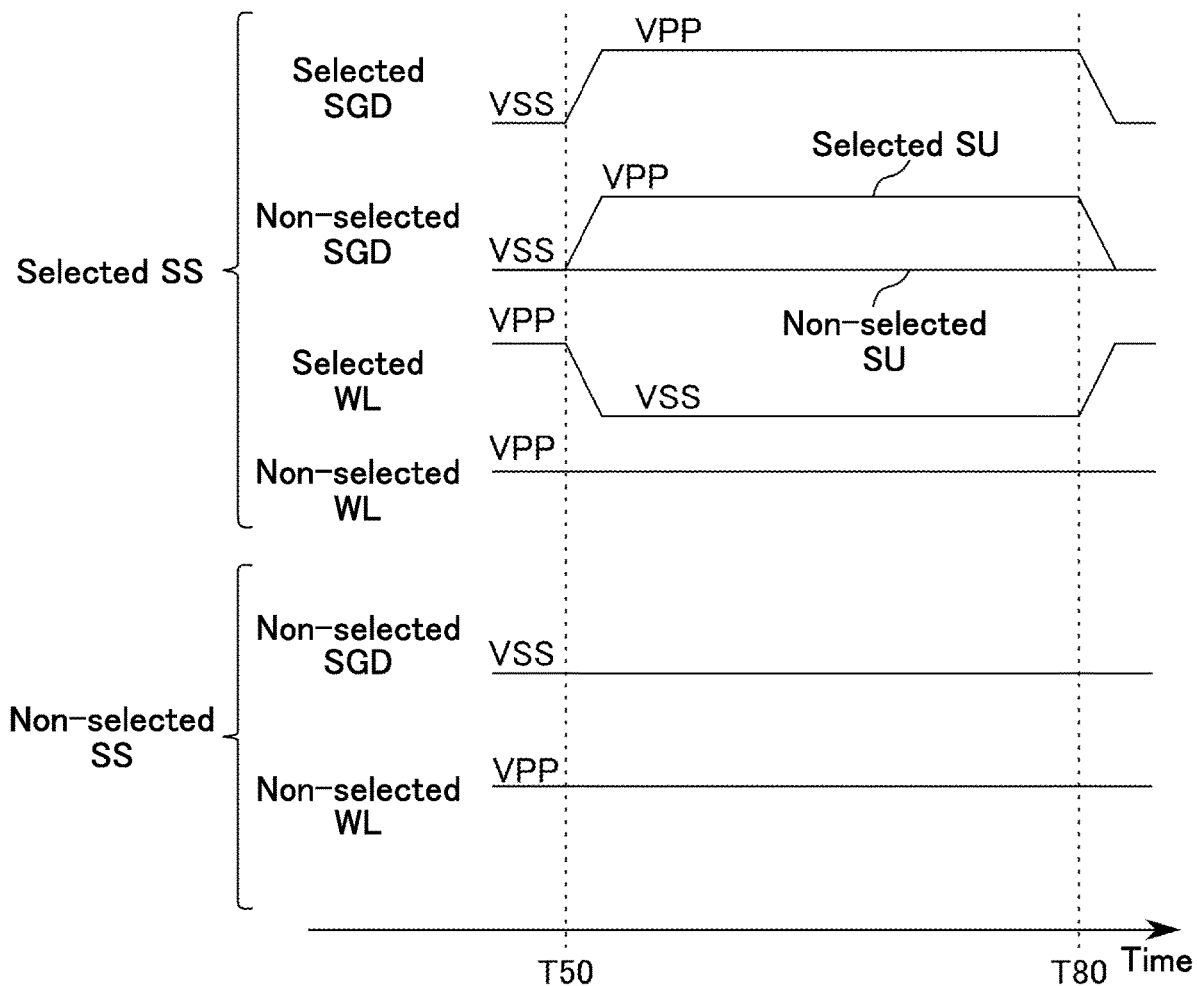
F I G. 37

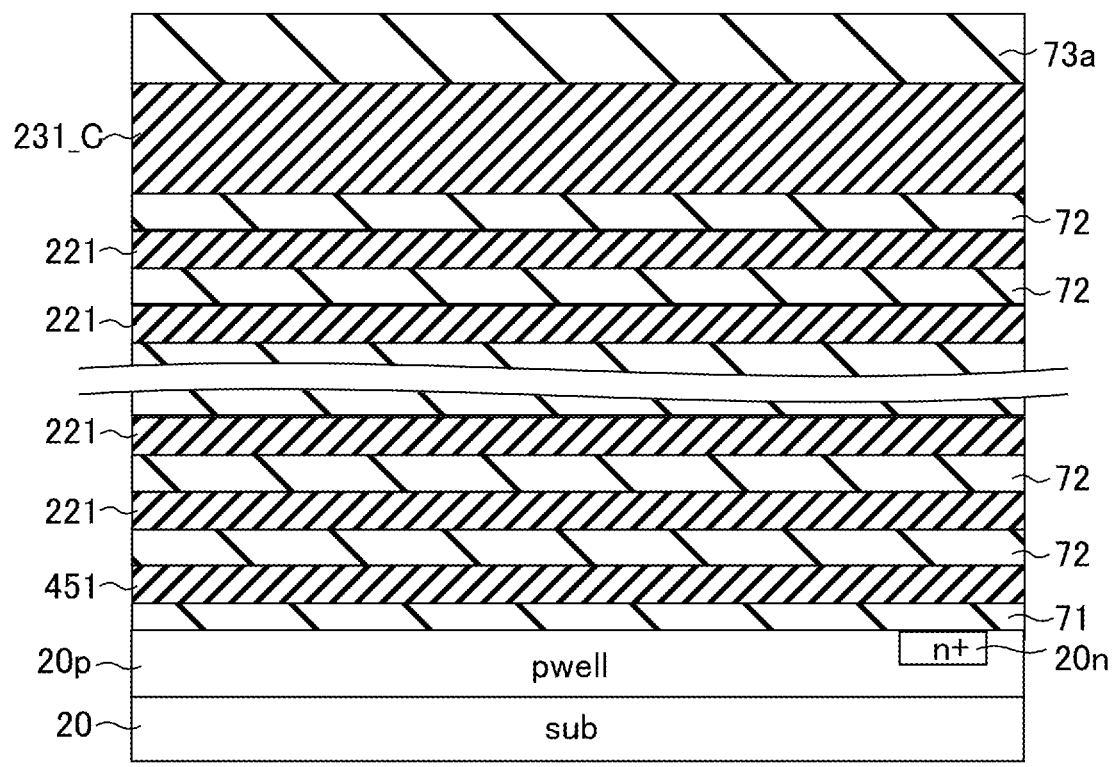
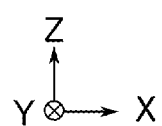
FIG. 42

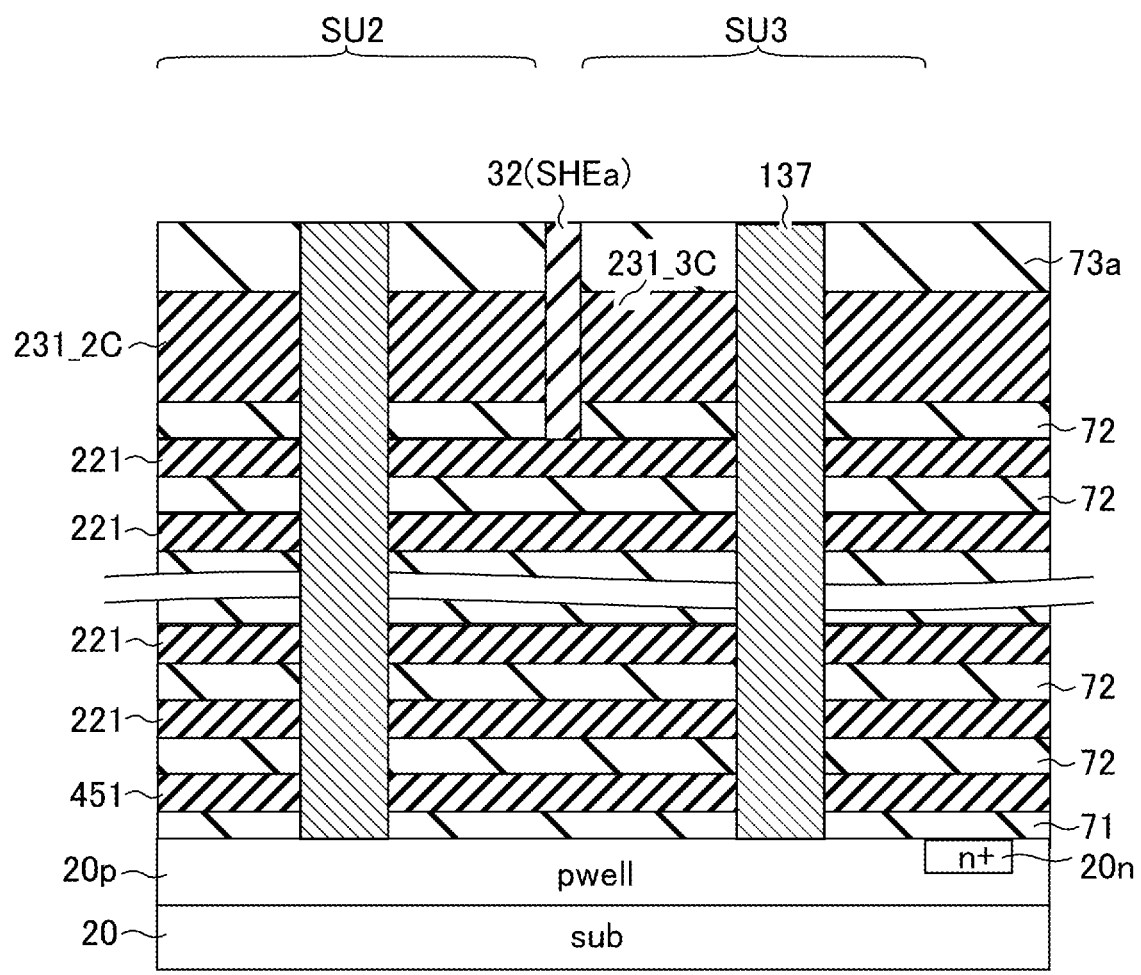
F I G. 44

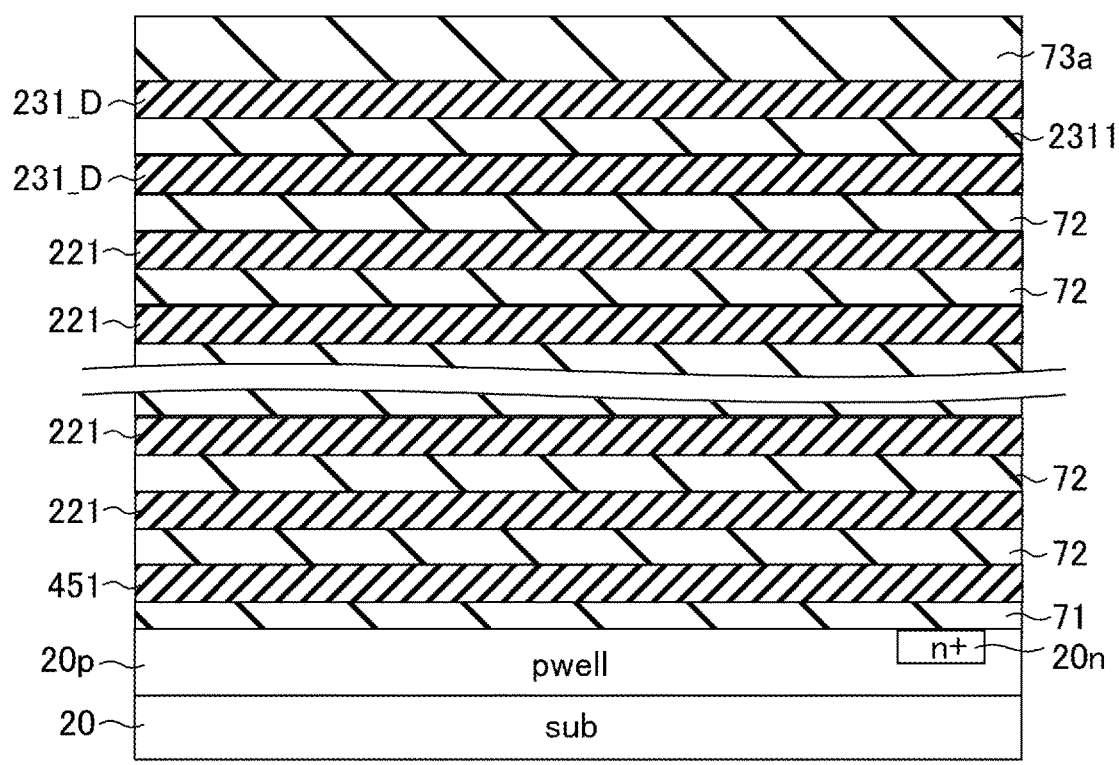
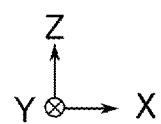
FIG. 55

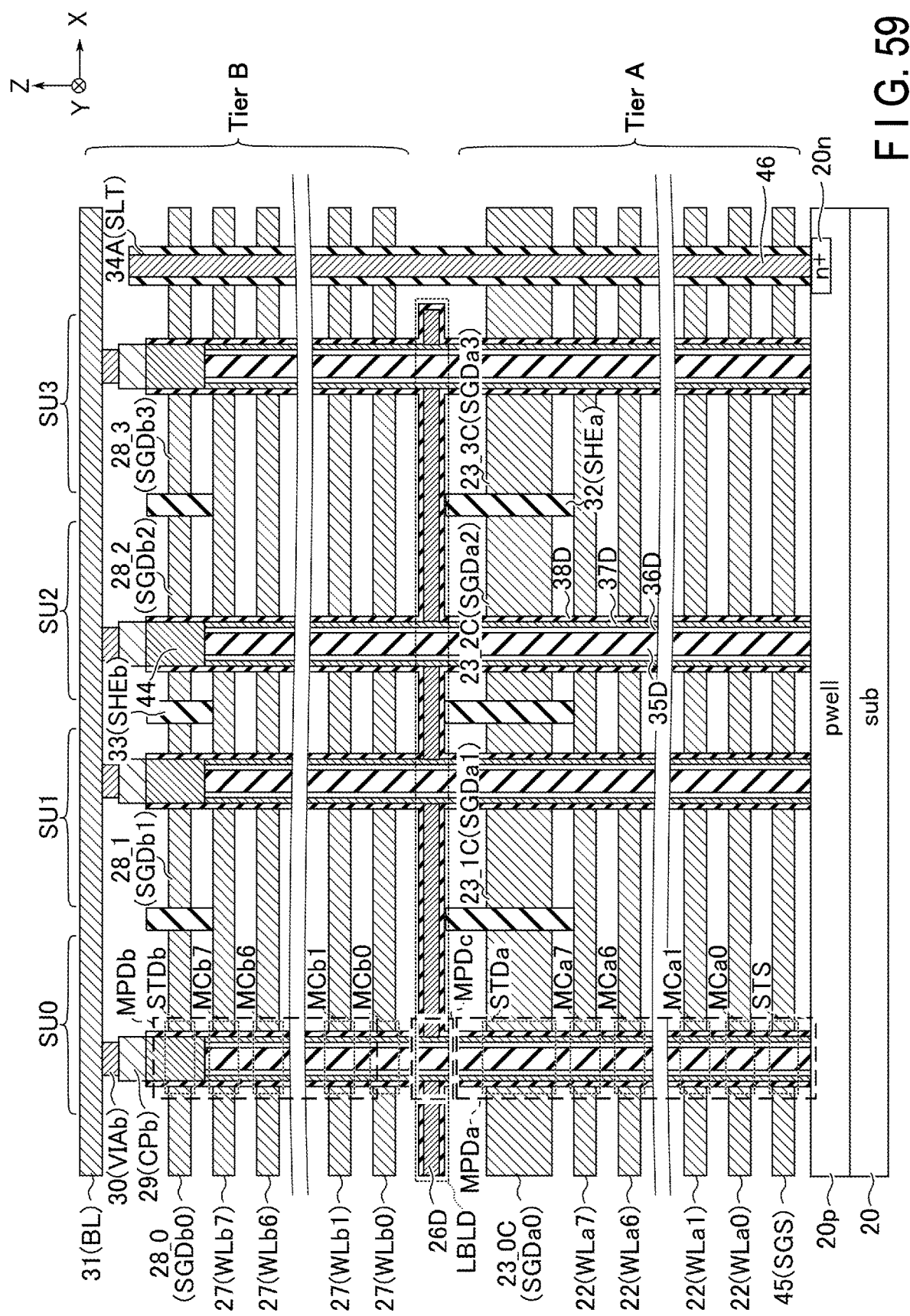
F I G. 59

MEMORY DEVICE AND METHOD OF MANUFACTURING MEMORY DEVICE

CROSS-REFERENCE TO RELATED APPLICATIONS

This application is based upon and claims the benefit of priority from Japanese Patent Application No. 2020-104662, filed Jun. 17, 2020, and Japanese Patent Application No. 2021-009629, filed Jan. 25, 2021, the entire contents of all of which are incorporated herein by reference.

FIELD

Embodiments described herein relate generally to a memory device and a method of manufacturing the memory device.

BACKGROUND

A memory device capable of storing data in a non-volatile manner is known.

BRIEF DESCRIPTION OF THE DRAWINGS

FIG. 1 is a block diagram for explaining a configuration of a memory system that includes a memory device of a first embodiment.

FIG. 4 is a plan view for explaining a planar layout of the memory cell array of the memory device according to the first embodiment.

FIG. 8 is a set of cross-sectional views for explaining structures of a memory cell and a select transistor of the memory device according to the first embodiment.

FIG. 9 is a timing chart for explaining a write operation in the memory device of the first embodiment.

FIG. 11 is a timing chart for explaining a read operation in a second mode in the memory device of the first embodiment.

FIG. 14 is a circuit diagram for explaining a configuration of a memory string set according to a second embodiment.

FIG. 25 is a timing chart for explaining a third example of a write operation and a read operation in a first mode in the memory device of the third embodiment.

FIG. 30 is a cross-sectional diagram for explaining a configuration of a memory cell array of the memory device according to the first modification.

FIG. 33 is a cross-sectional diagram for explaining a configuration of a memory cell array of the memory device according to the third modification.

FIG. 34 is a circuit diagram for explaining a configuration of a memory string set of a memory device according to a fourth modification.

FIG. 36 is a timing chart for explaining a write operation and a read operation in a first mode in the memory device of the fourth modification.

FIG. 37 is a timing chart for explaining a read operation in a second mode in the memory device of the fourth modification.

FIGS. 42 to 54 are cross-sectional diagrams for explaining a memory cell array of a memory device according to Configuration Example A of the fourth embodiment, in the middle of a manufacturing process.

FIG. 55 is a cross-sectional diagram for explaining a memory cell array of a memory device according to Configuration Example B of the fourth embodiment, in the middle of a manufacturing process.

FIGS. 59 to 62 are cross-sectional diagrams for explaining a memory cell array of a memory device according to Configuration Example C of the fourth embodiment, in the middle of a manufacturing process.

DETAILED DESCRIPTION

Figure 2:
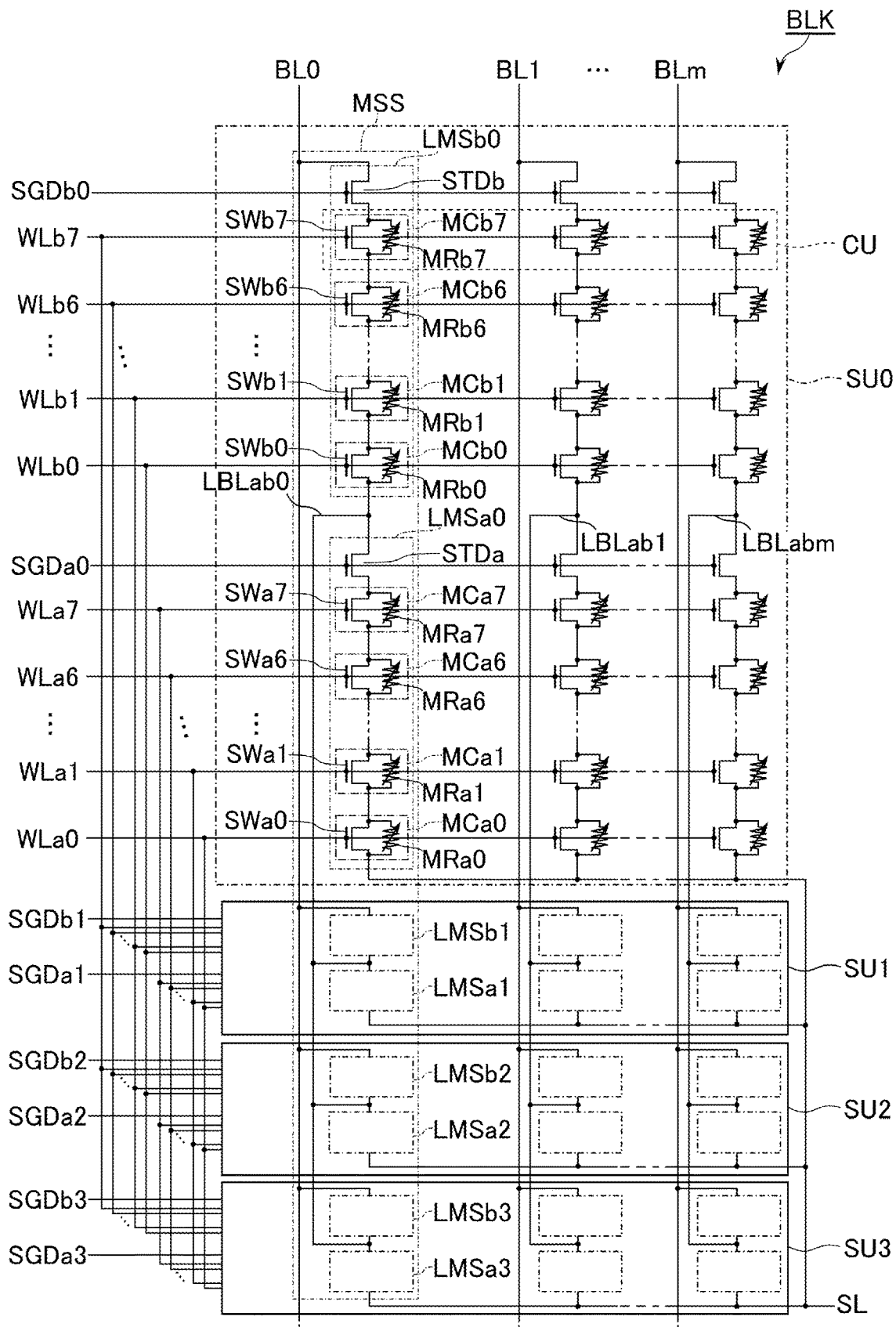
FIG. 2 is a circuit diagram for explaining a configuration of a memory cell array of the memory device of the first embodiment.

In general, according to one embodiment, a memory device includes: a first interconnect; a second interconnect; a first string and a second string whose first ends are coupled in common to the first interconnect; a third string and a fourth string whose second ends are coupled in common to the second interconnect; a third interconnect; and driver. The third interconnect is coupled in common to second ends of the first string and the second string and to first ends of the third string and the fourth string. Each of the first string, the second string, the third string, and the fourth string includes a first switch element and a memory cell coupled in series. The memory cell includes a second switch element and a resistance change element coupled in parallel. The third interconnect is coupled to the driver via the first interconnect or the second interconnect.

Hereinafter, the embodiments will be described with reference to the accompanying drawings. Each of the embodiments is an example of an apparatus and a method to embody a technical idea of the invention. The drawings are schematic or conceptual, and the dimensions and ratios, etc. in the drawings are not always the same as the actual ones. The technical idea of the present invention is not specified by the shapes, structures, arrangements, etc. of the components.

In the following description, structural components having substantially the same function and configuration will be denoted by the same reference symbol including characters or numbers. When the same elements referred to by the same reference symbol and having similar structures are to be distinguished, an additional character or number may be added to the reference symbol.

1. First Embodiment

The first embodiment will be described. In the following, a memory device that stores data in a non-volatile manner by using a resistance change element whose resistance value is reversibly changeable as a memory element, and a memory system that includes this memory device will be explained as examples.

1.1 Configuration

A configuration according to the first embodiment is described below.

1.1.1 Memory System

First, an overall configuration including the memory system according to the first embodiment is described with reference to FIG. 1.

As shown in FIG. 1, a memory system 1 includes a memory device 100 and a memory controller 200. The memory device 100 and the memory controller 200 may constitute a single semiconductor device in combination, for example. The semiconductor device is, for example, a memory card such as an SDT™ card, or a solid state drive (SSD).

The memory device 100 includes a plurality of memory cells and stores data in a non-volatile manner. The memory controller 200 is coupled to the memory device 100 via a memory bus, and is coupled to a host device 300 via a host bus. The memory controller 200 controls the memory device 100, and accesses the memory device 100 in response to an instruction received from the host device 300. The host device 300 is, for example, a digital camera or a personal computer, and the host bus is, for example, a bus compliant with an SD™ interface, serial attached SCSI (small computer system interface) (SAS), serial ATA (advanced technology attachment) (SATA), or peripheral component interconnect express (PCIe). The memory bus transmits and receives a signal compatible with an interface between the memory device 100 and the memory controller 200.

1.1.2. Memory Controller

A configuration of the memory controller 200 will be described with continuous reference to FIG. 1.

The memory controller 200 is an SoC (system on a chip) for example, and includes a host interface circuit 210, a random access memory (RAM) 220, a central processing unit (CPU) 230, a buffer memory 240, a memory interface circuit 250, and an ECC circuit 260. The functions of the memory controller 200 and each of the components 210 through 260, which will be described in the following, can be realized by a hardware structure, or a combination of hardware resources and firmware.

The host interface circuit 210 is coupled to the host device 300 via the host bus, and transfers instructions and data received from the host device 300 to the CPU 230 and the buffer memory 240, respectively. The host interface circuit 210 also transfers data in the buffer memory 240 to the host device 300 in response to an instruction from the CPU 230.

The RAM 220 is, for example, a semiconductor memory, such as a DRAM, and is used as a work area of the CPU 230.

The RAM 220 maintains firmware for managing the memory device 100 and various management tables.

The CPU 230 controls the operation of the entire memory controller 200. For example, upon receipt of a write instruction or a read instruction from the host device 300, the CPU 230 issues, in response thereto, a write command or a read command to the memory interface circuit 250. The CPU 230 performs various processes to manage the memory device 100.

The buffer memory 240 temporarily stores write data and read data.

The memory interface circuit 250 is coupled to the memory device 100 via a memory bus, and governs communication with the memory device 100. The memory interface circuit 250 outputs various types of signals to the memory device 100 based on the instruction received from the CPU 230. At the time of a write operation, the memory interface circuit 250 transfers the write command issued by the CPU 230 and the write data in the buffer memory 240 to the memory device 100 as input signals. At the time of a read operation, the memory interface circuit 250 transfers the read command issued by the CPU 230 to the memory device 100 as an input signal, and receives the data read from the memory device 100 as an output signal and transfers it to the buffer memory 240.

The ECC circuit 260 performs error detection and correction processes on data stored in the memory device 100. In other words, the ECC circuit 260 generates an error correction code when data is written and provides write data with the error correction code added, and decodes the error correction code in a data read operation to detect an error bit when data is read. If an error bit is detected, the position of the error bit is specified and the error is corrected. An error correction method includes, for example, hard-decision bit decoding and soft-decision bit decoding. As hard-decision bit decoding codes used for the hard-decision bit decoding, BCH (Bose-Chaudhuri-Hocquenghem) codes or RS (Reed-Solomon) codes may be used, and as soft-decision bit decoding codes used for the soft-decision bit decoding, low-density parity-check (LDPC) codes may be used.

1.1.3 Memory Device

A configuration of the memory device 100 will be described with continuous reference to FIG. 1.

As shown in FIG. 1, the memory device 100 includes a memory cell array 110, a row decoder 120, a driver 130, a sense amplifier 140, an address register 150, a command register 160, and a sequencer 170.

The memory cell array 110 includes a plurality of blocks BLK each including a plurality of memory cells associated with rows and columns. FIG. 1 shows four blocks BLK0 to BLK3 as an example. The memory cell array 110 stores data provided from the memory controller 200.

The row decoder 120 selects one of the blocks BLK0 to BLK3 based on a block address BA in the address register 150 and then selects a word line in the selected block BLK.

The driver 130 supplies a voltage to the selected block BLK via the row decoder 120 based on a page address PA in the address register 150.

The sense amplifier 140 selects a bit line based on a column address CA in the address register 150. For example, in a data read operation, the sense amplifier 140 reads data stored in a memory element in the memory cell array 110 via a bit line and outputs the read data DAT to the memory controller 200. In a data write operation, the sense amplifier 140 transfers write data DAT received from the memory controller 200 to the memory cell array 110.

The address register 150 holds an address ADD received from the memory controller 200. The address ADD includes the above-mentioned block address BA, page address PA, and column address CA. The command register 160 holds a command CMD received from the memory controller 200.

The sequencer 170 controls an operation of the entire memory device 100. For example, the sequencer 170 controls the row decoder 120, the driver 130, and the sense amplifier 140, etc., based on the command CMD retained in the command register 160, to perform a read operation and a write operation, etc.

1.1.4 Circuit Configuration of Memory Cell Array

Next, an example of a circuit configuration of the memory array of the memory device according to the first embodiment will be described.

Figure 3:
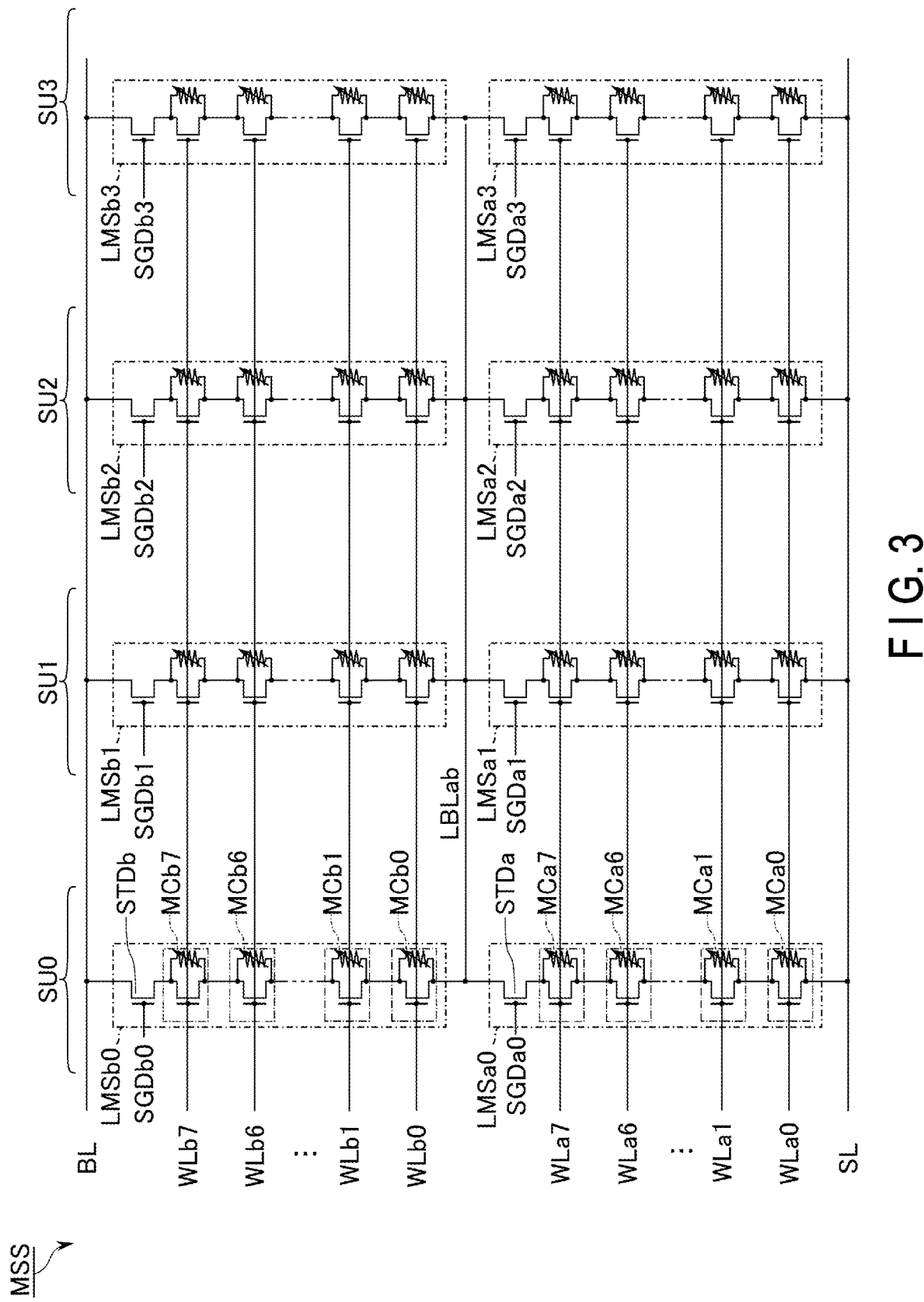
FIG. 3 is a circuit diagram for explaining a configuration of a memory string set of the memory device according to the first embodiment.

FIGS. 2 and 3 are circuit diagrams for explaining a configuration of the memory cell array of the memory device according to the first embodiment. FIG. 2 shows one of a plurality of blocks BLK included in the memory cell array 110. FIG. 3 shows one of a plurality of memory string sets MSS included in the block BLK shown in FIG. 2.

As shown in FIGS. 2 and 3, the block BLK includes a plurality of memory string sets MSS each associated with a pair of a bit line BL0 and a local bit line LBLab0 through a pair of a bit line BLm and a local bit line LBLabm (m is an integer equal to or greater than 1). Each memory string unit MSS includes a plurality of pairs of local memory strings LMSa and LMSb. In the example of FIG. 2, a case where each memory string set MSS includes four pairs of local memory strings LMSa and LMSb (namely, a pair of LMSa0 and LMSb0 through a pair of LMSa3, and LMSb3) is shown.

A block BLK is divided into string units SU (in the example of FIG. 2, four string units SU0 through SU3) provided in a number corresponding to the number of sets of local memory strings LMSa and LMSb included in each memory string set MSS. The string units SU0 through SU3 respectively include a plurality of pairs of local memory strings, LMSa0 and LMSb0 through LMSa3 and LMSb3.

In the same memory string set MSS, the first ends of the local memory strings LMSb0, LMSb1, LMSb2, and LMSb3 are coupled in common to a corresponding bit line BL. The second ends of the local memory strings LMSb0, LMSb1, LMSb2, LMSb3 and the first ends of the local memory strings LMSa0, LMSa1, LMSa2, and LMSa3 are coupled in common to a local bit line LBLab. The second ends of the local memory strings LMSa0, LMSa1, LMSa2, and LMSa3 are coupled in common to a source line SL.

Unlike a bit line BL or a source line SL, the local bit line LBLab is an interconnect not driven by the driver 130 and closed within a memory string set MSS between a bit line BL and a source line SL. In other words, the local bit line LBLab is coupled to the driver 130 via a bit line BL and a source line SL. A voltage of a local bit line LBLab of the selected block BLK is determined based on a bit line BL and a source line SL.

The local memory string LMSa includes, for example, a select transistor STDa and a set of memory cells MCa0 through MCa7 coupled in series. The local string set LMSb includes, for example, a select transistor STDb and a set of memory cells MCb0 through MCb7 coupled in series.

The first end of the select transistor STDb is coupled to an associated bit line BL as the first end of the local memory string LMSb, and the second end of the select transistor STDb is coupled to the first end of the set of the memory cells MCb0 through MCb7. The second end of the set of the memory cells MCb0 through MCb7 and the first end of the select transistor STDa are coupled in common to the local bit line LBLab as the second end of the local memory string LMSb and as the first end of the local memory string LMSa. The second end of the select transistor STDa is coupled to the first end of the set of memory cells MCa0 through MCa7. The second end of the set of memory cells MCa0 through MCa7 is coupled to the source line SL as the second end of the local memory cell string LMSa.

Each memory cell MC has a resistance change element MR and a switch element SW. Being coupled by their first ends to each other, the resistance change element MR and the switch element SW constitute the first end of the memory cell MC, and being coupled by their second ends to each other, they constitute the second end of the memory cell MC. In other words, the resistance change element MR and the switch element SW are coupled in parallel between the first end and the second end of the corresponding memory cell MC.

The resistance change element MR of the present embodiment is an element capable of reversibly transitioning between a low resistance state and a high resistance state through its change in crystalline state and is, for example, an alloy-type phase change element ($Ge_2Sb_2Te_5$). Hereinafter, a change in the crystalline state of the resistance change element MR will be referred to as a "phase change", and a low resistance state of the resistance change element MR will be referred to as a "set state", and a high resistance state of the resistance change element MR will be referred to as a "reset state". The switch element SW in the present embodiment is a transistor that includes a semiconductor channel, a gate insulating film, and a gate electrode.

When the memory cell MC is not selected (in a non-selected state), the switch element SW is turned to an on state (a conductive state). A resistance value of the memory element MR in the low resistance state is for example ten or more times higher than a resistance value of the semiconductor layer of the switch element SW in an on state. For this reason, if the memory cell MC is in a non-selected state, almost no current flows in the resistance change element MR in the memory cell MC.

When the memory cell MC is selected (in a selected state), on the other hand, the switch element SW is turned to an off state (non-conductive state). A resistance value of the memory element MR in the high resistance state is ten or more times lower than a resistance value of the semiconductor layer of the switch element SW in an off state. For this reason, if the memory cell MC is in a selected state, a current significantly flows in the resistance change element MR of the memory cell MC.

Within a single block BLK, the gate electrodes of all switch elements SWa0 through SWa7 in the string units SU0 through SU3 are respectively coupled in common to word lines WLa0 through WLa7. The gate electrodes of all switch elements SWb0 through SWb7 in the string units SU0 through SU3 are respectively coupled in common to word lines WLb0 through WLb7. The gate electrodes of the select transistors STDa respectively included in the string units SU0 through SU3 are respectively coupled in common to select gate lines SGDa0 through SGDa3. The gate electrodes of the select transistors STDb respectively included in the string units SU0 through SU3 are respectively coupled in common to select gate lines SGDb0 through SGDb3.

In a single string unit SU, a set of memory cells MC having switch elements SW each coupled to a common word line WL is referred to as, for example, a cell unit CU. For example, the storage capacity of a cell unit CU that includes the memory cells MC, which individually store 1-bit data, is defined as "1-page data".

In the above-described circuit configuration of the memory cell array 110, a bit line BL is shared between a plurality of memory string sets MSS each included in respective blocks BLK, for example. The source line SL is shared among, for example, a plurality of blocks BLK.

The circuit configuration of the memory cell array 110 included in the memory device 100 according to the present embodiment is not limited to the above-described one. For example, the number of the memory cells MC and the number of the select transistors STD included in each local memory string LMS may be determined as appropriate. The number of string units SU included in each block BLK may be determined as appropriate.

1.1.5 Configuration of Memory Cell Array

Next, an example of the configuration of the memory cell array of the memory device according to the first embodiment is described.

In the drawings which will be referred to hereinafter, the X axis corresponds to the extending direction of the bit line BL, the Y axis corresponds to the extending directions of the word line WL and the select gate line SGD, and the Z axis corresponds to a direction perpendicular to the surface of the semiconductor substrate on which the memory device 100 is formed. In the plan views, hatching is applied as appropriate for improved visibility. The hatching applied in the plan views does not necessarily relate to the material or characteristics of the hatched constituent element. In the cross-sectional views, structural components such as insulating layers (interlayer insulating films), interconnects, contacts, etc. are omitted, where not necessary, for improved visibility.

Figure 5:
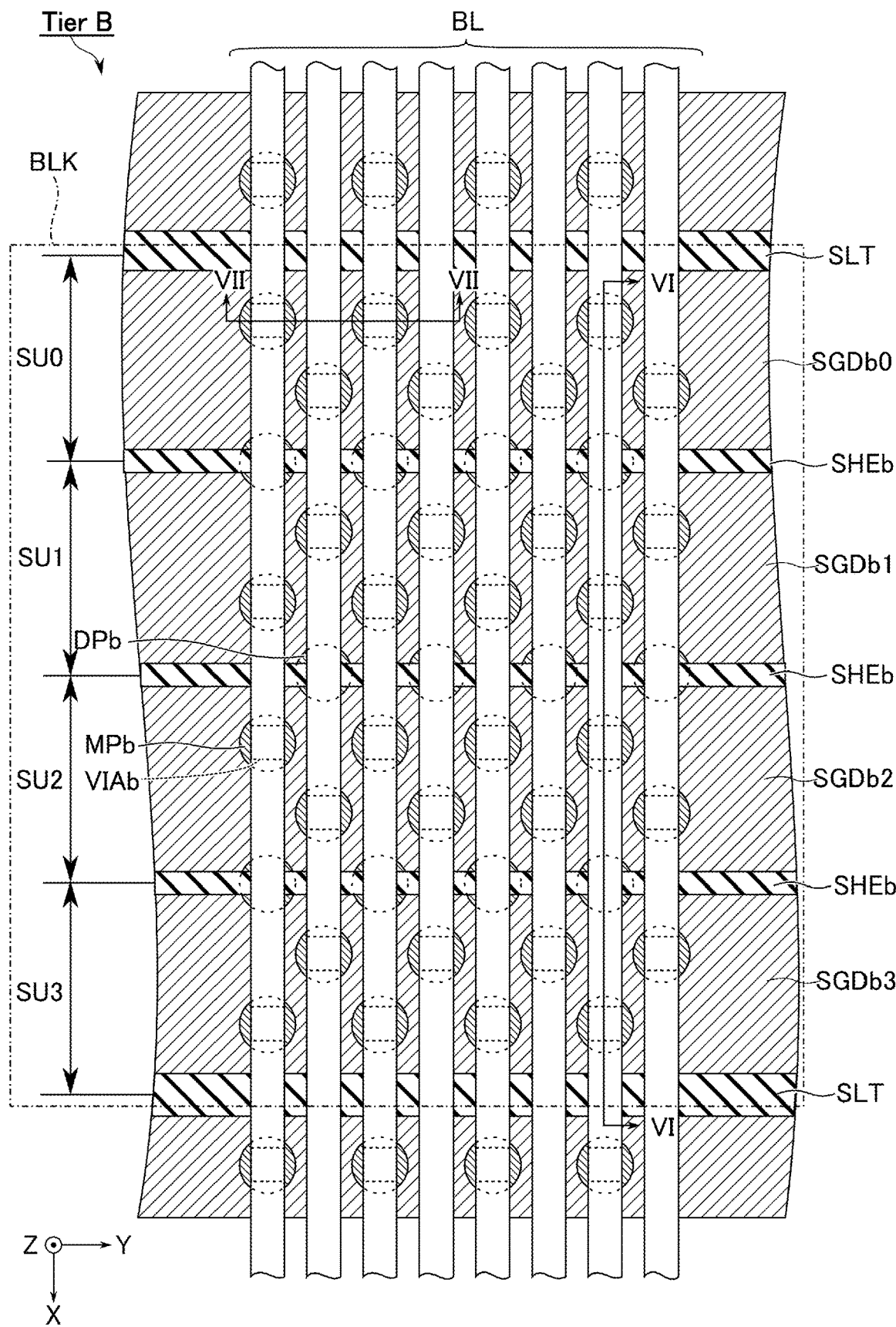
FIG. 5 is a plan view for explaining a planar layout of the memory cell array of the memory device according to the first embodiment.

FIGS. 4 and 5 are plan views for explaining a planar layout of the memory cell array of the memory device according to the first embodiment. FIG. 4 is a plan view of a part of the structure ("tier A") corresponding to the local memory strings LMSa of the string units SU0 through SU3 in a block BLK, viewed from above the local bit lines LBLab. FIG. 5 is a plan view of a part of the structure ("tier B") corresponding to the local memory cell strings LMSb provided above the structure shown in FIG. 4, when viewed from above the bit lines BL.

First, the tier A is explained with reference to FIG. 4.

As shown in FIG. 4, the memory cell array 110 includes, for example, slits SLT and SHEa, memory pillars MPa, vias VIAa, and local bit lines LBLab.

The slits SLT extend along the Y axis, and are aligned in the X axis. The plurality of slits SHEa each extend along the Y axis and are aligned along the X axis between neighboring slits SLT. The width of each slit SLT is wider than that of a slit SHEa, for example. Each slit SLT and slit SHEa includes an insulator. The slit SLT divides interconnect layers corresponding to word lines WLa (not shown) and an interconnect layer corresponding to a select gate line SGDa, for example. The slit SHEa divides an interconnect layer corresponding to a select gate line SGDa.

Also, each of the areas divided by the slits SLT and SHEa corresponds to a local memory cell string LMSa in a single string unit SU. Specifically, the string units SU0 through SU3 are provided between slits SLT adjacent along the X axis, for example. Furthermore, four areas divided by three slits SHEa arranged between the slits SLT correspond respectively to the local memory strings LMSa in the string units SU0 through SU3.

The memory pillars MPa and the dummy pillars DPa are in, for example, an 11-row staggered arrangement along the X axis in an area between two adjacent slits SLT. The memory pillars MPa are arranged in an area that does not overlap the slit SHEa and the dummy pillars DPa are arranged in an area that overlaps the slit SHEa. In the example of FIG. 4, the memory pillars MPa are in a 2-row staggered arrangement along the X axis in a single string unit SU. In the memory cell array 110, for example a similar layout is repeatedly arranged in the X axis.

Each of the local bit lines LBLab extends along the X axis between the slits SLT and is aligned along the Y axis. A single local bit line LBLab is arranged so as to overlap a single memory pillar MPa in each string unit SU in a plan view, and is coupled to the memory pillars MPa in the string unit SU via vias VIAa. The current paths formed in the memory pillars MPa are electrically coupled to a corresponding local bit line LBLab via a via VIAa.

Next, the tier B is explained with reference to FIG. 5.

As shown in FIG. 5, the memory cell array 110 further includes slits SHEb, memory pillars MPb, vias VIAb, and bit lines BL.

The plurality of slits SHEb each extend along the Y axis and are aligned along the X axis between neighboring slits SLT. The slit SHEb includes an insulator and is formed at, for example, the same location as the slit SHEa in a plan view. The slit SHEb divides an interconnect layer corresponding to the select gate line SGDb. The slit SLT further divides interconnect layers corresponding to word lines WLb (not shown) and an interconnect layer corresponding to a select gate line SGDb, for example.

The four areas divided by three slits SHEb arranged between slits SLT respectively correspond to the local memory strings LMSb in the string units SU0 through SU3. The local memory cell string LMSb of each of the string units SU0 through SU3 is formed at the same location as the local memory cell string LMSa of each of the string units SU0 through SU3 in a plan view.

The memory pillars MPb and the dummy pillars DPb are respectively formed above the respectively corresponding memory pillars MPa and the dummy pillars DPa at the same positions as the memory pillars MPa and the dummy pillars DPa in a plan view.

The bit lines BL each extend in the X axis and are aligned along the Y axis, over the plurality of blocks BLK. A single bit line BL is arranged so as to overlap a single memory pillar MPb in each string unit SU in a plan view. The bit line BL is coupled to, in each string unit SU, the memory pillars MPb overlapping in a plan view via the vias VIAb. The current paths formed in the memory pillars MPb are electrically coupled to a corresponding bit line BL via a via VIAb.

The planar layout of the memory cell array 110 described above is merely an example, and is not limited thereto. The number of slits SHEa and SHEb arranged between adjacent slits SLT may be designed to be any number. The number of string units SU between adjacent slits SLT varies depending on the number of slits SHEa and SHEb. The number and arrangement of the memory pillars MPa and MPb may be designed as appropriate. The number of local bit lines LBLab that overlap each memory pillar MPa and the number of bit lines BL that overlap each memory pillar MPb may be designed to be any number.

Figure 6:
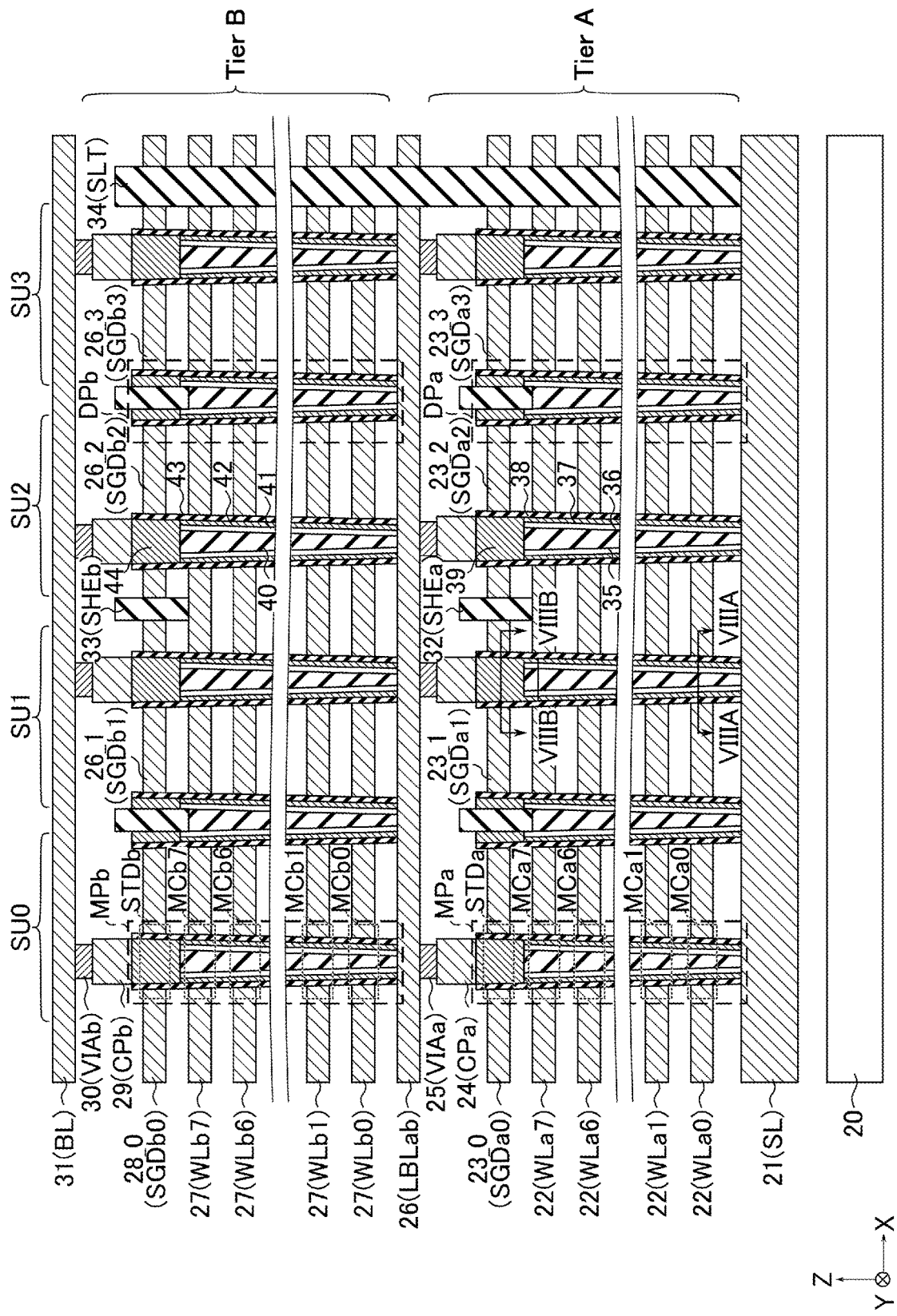
FIG. 6 is a cross-sectional view of the memory cell array, taken along line VI-VI shown in FIGS. 4 and 5.
Figure 7:
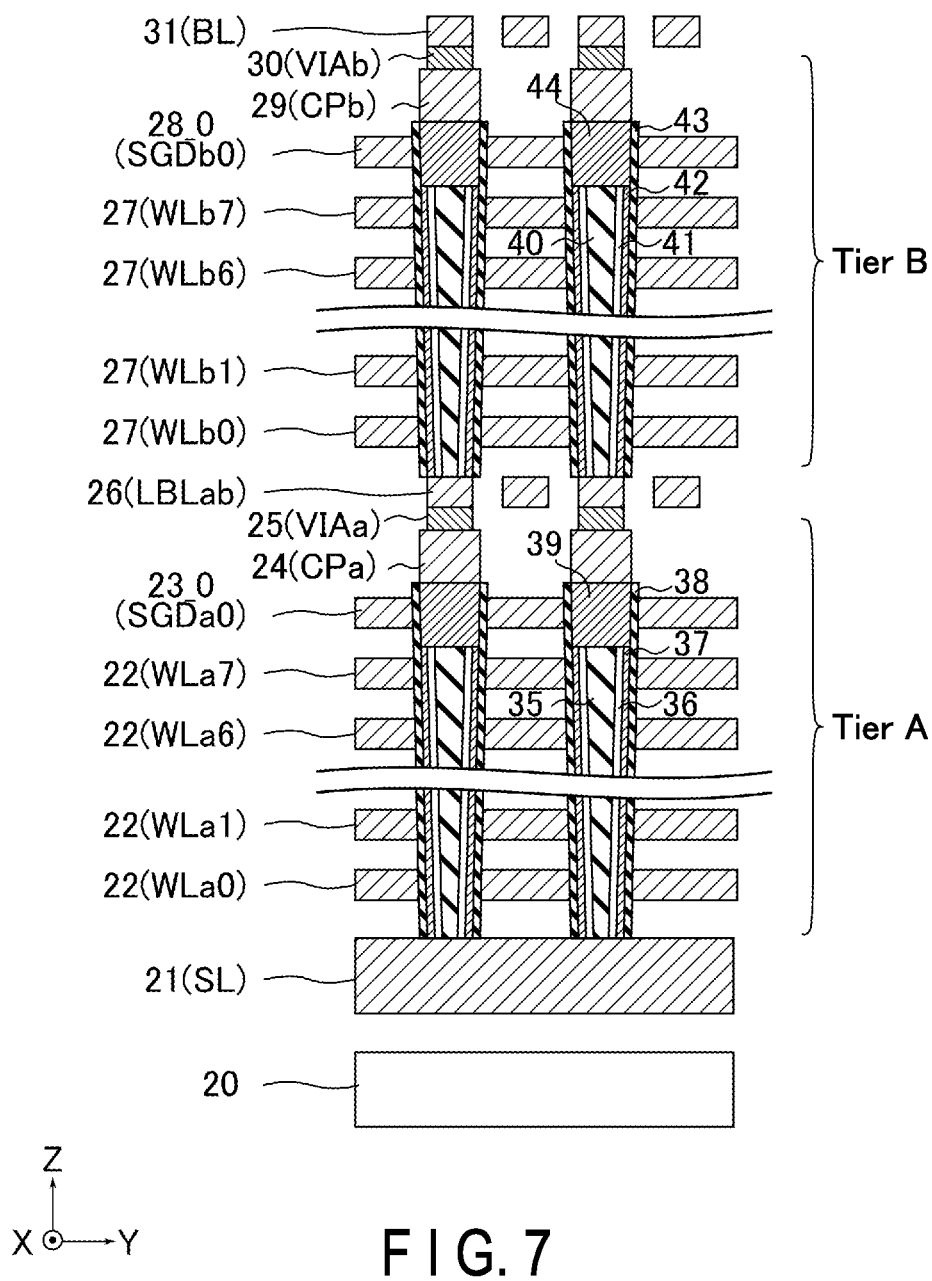
FIG. 7 is a cross-sectional view of the memory cell array, taken along line VII-VII shown in FIGS. 4 and 5.

FIG. 6 is a cross-sectional diagram viewed along line VI-VI in FIGS. 4 and 5, and FIG. 7 is a cross-sectional diagram viewed along line VII-VII in FIGS. 4 and 5, and they show an example of the structure of the memory cell array 110 in the XZ cross section and the YZ cross section. As shown in FIGS. 6 and 7, the memory cell array 110 includes, for example, conductive layers 21 to 31 provided above the semiconductor substrate 20.

Specifically, a conductive layer 21 is provided above the semiconductor substrate 20, with an insulating layer (not shown) interposed therebetween. The conductive layer 21 is used as the source line SL. Above the conductive layer 21, a stacked structure consisting of insulating layers (not shown) and conductive layers 22 that are alternately stacked is provided. For example, the conductive layers 22 are used as word lines WLa0 to WLa7 in the order from the side of the semiconductor substrate 20. The conductive layer 23 is provided above the uppermost conductive layer 22, with an insulating layer (not shown) interposed therebetween. The conductive layer 23 is used as a select gate line SGDa. Each of the conductive layers 21 through 23 are formed in a plate shape extending along the XY plane, for example. A conductive layer 26 is provided above the conductive layer 23, with conductive layers 24 and 25 interposed therebetween. For example, the conductive layer 26 is used as a local bit line LBLab.

The memory pillars MPa and dummy pillars DPa are provided between the conductive layer 21 and the conductive layer 26. Specifically, the memory pillars MPa and the dummy pillars DPa are provided, extending along the Z axis. Specifically, the memory pillars MPa and the dummy pillars DPa penetrate through the conductive layers 22 and 23, and their bottoms are in contact with the conductive layer 21. Each memory pillar MPa and each dummy pillar DPa includes a core film 35, a resistance change film 36, a semiconductor film 37, an insulating film 38, and a semiconductor portion 39.

The core film 35 extends along the Z direction. The upper end of the core film 35 is located above the uppermost conductive layer 22, and the lower end thereof is located below the lowermost conductive layer 22. The core film 35 includes an insulator, such as silicon oxide ($SiO_2$). The resistance change film 36 covers the side surface of the core film 35. The upper end of the resistance change film 36 is located above the uppermost conductive layer 22, and the lower end thereof is located below the lowermost conductive layer 22. The semiconductor film 37 covers the side surface of the resistance change film 36. For example, the upper end of the semiconductor film 37 is located above the conductive layer 23, and the lower end is in contact with the conductive layer 21. The insulating film 38 covers the side surface of the semiconductor film 37. The upper end of the insulating film 38 is located above the conductive layer 23, and the lower end is located below the lowermost conductive layer 22. The semiconductor portion 39 covers the upper surfaces of the core film 35, the resistance change film 36, and the semiconductor film 37, and is in contact with the inner wall portion of the insulating film 38 above the core film 35 and the lower end of the conductive layer 24 formed immediately above the semiconductor portion 39.

Of the memory pillars MPa having the above-described structure, the portions intersecting with the conductive layers 22 are respectively used as the memory cells MCa0 through MCa7, and the portion intersecting with the conductive layer 23 is used as the select transistor STDa.

On the upper surface of the semiconductor portion 39 in the memory pillar MPa, a conductive layer 24 that functions as a pillar-shaped contact CPa is provided. On the upper surface of the conductive layer 24, a conductive layer 25 that functions as a pillar-shaped via VIAa is provided. The conductive layer 25 has, for example, a diameter smaller than that of the conductive layer 24, and the upper end is in contact with a single corresponding conductive layer 26 (local bit line LBLab). Thus, the conductive layer 21 and 26 are coupled to each other via the semiconductor film 37 or the resistance change film 36 in the memory pillar MPa and the semiconductor portion 39. On the other hand, the contact CPa and the via VIAa are not provided on the upper surface of the semiconductor portion 39 in the dummy pillar DPa. For this reason, the conductive layer 26 is not coupled to the semiconductor film 37 or the resistance change film 36 in the dummy pillar DPa and the semiconductor portion 39.

The insulating layer 32 is formed in a plate shape along the YZ plane, at a location where the insulating layer 32 overlaps the dummy pillar DPa for example. The insulating layer 32 functions as a slit SHEa that divides the conductive layer 23 along the X axis. The insulating layers 32 divide the conductive layer 23 into the conductive layers 23_0 through 23_3 respectively corresponding to the select gate lines SGDa0 through SGDa3 in the string units SU0 through SU3, for example. The upper end of the insulating layer 32 is located between the conductive layer 23 and the conductive layer 26, and the lower end thereof is located between the conductive layer 23 and the uppermost conductive layer 22. The insulating layer 32 includes an insulator such as silicon oxide ($SiO_2$).

The above-described structure between the conductive layer 21 and the conductive layer 26, including the memory pillars MPa and the dummy pillars DPa, constitutes a tier A.

Above the conductive layer 26, a stacked structure consisting of insulating layers (not shown) and conductive layers 27 that are alternately stacked is provided. For example, the conductive layers 27 are used as word lines WLb0 to WLb7 in the order from the side of the semiconductor substrate 20. The conductive layer 28 is provided above the uppermost conductive layer 27, with an insulating layer (not shown) interposed therebetween. The conductive layer 28 is used as a select gate line SGDb. Each of the conductive layers 27 and 28 is formed in, for example, a plate-like shape extending along the XY plane. A conductive layer 31 is provided above the conductive layer 28, with conductive layers 29 and 30 interposed therebetween. The conductive layer 31 is used as a bit line BL.

The memory pillars MPb and dummy pillars DPb are provided between the conductive layer 26 and the conductive layer 31. Specifically, the memory pillars MPb and the dummy pillars DPb are provided, extending along the Z axis. Specifically, the memory pillars MPb and the dummy pillars DPb penetrate through the conductive layers 27 and 28 and their bottoms are in contact with the conductive layer 26. Each memory pillar MPb and each dummy pillar DPb includes a core film 40, a resistance change film 41, a semiconductor film 42, an insulating film 43, and a semiconductor portion 44.

The core film 40 extends along the Z direction. The upper end of the core film 40 is located above the uppermost conductive layer 27, and the lower end thereof is located below the lowermost conductive layer 27. The core film 40 includes an insulator, such as silicon oxide ($SiO_2$). The resistance change film 41 covers the side surface of the core film 40. The upper end of the resistance change film 41 is located above the uppermost conductive layer 27, and the lower end thereof is located below the lowermost conductive layer 27. The semiconductor film 42 covers the side surface of the resistance change film 41. For example, the upper end of the semiconductor film 42 is located above the conductive layer 28, and the lower end is in contact with the conductive layer 26. The insulating film 43 covers the side surface of the semiconductor film 42. The upper end of the insulating film 43 is located above the conductive layer 28, and the lower end is located below the lowermost conductive layer 27. The semiconductor portion 44 covers the upper surfaces of the core film 40, the resistance change film 41, and the semiconductor film 42, and is in contact with the inner wall portion of the insulating film 43 above the core film 40 and the lower end of the conductive layer 29 formed immediately above the semiconductor portion 44.

Of the memory pillars MPb having the above-described structure, the portions intersecting with the conductive layers 27 are respectively used as the memory cells MCb0 through MCb7 and the portion intersecting with the conductive layer 28 is used as the select transistor STDb.

On the upper surface of the semiconductor portion 44 in the memory pillar MPb, a conductive layer 29 that functions as a pillar-shaped contact CPb is provided. On the upper surface of the conductive layer 29, a conductive layer 30 that functions as a pillar-shaped via VIAb is provided. The conductive layer 30 has, for example, a diameter smaller than that of the conductive layer 29, and the upper end is in contact with a single corresponding conductive layer 31 (bit line BL). Thus, the conductive layer 26 and 31 are coupled to each other via the semiconductor film 42 or the resistance change film 41 in the memory pillar MPb and the semiconductor portion 44. On the other hand, the contact CPb and the via VIAb are not provided on the upper surface of the semiconductor portion 44 in the dummy pillar DPb. For this reason, the conductive layer 31 is not coupled to the semiconductor film 42 or the resistance change film 41 in the dummy pillar DPb and the semiconductor portion 44.

The insulating layer 33 is formed in a plate shape along the YZ plane, at a location where the insulating layer 32 overlaps the dummy pillar DPb for example. The insulating layer 33 functions as a slit SHEb that divides the conductive layer 28 along the X axis. The insulating layers 33 divide the conductive layer 28 into the conductive layers 28_0 through 28_3 respectively corresponding to the select gate lines SGDb0 through SGDb3 in the string units SU0 through SU3, for example. The upper end of the insulating layer 33 is located between the conductive layer 28 and the conductive layer 31, and the lower end thereof is located between the conductive layer 28 and the uppermost conductive layer 27. The insulating layer 33 includes an insulator such as silicon oxide ($SiO_2$).

The above-described structure between the conductive layer 26 and the conductive layer 31, including the memory pillars MPb and the dummy pillars DPb, constitutes a tier B.

The insulating layer 34 is formed in for example a plate-shape extending along the YZ plane and functions as a slit SLT that divides the conductive layers 22 through 28 along the Y axis. The insulating layers 34 divide the conductive layers 22 through 28 into blocks BLK for example. The upper end of the insulating layer 34 is located between the conductive layer 28 and the conductive layer 31, and the lower end of the insulating layer 34 is located below the lowermost conductive layer 22. The insulating layer 34 includes an insulator such as silicon oxide ($SiO_2$).

Next, the cross-sectional structure of the memory pillar MP along the XY plane is explained with reference to FIG. 8.

FIG. 8(A) shows a cross section taken along line VIIIA-VIIIA in FIG. 6 and shows an example of a cross-sectional structure of the memory cell Ma. FIG. 8(B) shows a cross section taken along line VIIIB-VIIIB in FIG. 6 and shows an example of a cross-sectional structure of the select transistor STDa.

As shown in FIG. 8(A), the circle-shaped core film 35 is provided at the center of the memory pillar MPa in the XY plane including the conductive layer 22. The resistance change film 36 surrounds the side surface of the core film 35 in a concentric manner; the semiconductor film 37 surrounds the side surface of the resistance change film 36 in a concentric manner; and the insulating film 38 surrounds the side surface of the semiconductor film 37 in a concentric manner. The resistance change film 36 functions as a resistance change element MR, and the semiconductor film 37, the insulating film 38, and the conductive layer 22 function as transistors.

With the above-described structure, in the memory pillars MPa, the portions intersecting with the conductive layer 22 can function as parallel-coupled memory cells MCa0 through MCa7 each having a resistance change element MR and a switch SW. Similarly, in the memory pillars MPb, the portions intersecting with the conductive layer 27 can function as memory cells MCb0 through MCb7.

As shown in FIG. 8(B), the semiconductor portion 39 having a circle shape is provided at the center of the memory pillar MPa in the XY plane including the conductive layer 23, and the insulating film 38 surrounds the side surface of the semiconductor portion 39 in a concentric manner. The semiconductor portion 39, the insulating film 38, and the conductive layer 23 function as transistors.

With the above-described structure, in the memory pillars MPa, the portions intersecting the conductive layer 23 function as the select transistors STDa. Similarly, in the memory pillars MPb, the portions intersecting with the conductive layer 28 function as the select transistors STDb.

The configuration of the memory cell array 110 described above is merely an example, and the memory cell array 110 may have other configurations. For example, the number of the conductive layers 22 and that of the conductive layer 27 are determined based on the number of the word lines WL. A plurality of conductive layers 23 and conductive layers 28 may be assigned to each select gate line SGD. The memory pillar MPa may be electrically coupled to the conductive layer 26 and to the conductive layer 31 via three or more contacts and vias, or via another interconnect. Multiple types of insulators may be provided in the slit SLT.

1.2 Operation

Next, an operation in the memory device according to the first embodiment will be described. In the following descriptions, for distinction, a constituent element that includes (or corresponds to) an operation-targeted memory cell MC may be referred to as a "selected component", and a component that does not include (or does not correspond to) an operation-targeted memory cell MC may be referred to as a "non-selected component". For example, a select gate line SGD coupled to a select transistor STD included in a local memory string LMS (selected local memory string LMS) that includes an operation-targeted memory cell MC (selected memory cell MC) may be referred to as a "selected select gate line SGD" (or "selected SGD"). For example, a select gate line SGD coupled to select transistor STD included in a local memory cell string LMS (non-selected local memory cell string LMS) that does not include a selected memory cell MC may be referred to as a "non-selected select gate line SGD" (or "non-selected SGD").

1.2.1 Write Operation

The write operation in the memory device according to the first embodiment will be described with reference to the timing chart of FIG. 9. FIG. 9 shows an example of a transition of voltages applied to a select gate line SGD, a word line WL, a bit line BL, and a source line SL in the case where data is written in the memory cells MC in a certain block BLK.

As shown in FIG. 9, the select gate line SGD, the word line WL, the bit line BL, and the source line SL are in a standby state until time T10. Specifically, under the standby state, the select gate line SGD, the bit line BL, and the source lines SL are supplied with a voltage VSS, and the word lines WL is supplied with a voltage VPP. The voltage VSS is for example 0 V and is a voltage that can turn the switches SW and the select transistors STD to an off state. The voltage VPP is for example higher than the voltage VSS and is a voltage that can turn the switches SW to an on state. Thus, until time T10, all select transistors STD are in an off state, and all switch elements SW are in an on state.

At time T10, the row decoder 120 applies the voltage VPP to a selected select gate line SGD and all non-selected select gate lines SGD belonging to the non-selected tier, and turns the corresponding select transistors STD to an on state. The row decoder 120 applies the voltage VSS to all non-selected select gate lines SGD belonging to a selected tier, and turns the corresponding select transistors STD to an off state. Thus, in the memory string set MSS coupled to the selected bit line BL, a selected local memory string LMS in the selected tier is turned to be conductive, and all four non-selected local memory strings LMS in the non-selected tier are turned to be conductive.

Furthermore, the row decoder 120 applies the voltage VSS to the selected word line WL and turns the switch elements SW of the memory cells MC including the selected memory cell MC coupled in common to the selected word line WL to an off state. The row decoder 120 then applies the voltage VPP to the non-selected word lines WL and turns the switch elements SW of all non-selected memory cells MC coupled in common to the non-selected word lines WL to an on state.

The sense amplifier 140 applies the voltage VWRITE to the selected bit line BL. As a result, an electric current flows in the memory cells MC in the five conductive local memory strings LMS. Of the memory cells MC in which an electric current flows, in the selected memory cell MC a current flows in the resistance change element MR, and in the non-selected memory cells MC a current flows in the switch SW. The voltage VWRITE is lower than the voltage VPP and is a voltage at which the alloy in the resistance change element MR melts. For this reason, in the resistance change element MR of the selected memory cell MC, a flowing current caused by the voltage VWRITE increases a temperature of the element, which results in melting of an alloy in the element.

At time T20, the sense amplifier 140 changes the voltage of the selected bit line BL from VWRITE to VSS. Herein, when a phase of the resistance change element MR is changed to a high resistance state (in other words, the element is turned to a reset state), the sense amplifier 140 rapidly decreases the voltage of the select bit line BL. Thus, the resistance change element MR of the selected memory cell MC is brought into an amorphous state and its phase is changed to a high resistance state. On the other hand, when a phase of the resistance change element MR is changed to a low resistance state (in other words, the element is turned to a set state), the sense amplifier 140 decreases the voltage of the selected bit line BL more gradually than the voltage reduction in the reset state. Thus, the resistance change element MR of the selected memory cell MC is brought into a crystalline state and its phase is changed to a low resistance state.

At time T30, the row decoder 120 and the sense amplifier 140 return the select gate line SGD, the word line WL, the bit line BL, and the source line SL to a standby state.

Thus, the operation of writing data in the selected memory cell MC is finished.

1.2.2 Read Operation

Figure 10:
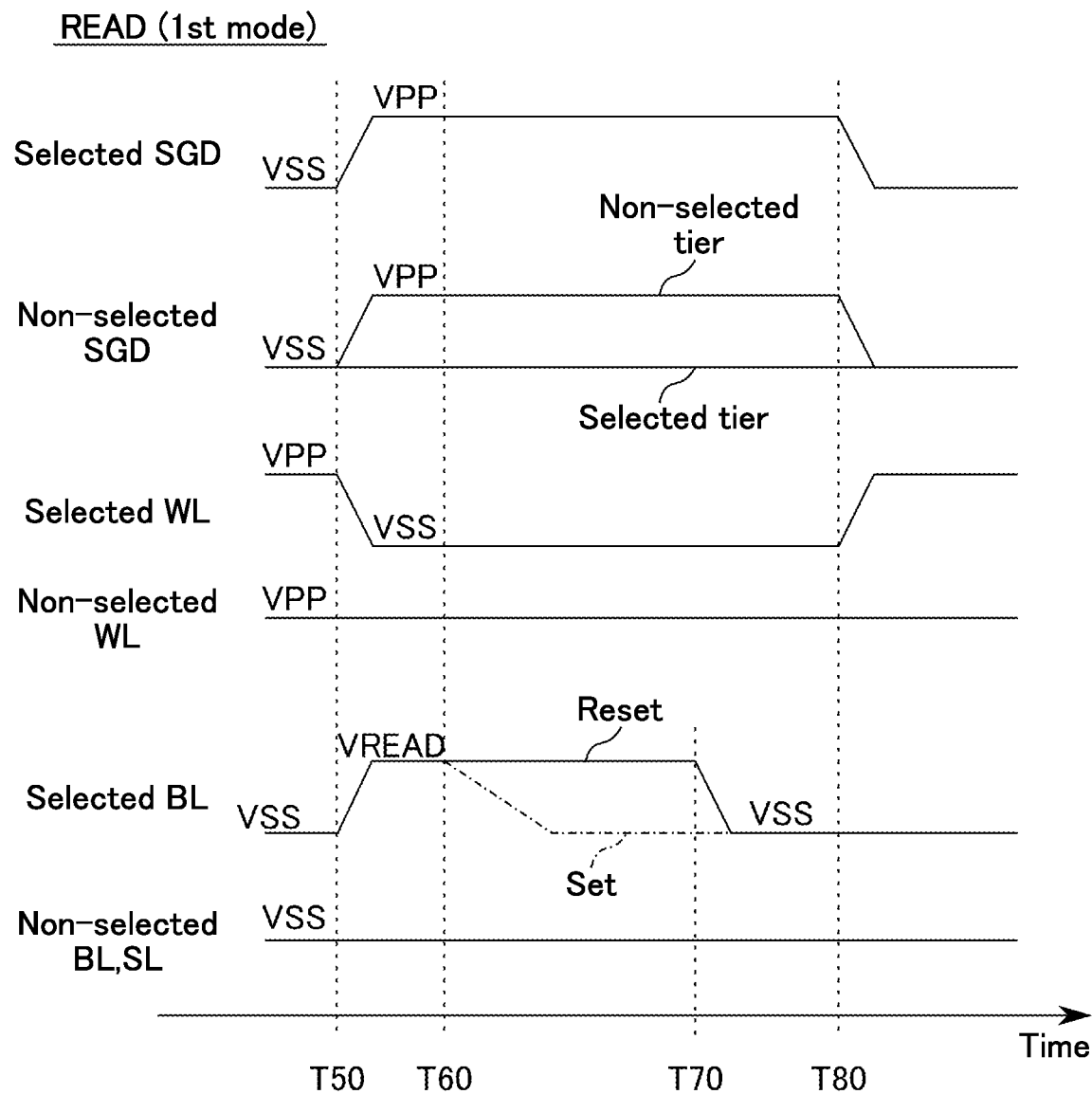
FIG. 10 is a timing chart for explaining a read operation in a first mode in the memory device of the first embodiment.

Next, the read operation in the memory device according to the first embodiment will be described. The memory device 100 according to the first embodiment is configured in such a manner that two read modes are selectable. FIGS. 10 and 11 are timing charts respectively corresponding to the first mode and the second mode of the read operation in the memory device of the first embodiment. FIGS. 10 and 11 show an example of transition of voltages applied to a select gate line SGD, a word line WL, a bit line BL, and a source line SL in the case where data is read in the memory cells MC in a certain block BLK.

The read operation in the first mode is described with reference to FIG. 10. In the read operation in the first mode, local memory strings LMS to be turned conductive are the same as those in the write operation in FIG. 9, which was described earlier.

As shown in FIG. 10, the select gate line SGD, the word line WL, the bit line BL, and the source line SL are in a standby state until time T50.

At time T50, the row decoder 120 applies the voltage VPP to the selected select gate line SGD and the non-selected select gate lines SGD belonging to the non-selected tier, and turns the corresponding select transistors STD to an on state. The row decoder 120 then applies the voltage VSS to all non-selected select gate lines SGD belonging to a selected tier, and turns the corresponding select transistors STD to an off state. Thus, in the memory string set MSS coupled to the selected bit line BL, a selected local memory string LMS in the selected tier is turned to be conductive, and all non-selected local memory strings LMS in the non-selected tier are turned to be conductive.

The sense amplifier 140 applies the voltage VREAD to the selected bit line BL. Thus, an electric current flows in the memory cells MC in the five conductive local memory strings LMS. Of the memory cells MC in which an electric current flows, in the selected memory cell MC a current flows in the resistance change element MR, and in the non-selected memory cells MC a current flows in the switch SW. The voltage VREAD is for example a voltage lower than the voltage VPP and having a magnitude capable of causing a sufficient amount of a current to flow in the resistance change element MR without melting the alloy in the resistance change element MR.

At time T60, the sense amplifier 140 stops driving of the selected bit line BL. When the resistance change element MR of the selected memory cell MC is in a high resistance state (namely, in a reset state), a current flowing in the selected memory cell MC is relatively small. For this reason, the voltage of the selected bit line BL almost does not change at all from the voltage VREAD even after a predetermined length of time has elapsed since time T60. When the resistance change element MR of the selected memory cell MC is in a low resistance state (namely, in a set state), a current flowing in the selected memory cell MC is relatively large. For this reason, the voltage of the selected bit line BL significantly decreases from the voltage VREAD after a predetermined length of time has elapsed since time T60.

The sense amplifier 140 senses a difference in a voltage change in a selected bit line BL originating from a difference in a resistance state of the resistance change element MR of the selected memory cell MC. Thus, the data stored in the selected memory cell MC can be read.

Since the operation performed by the row decoder 120 at time T60 on the word line WL and the select gate line SGD is the same as the write operation explained earlier, the description is omitted.

At time T70, upon confirmation of successful data reading in the selected memory cell MC, the sense amplifier 140 supplies the voltage VSS to the selected bit line BL.

At time T80, the row decoder 120 and the sense amplifier 140 return the select gate line SGD, the word line WL, the bit line BL, and the source line SL to a standby state.

Thus, the operation of reading data from the selected memory cell MC in the first mode is finished.

Next, the read operation in a second mode will be described with reference to FIG. 11. The read operation in the second mode differs from the read operation in the first mode shown in FIG. 10 in that one of four local memory strings LMS in the non-selected tier is turned to be conductive.

As shown in FIG. 11, the select gate line SGD, the word line WL, the bit line BL, and the source line SL are in a standby state until time T50.

At time T50, of the selected select gate line SGD and the non-selected select gate lines SGD belonging to the non-selected tier, the row decoder 120 applies the voltage VPP to the selected select gate line SGD belonging to the selected string unit SU and turns the corresponding select transistors STD to an on state. The row decoder 120 then applies the voltage VSS to all non-selected select gate lines SGD belonging to the non-selected string units SU, and turns the corresponding select transistor STD to an off state. Thus, in the memory string set MSS coupled to the selected bit line BL, a selected local memory string LMS in the selected tier is turned to be conductive, and a single non-selected local memory string LMS in the non-selected tier is turned to be conductive. The sense amplifier 140 applies the voltage VREAD to the selected bit line BL. Thus, an electric current flows in the memory cells MC in the two conductive local memory strings LMS.

Since the operation performed by the row decoder 120 on the word line WL and the operation performed by the sense amplifier 140 on the bit line BL at time T60 are the same as the first-mode read operation explained earlier, the description is omitted.

At time T70, upon confirmation of successful reading of data from the selected memory cell MC, the sense amplifier 140 supplies the voltage VSS to the selected bit line BL.

At time T80, the row decoder 120 and the sense amplifier 140 return the select gate line SGD, the word line WL, the bit line BL, and the source line SL to a standby state.

Thus, the second-mode operation of reading data from the selected memory cell MC is finished.

1.3 Advantageous Effects of Present Embodiment

In the memory string set MSS, the first ends of the local memory cell string LMSa0 through LMSa3 and the second ends of the local memory cell string LMSb0 through LMSb3 are coupled in common by the local bit line LBLab. It is thereby possible to use any number of non-selected local memory strings LMS belonging to a non-selected tier as current paths in the operation of flowing a current into a selected memory cell MC.

Figure 12:
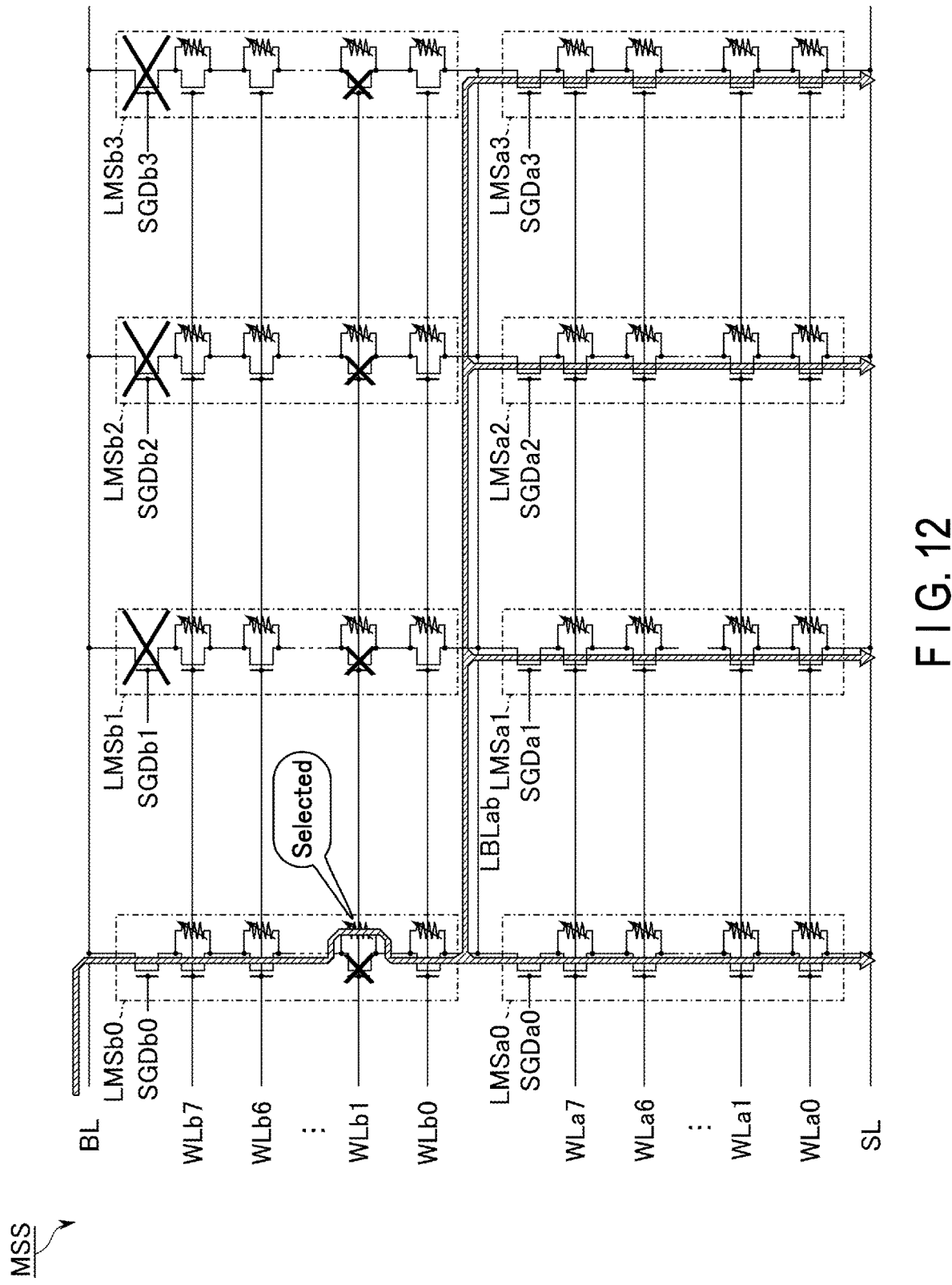
FIG. 12 is a schematic diagram for explaining a current path in the memory device of the first embodiment when a write operation and a first-mode read operation are performed.

FIG. 12 is a schematic diagram showing a current path in the memory device of the first embodiment when a write operation or a read operation in a first mode is performed. FIG. 12 shows, as an example, a case where a memory cell MC is coupled to a word line WLb1 in the local memory string LMSb0.

As shown in FIG. 12, in the write operation and the first-mode read operation, the current that has flown in the selected memory string LMSb0 is divided into all local memory strings LMSa0 through LMSa3 of the non-selected tier via the local bit line LBLab. Thus, parasitic resistance in the non-selected tier can be reduced compared to the case where only one of the non-selected local memory strings LMS in the non-selected tier are used as current paths. Thus, it is possible to suppress reduction in a current flowing in a selected memory cell MC when a write operation is performed and to easily obtain an amount of current required for a phase change of a resistance change element MR. Furthermore, reduction in an amount of a signal used in sensing during a read operation (for example, a difference between a set state and a reset state in the voltage change ratio of a bit line BL) can be suppressed, and a length of time required for a read operation can be shortened.

Figure 13:
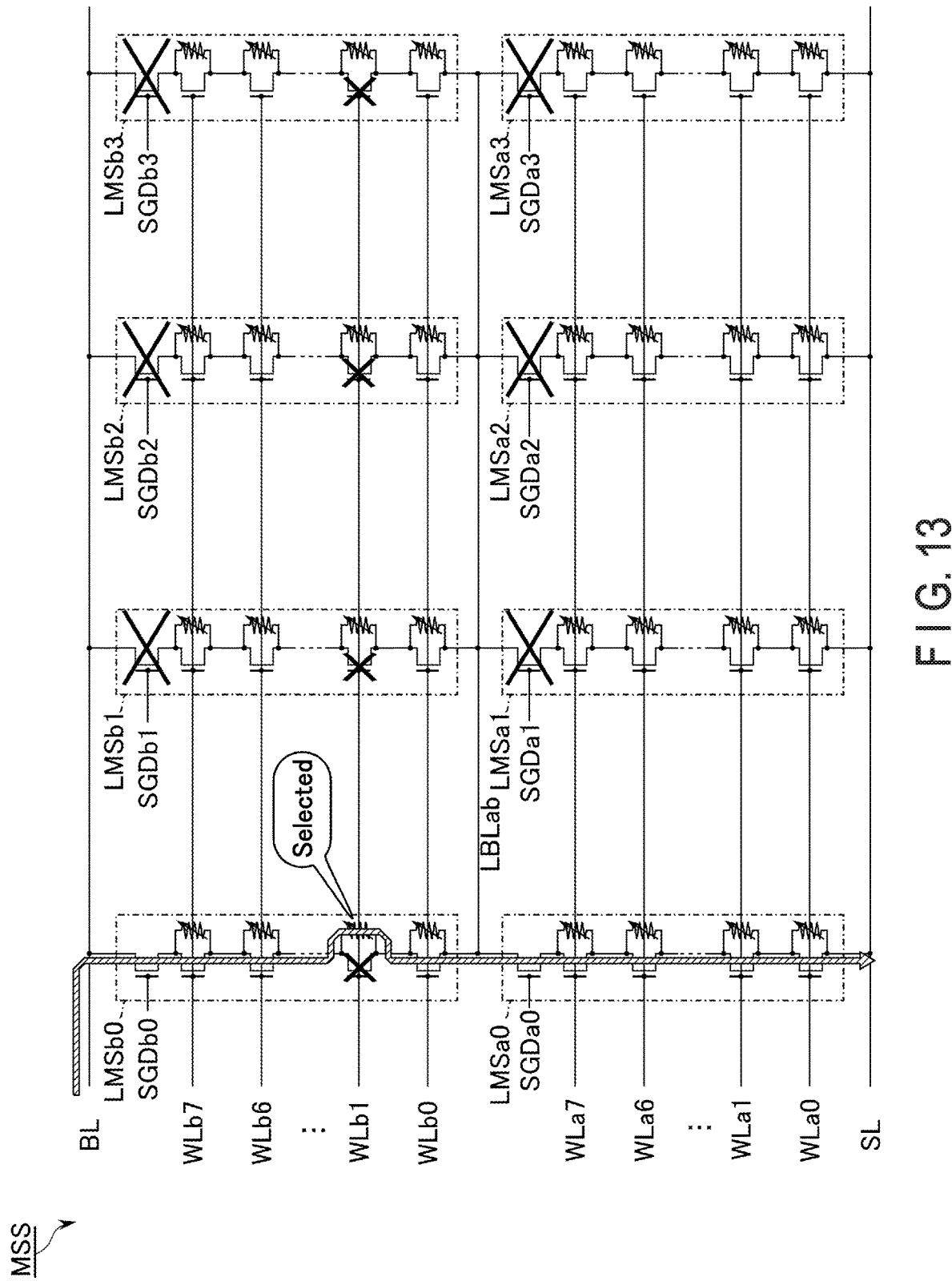
FIG. 13 is a schematic view for explaining a current path in the memory device of the first embodiment when a second-mode read operation is performed.

FIG. 13 is a schematic view for explaining a current path in a second-mode read operation performed in the memory device according to the first embodiment, and it shows a case where the same memory cell MC as that in FIG. 12 is selected.

As shown in FIG. 13, in the second-mode read operation, after flowing in the selected memory string LMSb0, a current flows only in one local memory string LMSa0 in the non-selected tier via the local bit line LBLab. For this reason, it is possible to reduce a current flowing in a selected memory cell MC compared to the case where all non-selected memory strings LMS belonging to the non-selected tier are used as current paths. Furthermore, it is possible to reduce the number of select gate lines SGD to be driven. The increase in power consumption when a read operation is performed can be thereby suppressed.

Thus, since the memory device 100 has two read modes, it is possible to select a more advantageous current path. However, the memory device 100 does not need to have two read modes and can be configured with only the one of the modes that is more suitable for an intended use.

2. Second Embodiment

Next, a memory device according to the second embodiment will be described. The second embodiment differs from the first embodiment in that a select transistor is provided between a memory cell MCa0 and a source line SL. Hereinafter, descriptions of the same configurations and operations as those of the first embodiment will be omitted, and configurations and operations differing from those of the first embodiment will mainly be described.

2.1 Configuration

FIG. 14 is a circuit diagram showing a configuration of a memory string set of a memory device according to the second embodiment and corresponds to FIG. 3 of the first embodiment.

As shown in FIG. 14, the memory string LMSa further includes a select transistor STS between a memory cell MCa0 and a source line SL. The gate electrodes of all select transistors STS in a single block BLK are coupled in common to a select gate line SGS.

Figure 15:
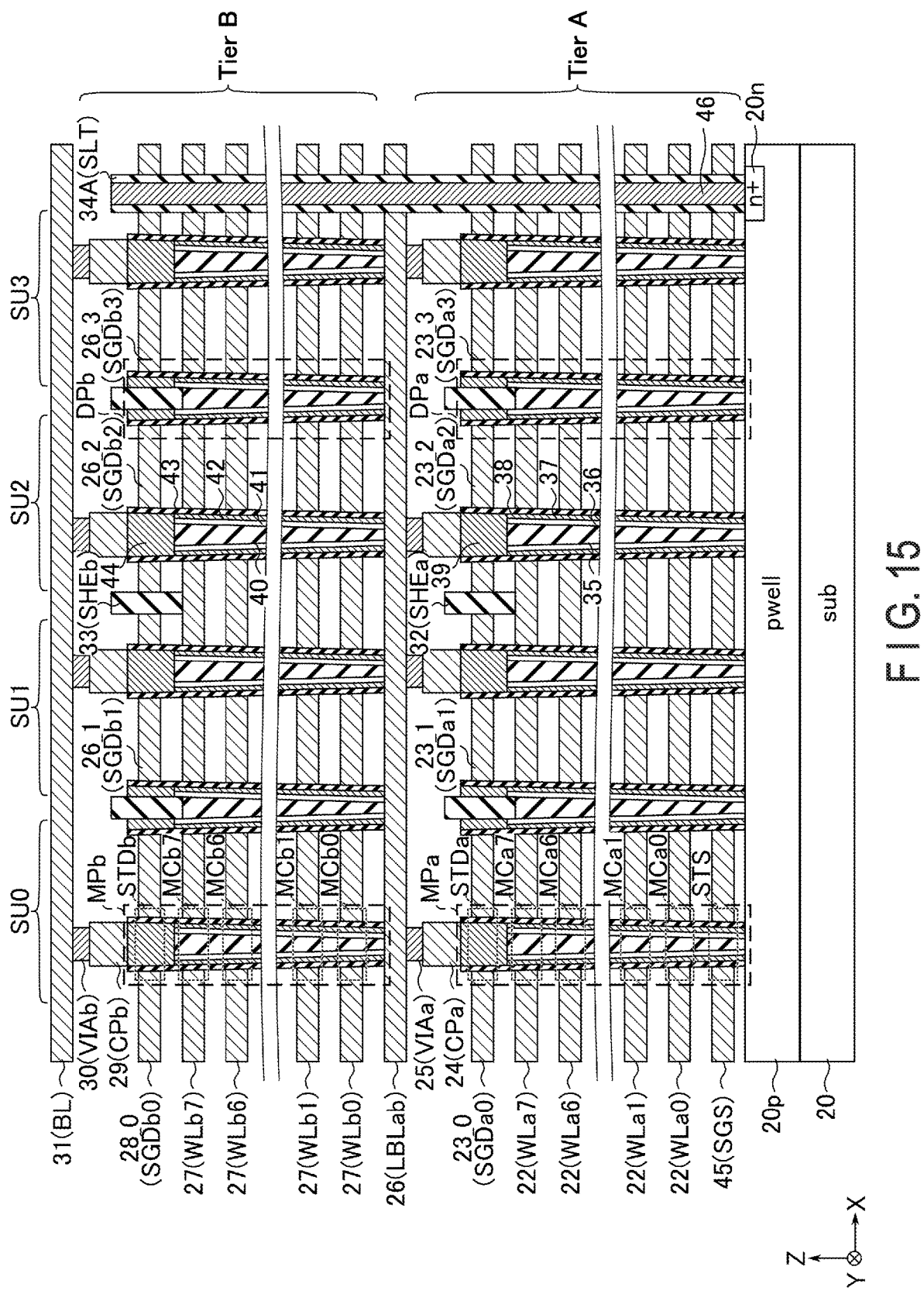
FIG. 15 is a circuit diagram for explaining a structure of a memory cell array of a memory device according to the second embodiment.

FIG. 15 is a cross-sectional view showing a configuration of the memory string set of the memory device according to the second embodiment and corresponds to the circuit configuration shown in FIG. 14.

As shown in FIG. 15, a p-type well region $20p$ is formed on the semiconductor substrate 20. A conductive layer 45 is provided above the p-type well region $20p$, with an insulating layer (not shown) interposed therebetween. The conductive layer 45 is used as the select gate line SGS.

Above the conductive layer 45, a structure similar to the structure provided above the conductive layer 21 shown in FIG. 6 is provided. The memory pillars MPa and the dummy pillars DPa penetrate through the conductive layer 45 and reach the p-type well region $20p$. In the memory pillars MPa, the portions intersecting the conductive layer 45 thereby function as the select transistors STS.

In the p-type well region $20p$, an n-type impurity diffusion region $20n$ is formed in the area that overlaps the slit SLT in a plan view. On the upper surface of the n-type impurity diffusion region $20n$, a conductive layer 46 used as a contact of the source line SL is formed. The upper end of the conductive layer 46 is located above the conductive layer 28, for example. It is thereby possible to apply a potential of a source line SL arranged above the memory cell array 110 to one end of the select transistor STS, via the conductive layer 46, the n-type impurity diffusion region $20n$, and the p-type well region $20p$. The side surface of the conductive layer 46 is covered by, for example, an insulating layer 34A used as a slit SLT. The conductive layer 46 is thereby insulated from the conductive layers 22 through 28 and 45.

2.2 Operation

Figure 16:
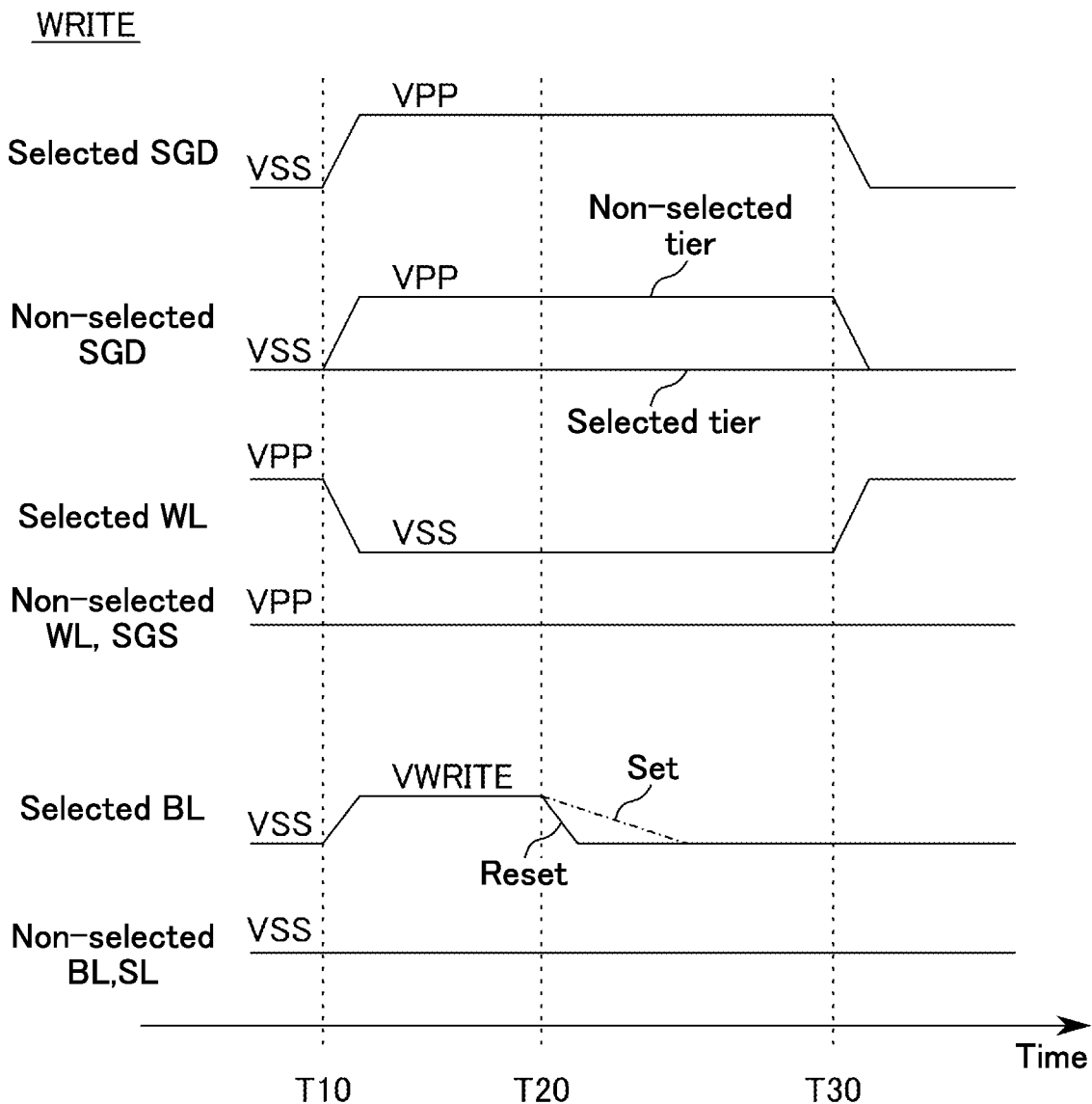
FIG. 16 is a timing chart for explaining a write operation in the memory device of the second embodiment.
Figure 17:
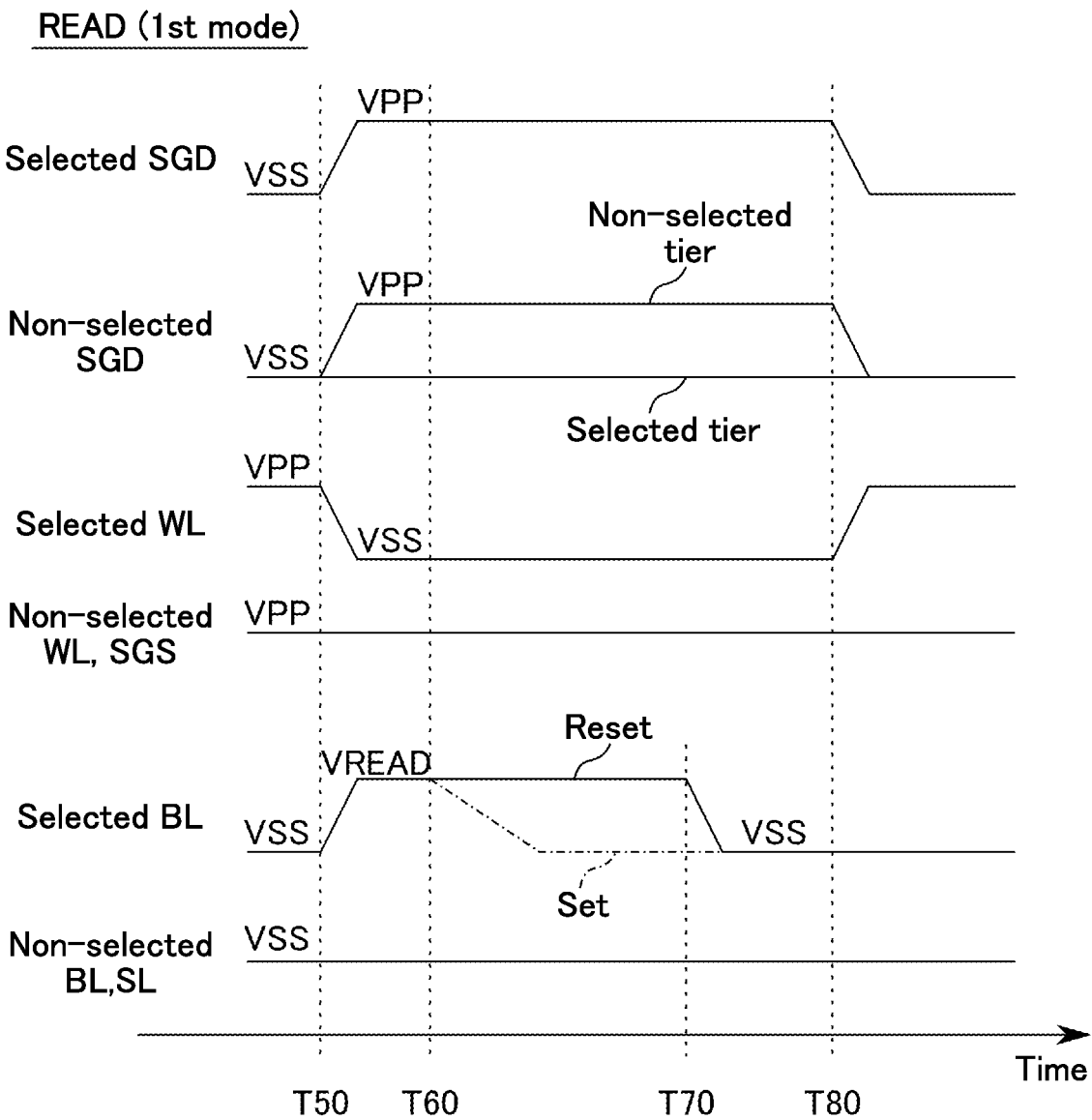
FIG. 17 is a timing chart for explaining a read operation in a first mode in the memory device of the second embodiment.
Figure 18:
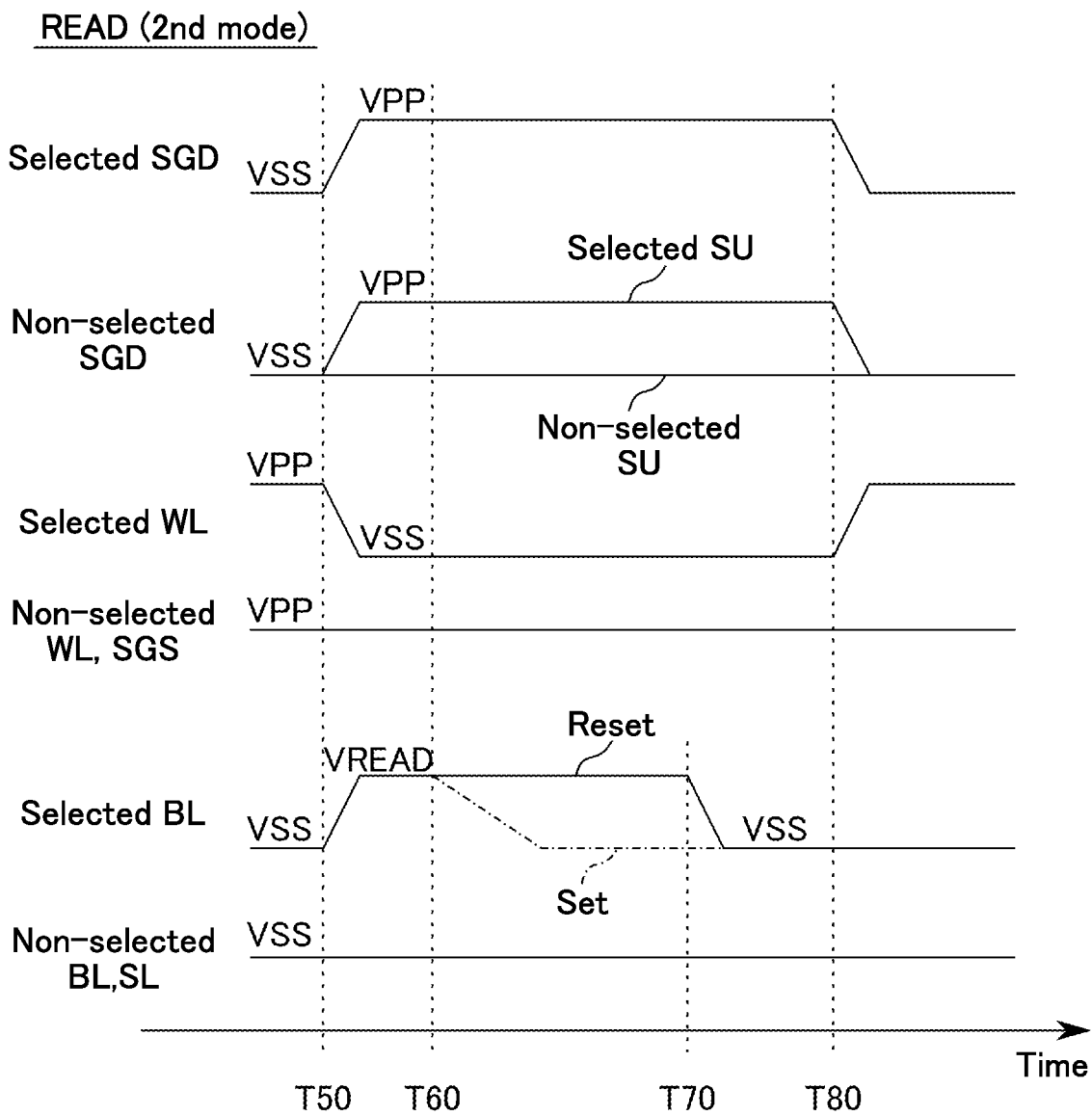
FIG. 18 is a timing chart for explaining a write operation in a second mode in the memory device of the second embodiment.

FIG. 16 is a timing chart showing a write operation in the memory device according to the second embodiment and corresponds to FIG. 9 of the first embodiment. FIGS. 17 and 18 are flowcharts respectively showing write operations in the first and second modes in the memory device according to the second embodiment, and correspond to FIGS. 10 and 11 in the first embodiment.

As shown in FIGS. 16 through 18, in a standby state the row decoder 120 applies the voltage VPP to the select gate line SGS. The select transistors STS in a standby state are thereby turned to an on state. In each of the write operation, the first-mode read operation, and the second-mode read operation, the select transistors STS are maintained in an on state throughout the operation.

2.3 Advantageous Effects of Second Embodiment

According to the second embodiment, the memory pillars MPa are coupled to the p-type well region $20p$. The source line SL is provided above the memory cell array 110 and coupled to, via a contact, the n-type impurity diffusion region $20n$ formed above the p-type well region $20p$. Of the conductive layers intersecting the memory pillars MPa, the lowermost conductive layer 45 is used as select transistors STS whose on state is maintained throughout an operation. It is thereby possible, even when the memory pillars MPa are directly in contact with the semiconductor substrate 20, to form a channel in the p-type well region $20p$ during an operation and to electrically couple the source line SL to the memory pillars MPa. Thus, even when the memory pillars MPa are not in contact with the source line SL (are in contact with the semiconductor substrate 20), a current can flow from the bit line BL to the source line SL.

3. Third Embodiment

Next, a memory device according to the third embodiment will be described. The third embodiment differs from the first and second embodiments in that a local bit line LBLab continues over two or more blocks BLK. Hereinafter, the same configurations and operations as those of the first embodiment will be omitted, and those differing from those of the first embodiment will mainly be described.

3.1 Configuration

Figure 19:
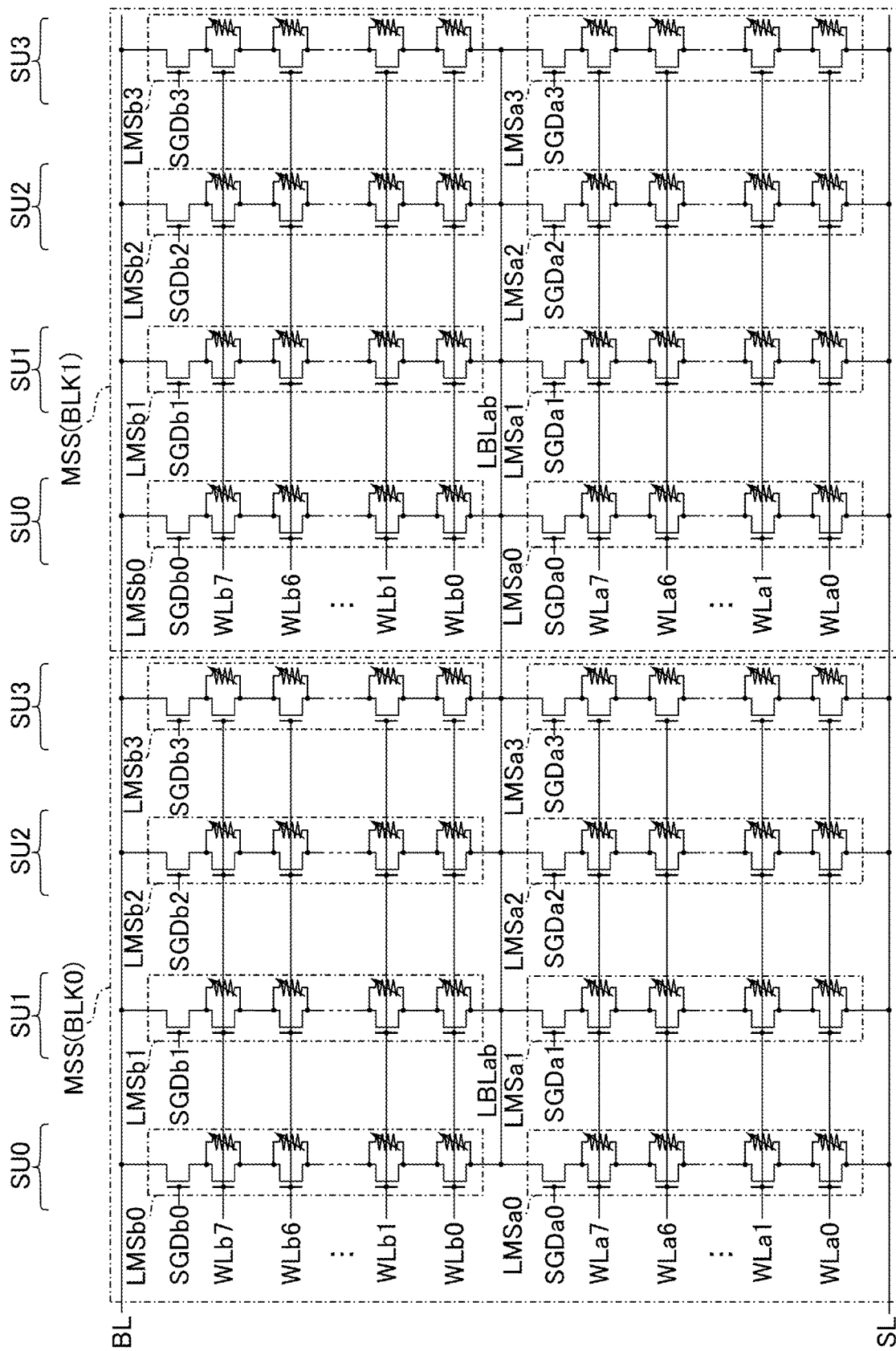
FIG. 19 is a circuit diagram for explaining a configuration of a memory string set according to a third embodiment.

FIG. 19 is a circuit diagram showing a configuration of a memory string set of the memory device according to the third embodiment. FIG. 19 shows two memory string sets MSS (BLK0) and MSS (BLK1) respectively included in blocks BLK0 and BLK1 and coupled in common to the same bit line BL.

As shown in FIG. 19, two memory string sets MSS are coupled by a common local bit line LBLab. More specifically, the first ends of the local memory strings LMSa0 through LMSa3 in a memory string set MSS (BLK0) and the local memory strings LMSa0 through LMSa3 in a memory string set MSS (BLK1), and the second ends of the local memory strings LMSb0 through LMSb3 in a memory string set MSS (BLK0) and the local memory strings LMSb0 through LMSb3 in a memory string set MSS (BLK1) are coupled in common to a local bit line LBLab. Thus, the memory string set is configured in such a manner that a current flowing in the local memory strings LMSa0 through LMSa3 in the memory string set MSS (BLK0) can flow in the local memory strings LMSb0 through LMSb3 in the memory string set MSS (BLK1) via a local bit line LBLab.

The word lines WLa0 through WLa7 and WLb0 through WLb7 and the select gate lines SGDa0 through SGDa3 and SGDb0 through SGDb3 coupled to the memory string set MSS (BLK0) are, on the other hand, electrically insulated from the word lines WLa0 through WLa7 and WLb0 through WLb7 and the select gate lines SGDa0 through SGDa3 and SGDb0 through SGDb3 coupled to the memory string set MSS (BLK1). In other words, the current path in the memory string set MSS (BLK0) and that in the memory string set MSS (BLK1) are individually controlled.

Figure 20:
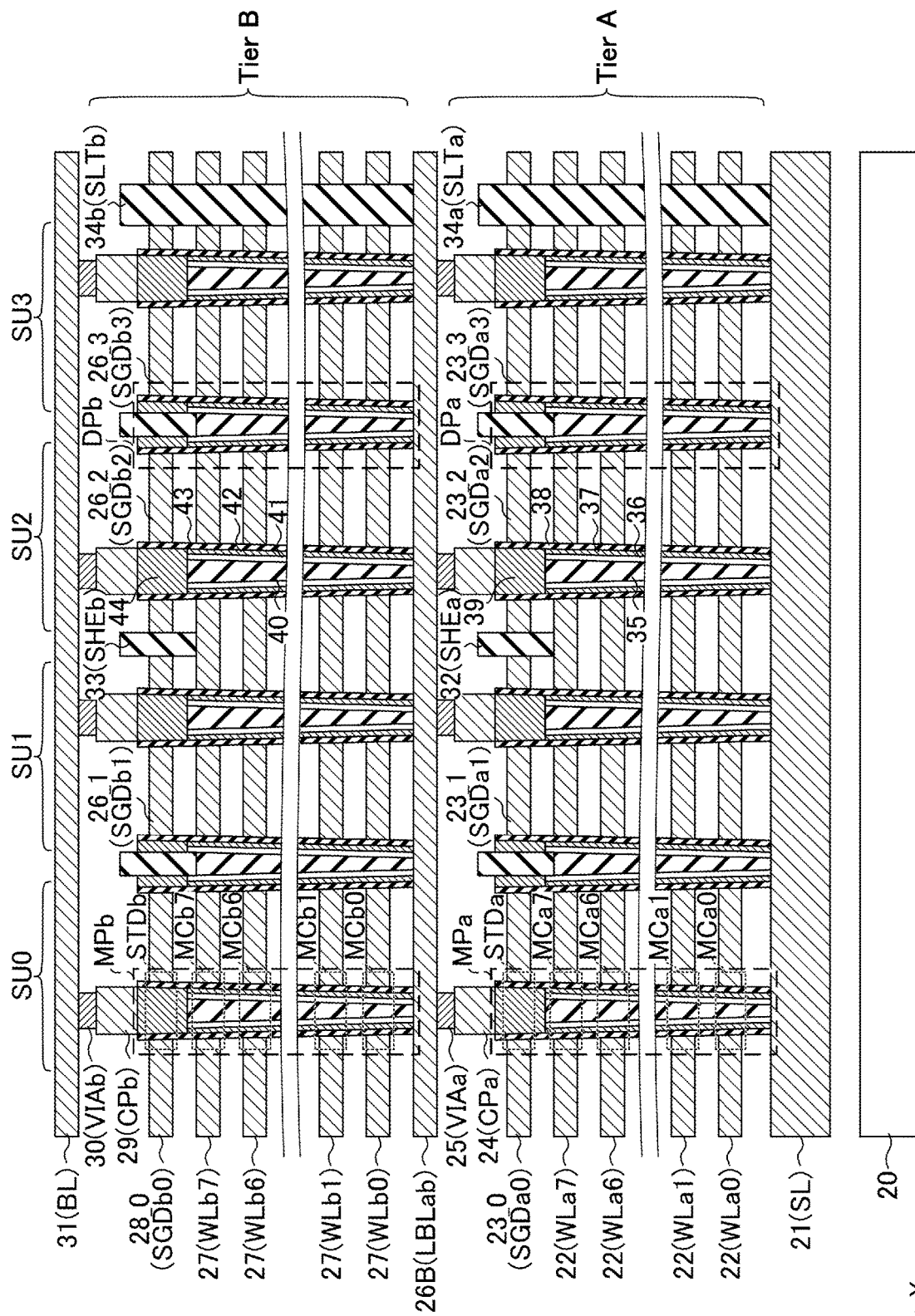
FIG. 20 is a cross-sectional view for explaining a structure of a memory cell array of the memory device according to the third embodiment.

FIG. 20 is a cross-sectional view showing a configuration of the memory string set of the memory device according to the third embodiment and corresponds to a single memory string set MSS in the circuit configuration shown in FIG. 19.

As shown in FIG. 20, the insulating layer 34a is formed in for example a shape of a plate extending along the YZ plane and functions as a slit SLTa that divides the conductive layers 22 and 23 along the Y axis. The insulating layer 34a splits the conductive layers 22 and 23 into blocks BLK for example. The upper end of the insulating layer 34a is located between the conductive layer 23 and the conductive layer 26B, and the lower end of the insulating layer 34a is located below the lowermost conductive layer 22.

The insulating layer 34b is formed in for example a shape of a plate extending along the YZ plane and functions as a slit SLTb that divides the conductive layers 27 and 28 along the Y axis. The insulating layer 34b splits the conductive layers 27 and 28 into blocks BLK for example. The upper end of the insulating layer 34b is located between the conductive layer 28 and the conductive layer 31, and the lower end of the insulating layer 34b is located between the lowermost conductive layer 27 and the conductive layer 26B. The conductive layer 26B extends between the insulating layer 34a and the insulating layer 34b along the X axis and is used as a local bit line LBLab that couples two blocks BLK.

FIG. 20 shows an example where the slits SLTa corresponding to the tier A and the slits SLTb corresponding to the tier B are individually provided; however, the embodiment is not limited to this example. For example, a single continuous insulating layer may be provided as a single slit SLT corresponding to both the tier A and the tier B. In this case, the conductive layer 26B penetrates through this insulating layer and extends along the X axis.

3.2 Operation

Next, an operation in the memory device according to the third embodiment will be described.

Since the voltages applied to the bit line BL and the source line SL in a write operation and a read operation performed in the memory device according to the third embodiment are the same as those in the first and second embodiments, the descriptions of such voltages are omitted. Hereinafter, the voltages applied to the select gate lines SGD and the word lines WL in a write operation and a read operation in a plurality of blocks BLK sharing a local bit line LBL in the memory device according to the third embodiment will mainly be explained.

3.2.1 Write Operation and Read Operation in First Mode

The write operation and the first-mode read operation in the memory device according to the third embodiment will be described. In the following, three operation examples will be presented as examples of a timing chart of the voltages applied to the select gate lines SGD and the word lines WL, which are in common in a write operation and a first-mode read operation.

First Example

First, the first example is described. In the first example, the same voltage is applied to corresponding word lines WL in a block that does not include a selected memory cell MC ("non-selected block BLK") and a block that includes a selected memory cell MC ("selected block BLK").

Figure 21:
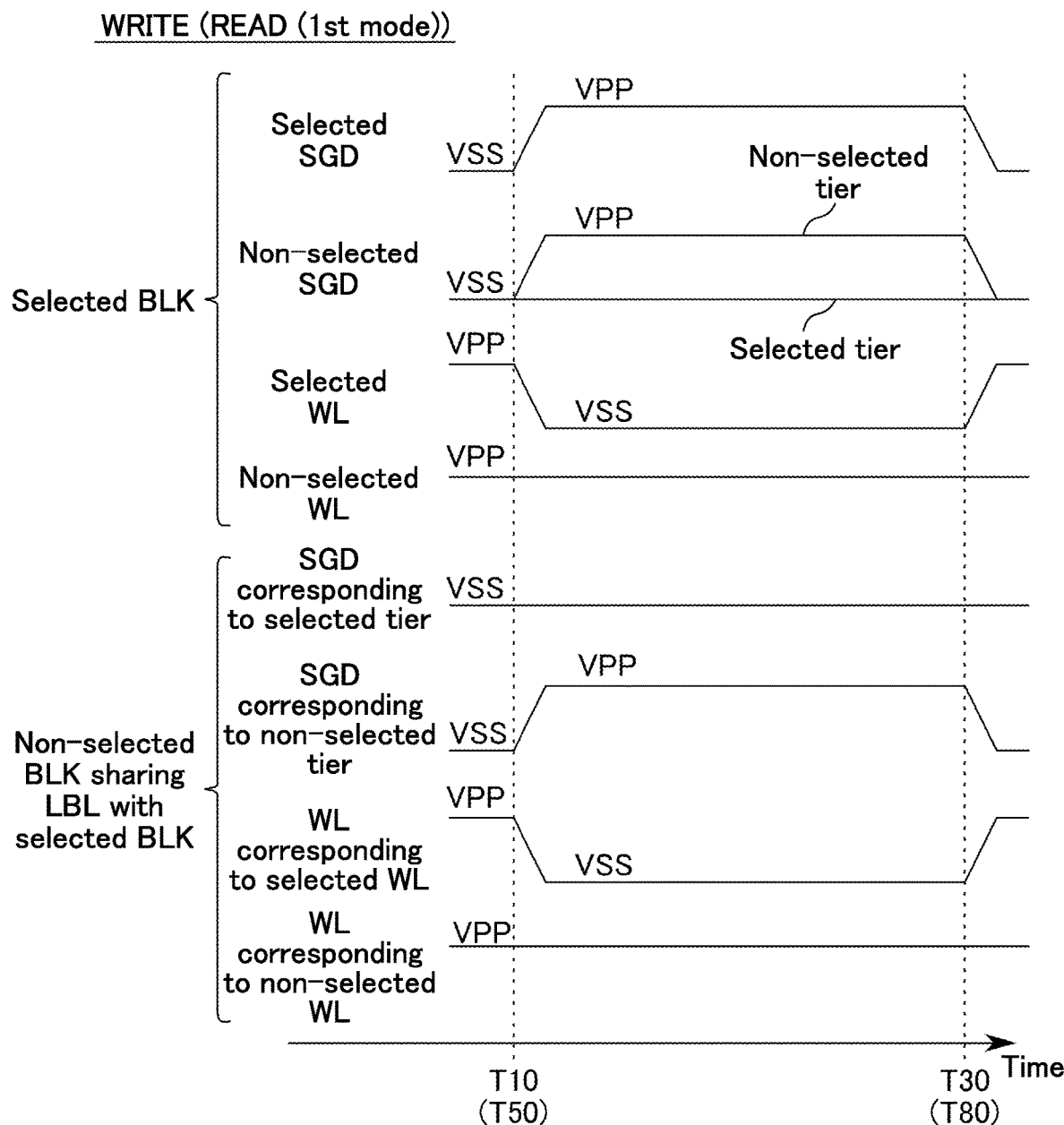
FIG. 21 is a timing chart for explaining a first example of a write operation and a read operation in a first mode in the memory device of the third embodiment.

FIG. 21 is a timing chart for explaining the first example of a write operation and a read operation in a first mode in the memory device of the third embodiment. In FIG. 21, the times relating to a read operation are indicated in parentheses.

As shown in FIG. 21, at time T10 (or time T50), the row decoder 120 applies voltages to the select gate lines SGD and the word lines WL to perform a write operation or a first-mode read operation.

Specifically, the row decoder 120 applies the voltage VPP to the selected select gate line SGD and all non-selected select gate lines SGD belonging to the non-selected tier (regardless of whether the block is a selected block BLK or non-selected block BLK), and turns the corresponding select transistors STD to an on state. The row decoder 120 maintains the supply of the voltage VSS to all non-selected select gate lines SGD belonging to the selected tier (regardless of whether the block is a selected block BLK or non-selected block BLK), and turns the corresponding select transistors STD to an off state. Thus, in the memory string set MSS coupled to the selected bit line BL, a selected local memory string LMS in the selected tier is turned to be conductive, and all eight non-selected local memory strings LMS in the non-selected tier are turned to be conductive.

Furthermore, the row decoder 120 applies the voltage VSS to the selected word line WL and the word line WL corresponding to the selected word line WL in the non-selected block BLK. The row decoder 120 continuously applies the voltage VPP to the non-selected word lines WL in the selected block BLK and the word lines WL corresponding to the non-selected word lines WL in the non-selected block BLK.

At time T30 (or time T80), the row decoder 120 returns the voltages of the select gate lines SGD and the word lines WL to their standby states.

The operation in the first example is thus finished.

Figure 22:
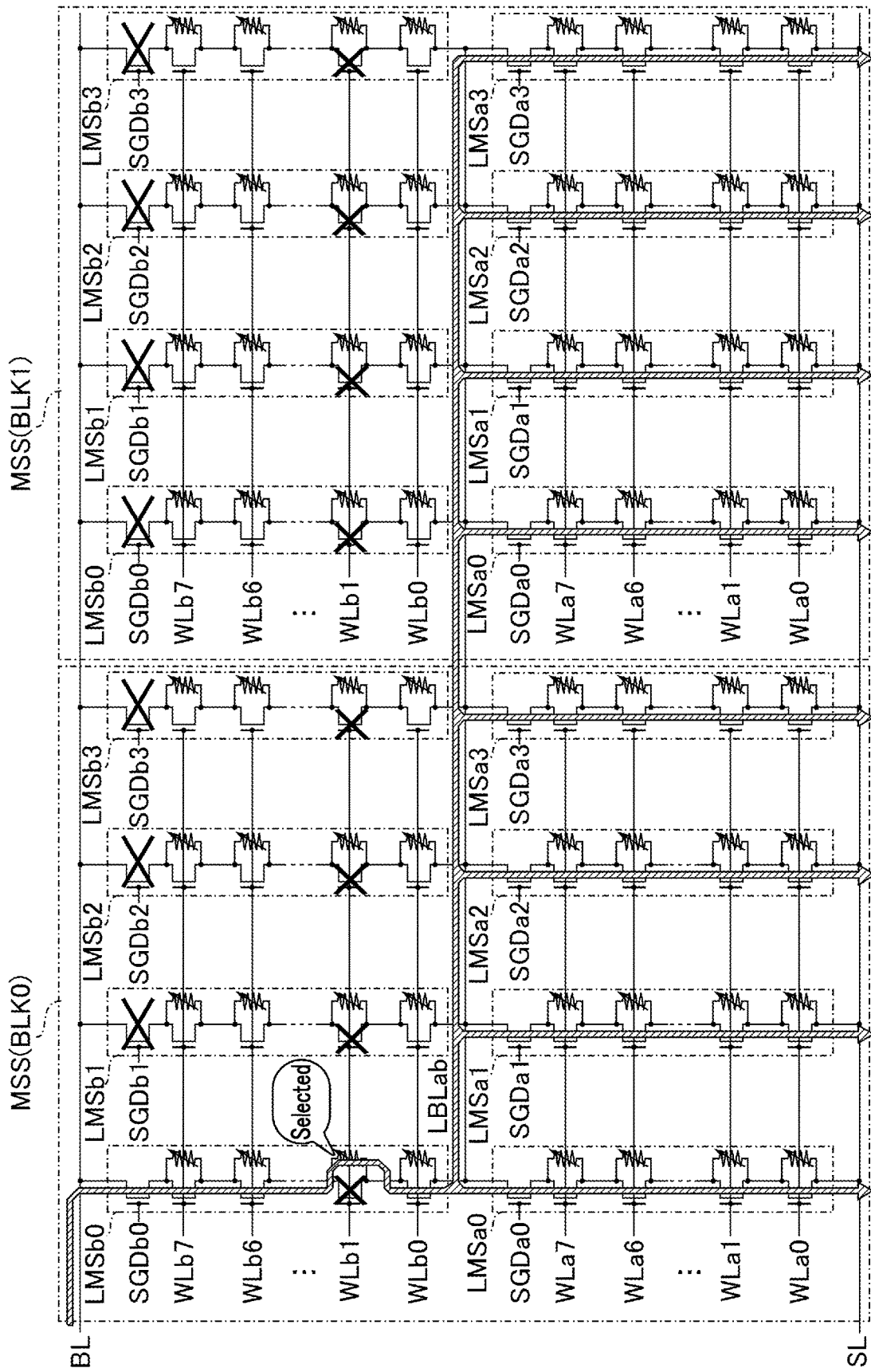
FIG. 22 is a schematic diagram for explaining a current path of the first example of a write operation and a read operation in a first mode in the memory device of the third embodiment.

FIG. 22 is a schematic diagram showing a specific example of a current path formed in the operation based on the first example. FIG. 22 shows, as an example, a case where the memory cell MCb1 in the local memory string LMSb0 of the block BLK0 is selected.

As shown in FIG. 22, in the selected tier, only the local memory string LMSb0 in the block BLK0 that includes the selected memory cell MCb1 serves as a current path. In the non-selected tier, on the other hand, the local memory strings LMSa0 through LMSa3 in each of the blocks BLK0 and BLK1 serve as current paths. It is thereby possible to make the local memory strings LMS in the non-selected tier in the non-selected block BLK contribute to the suppression of increase in parasitic resistance.

In two blocks BLK0 and BLK1 coupled by a local bit line LBLab, the word lines WL are controlled regardless of which block ELK the word lines belong to. For this reason, in the first example, it is possible to suppress an increase in loads caused in the control of the word lines WL in a write operation and a first-mode read operation performed by the row decoder 120.

Second Example

Next, the second example will be described. The second example is a case where different voltages are applied to corresponding word lines WL between the selected block BLK and the non-selected block BLK. Specifically, in the second example, all switch elements SW in the selected tier of the non-selected block ELK are controlled to be in an off state.

Figure 23:
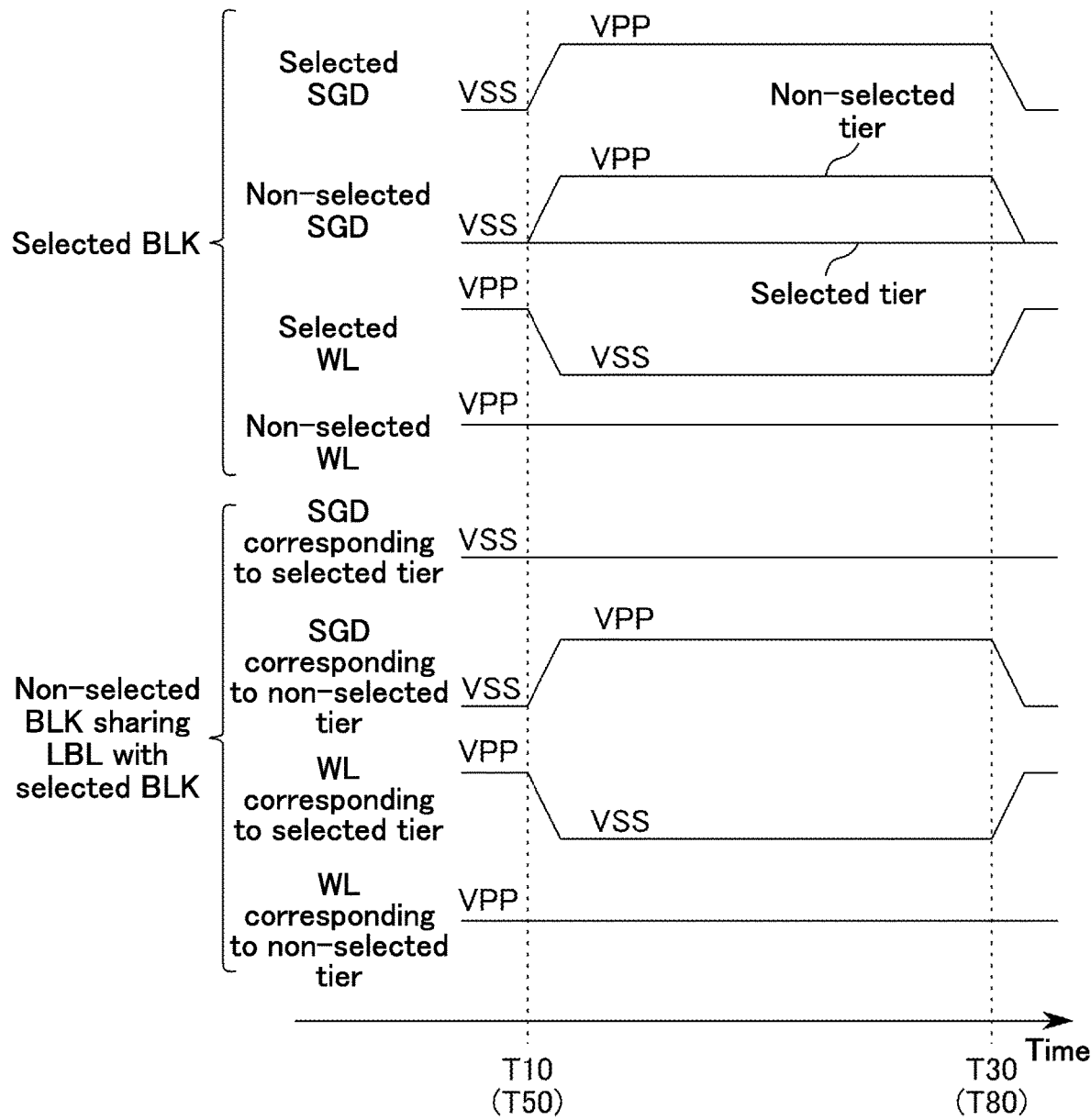
FIG. 23 is a timing chart for explaining a second example of a write operation and a read operation in a first mode in the memory device of the third embodiment.

FIG. 23 is a timing chart for explaining the second example of a write operation and a read operation first-mode in the memory device of the third embodiment and corresponds to FIG. 21 of the first example.

As shown in FIG. 23, at time T10 (or time T50), the row decoder 120 applies voltages to the select gate lines SGD and the word lines WL to perform a write operation or a read operation in a first mode. Since the control on the select gate lines SGD is the same as that in the first example, the descriptions are omitted.

The row decoder 120 applies the voltage VSS to the selected word line WL in the selected block BLK and all word lines WL in the non-selected block BLK in the selected tier. The row decoder 120 continuously applies the voltage VPP to the non-selected word lines WL in the selected block BLK and all word lines WL in the non-selected block BLK in the non-selected tier.

At time T30 (or time T80), the row decoder 120 returns the voltages of the select gate lines SGD and the word lines WL to their standby states.

Thus, the operation in the second example is finished.

Figure 24:
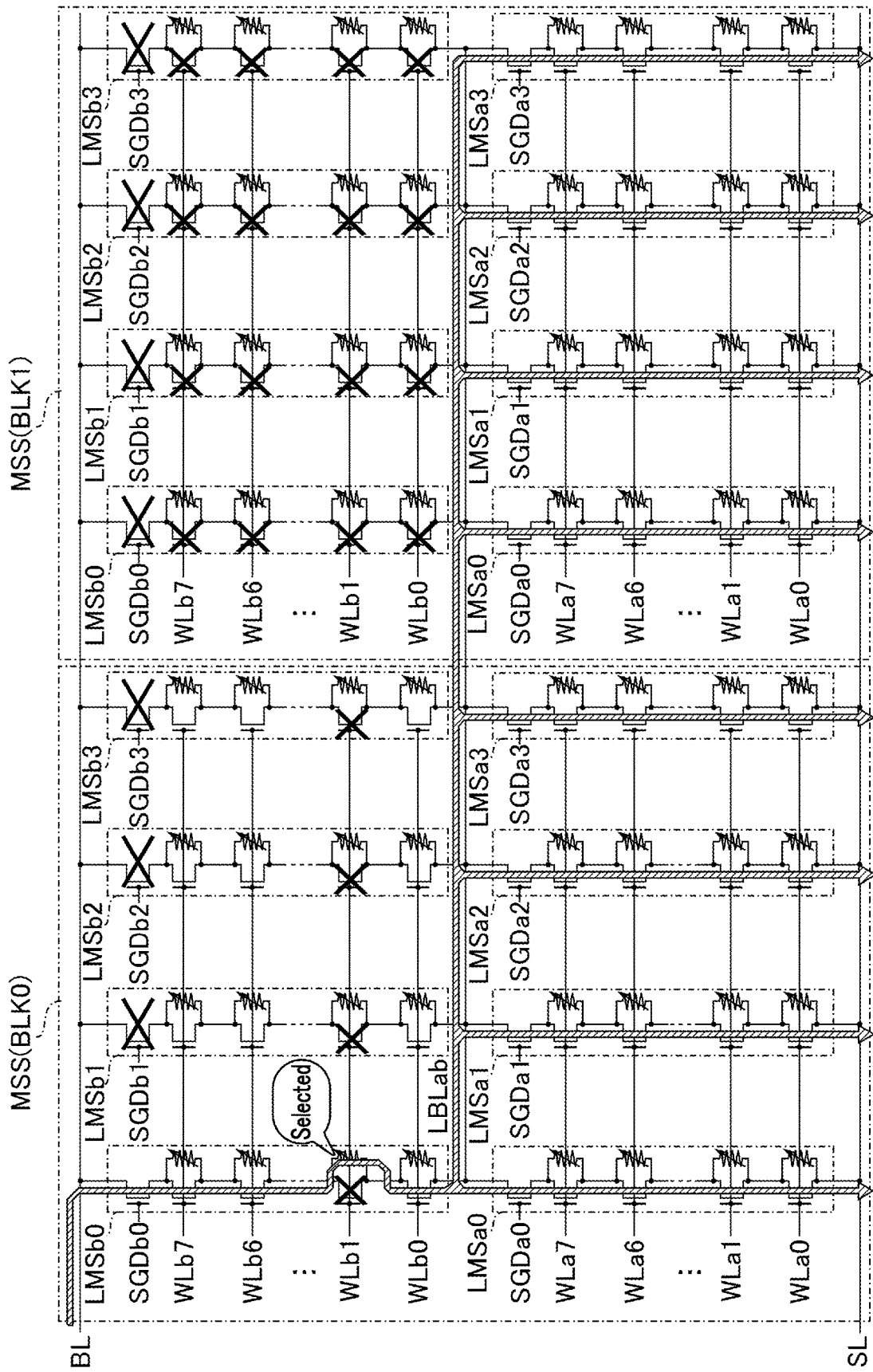
FIG. 24 is a schematic view for explaining a current path of the second example of a write operation and a read operation in a first mode in the memory device of the third embodiment.

FIG. 24 is a schematic diagram showing a specific example of a current path formed in the operation based on the second example and corresponds to FIG. 22 of the first example.

As shown in FIG. 24, in the selected tier, only the local memory string LMSb0 in the block BLK0 that includes the selected memory cell MCb1 serves as a current path. In the non-selected tier, on the other hand, the local memory strings LMSa0 through LMSa3 in each of the blocks ELKO and BLK1 serve as current paths. Similarly to the first example, it is thereby possible to make the local memory strings LMS in the non-selected tier in the non-selected block BLK contribute to the suppression of increase in parasitic resistance.

In two blocks ELKO and BLK1 coupled by the local bit line LBLab, the control of the word lines WL in one block ELK is performed independently from the other block.

Specifically, in the non-selected block ELK, all switch elements SW belonging to the selected tier are in an off state. For this reason, in the second example, it is possible to achieve a stronger cut-off from a current path in a selected tier in a non-selected block BL, thereby suppressing current leakage.

Third Example

Next, the third example will be described. The third example is, similarly to the second example, a case where different voltages are applied to corresponding word lines WL between the selected block ELK and the non-selected block ELK. Specifically, in the third example, all switch elements SW in the non-selected block BLK are controlled to be in an on state.

FIG. 25 is a timing chart for explaining the third example of a write operation and a read operation first-mode in the memory device of the third embodiment and corresponds to FIG. 23 of the second example.

As shown in FIG. 25, at time T10 (or time T50), the row decoder 120 applies voltages to the select gate lines SGD and the word lines WL to perform a write operation or a read operation in a first mode. Since the control on the select gate lines SGD is the same as that in the second example, the descriptions are omitted.

The row decoder 120 applies the voltage VSS to the selected word line WL in the selected block BLK. The row decoder 120 continuously applies the voltage VPP to the non-selected word lines WL in the selected block BLK and all word lines WL in the non-selected block BLK.

At time T30 (or time T80), the row decoder 120 returns the voltages of the select gate lines SGD and the word lines WL to their standby states.

Thus, the operation in the third example is finished.

Figure 26:
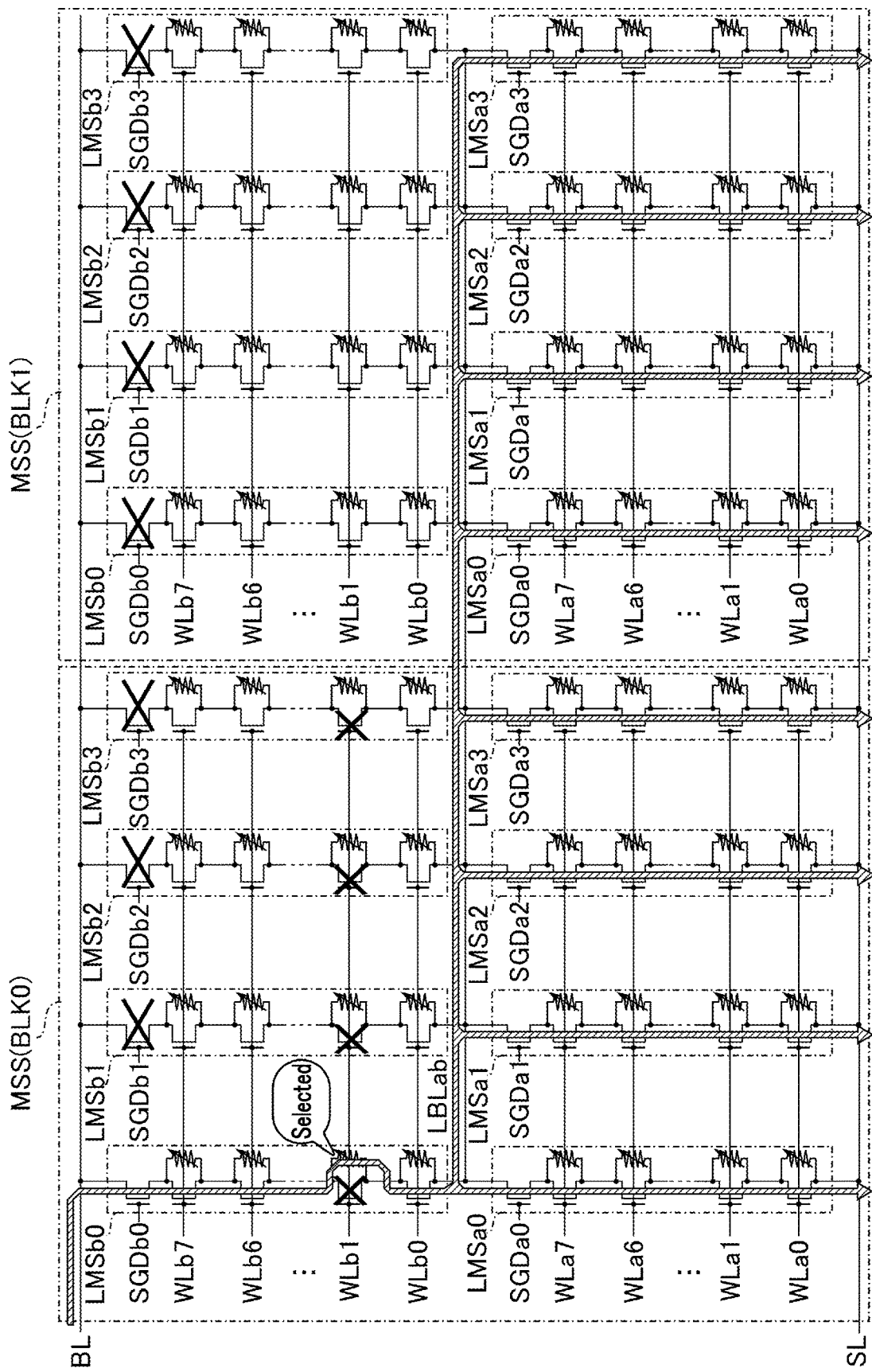
FIG. 26 is a schematic diagram for explaining a current path of the third example of a write operation and a in a first mode read operation in the memory device of the third embodiment.

FIG. 26 is a schematic diagram showing a specific example of a current path formed in the operation based on the third example and corresponds to FIG. 24 of the second example.

As shown in FIG. 26, in the selected tier, only the local memory string LMSb0 in the block BLK0 that includes the selected memory cell MCb1 serves as a current path. In the non-selected tier, on the other hand, the local memory strings LMSa0 through LMSa3 in each of the blocks BLK0 and BLK1 serve as current paths. Similarly to the first and second examples, it is thereby possible to make the local memory strings LMS in the non-selected tier in the non-selected block BLK contribute to the suppression of increase in parasitic resistance.

In two blocks BLK0 and BLK1 coupled by a local bit line LBLab, the control of the word lines WL in one block BLK is performed independently from the other block. Specifically, in the non-selected block BLK, all switch elements SW are in an on state. As described above, in a standby state, the switch elements SW are turned to an on state (in other words, the voltage VPP is applied to the word lines WL). For this reason, in the third example, a write operation and a first-mode read operation can be performed without changing the standby state of all word lines WL in the non-selected block BLK. Thus, it is possible to suppress an increase in the number of times the voltage in the word lines WL changes due to a write operation and a first-mode read operation and to suppress an increase in power consumption.

3.2.2 Read Operation in Second Mode

The read operation in a second mode in the memory device according to the third embodiment will be described.

Figure 27:
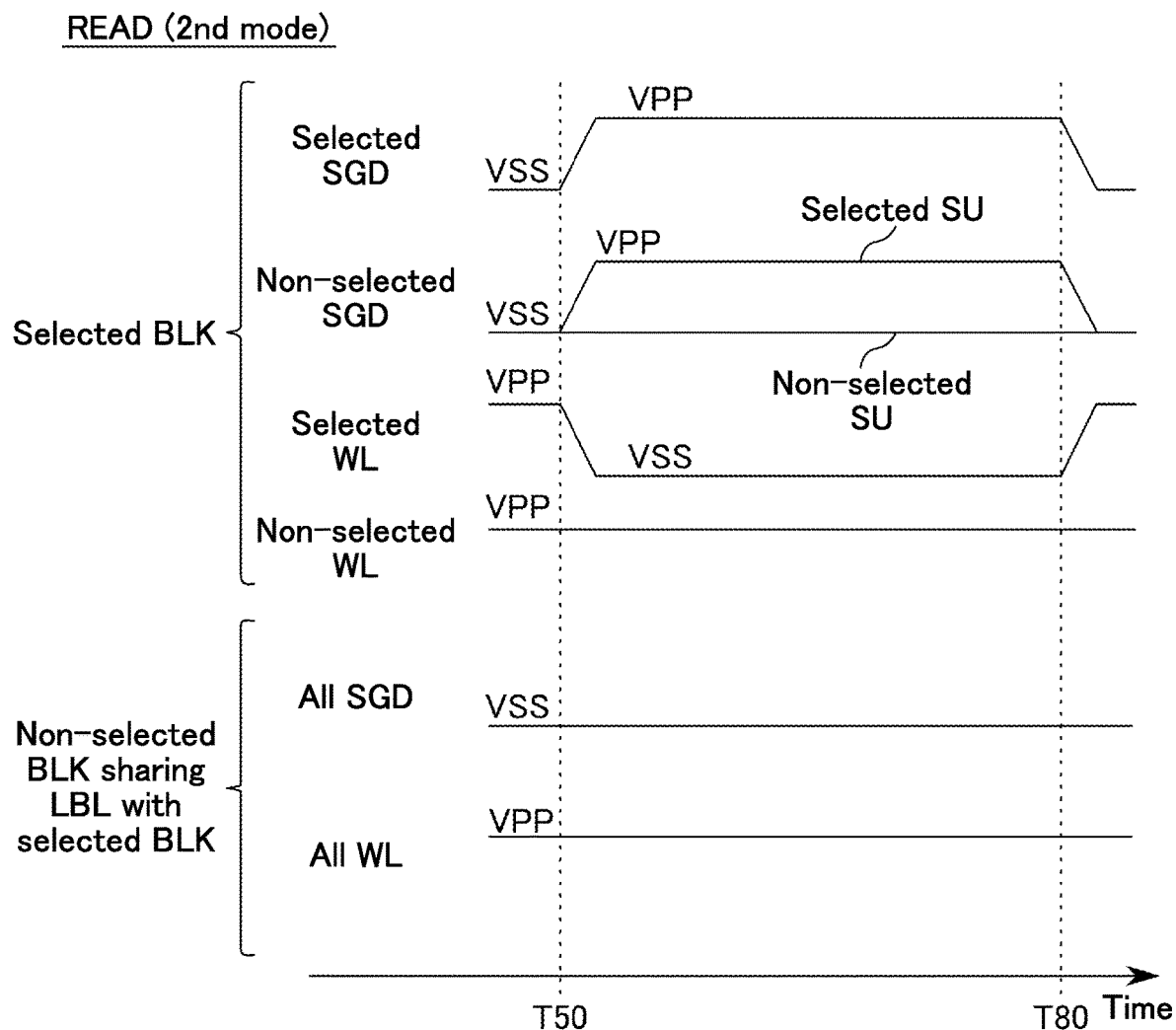
FIG. 27 is a timing chart for explaining a read operation in a second mode in the memory device of the third embodiment.

FIG. 27 is a timing chart for explaining a read operation in a second mode in the memory device of the third embodiment.

As shown in FIG. 27, at time T50, the row decoder 120 applies voltages to the select gate lines SGD and the word lines WL to perform a read operation in a second mode.

Specifically, the row decoder 120 applies the voltage VPP to the selected select gate line SGD and the non-selected select gate lines SGD belonging to the selected string unit SU in the selected block BLK, and turns the corresponding select transistors STD to an on state. The row decoder 120 continuously applies the voltage VSS to all non-selected select gate lines SGD belonging to the non-selected string units SU in the selected block BLK and all select gate lines SGD in the non-selected block BLK, and turns the corresponding select transistors STD to an off state. Thus, in the memory string sets MSS coupled to the selected bit line BL, one local memory string LMS is turned to be conductive in each the selected tier and the non-selected tier.

Furthermore, the row decoder 120 applies the voltage VSS to the selected word line WL in the selected block BLK. The row decoder 120 continuously applies the voltage VPP to the non-selected word lines WL in the selected block BLK and all word lines WL in the non-selected block BLK.

At time T80, the row decoder 120 returns the voltages of the select gate lines SGD and the word lines WL to their standby state.

Thus, the second-mode read operation is finished.

Figure 28:
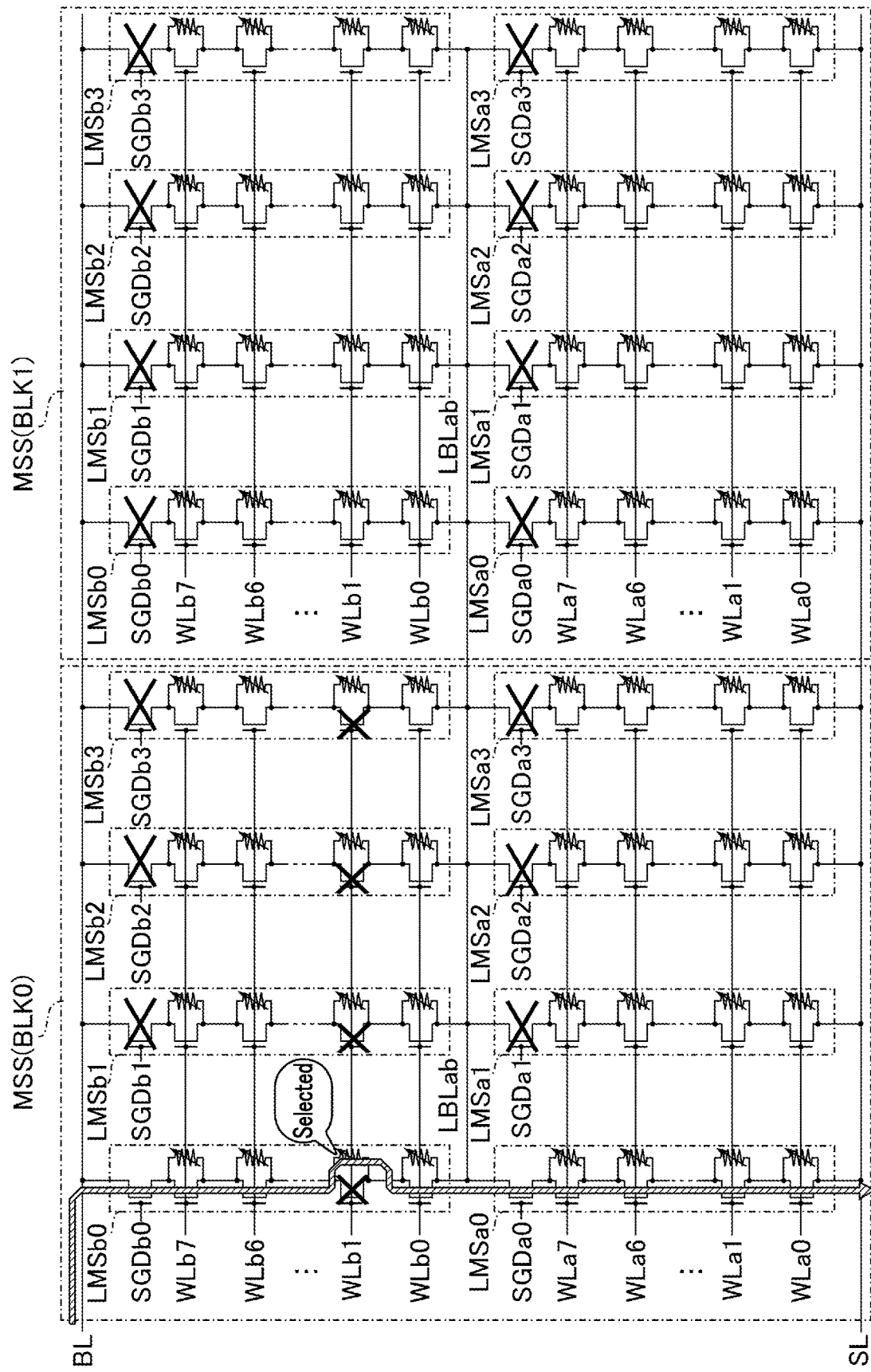
FIG. 28 is a schematic view for explaining a current path in the memory device of the third embodiment when a second-mode read operation is performed.

FIG. 28 is a schematic diagram showing a specific example of a current path formed in the read operation in the second mode.

As shown in FIG. 28, in the selected tier, only the local memory string LMSb0 in the block BLK0 that includes the selected memory cell MCb1 serves as a current path. Similarly, in the non-selected tier, only the local memory strings LMSa0 of the block BLK0 serves as a current path. It is thereby possible to stop a current flowing into the non-selected block BLK. It is thus possible to reduce an amount of current in a read operation and to suppress power consumption.

3.3 Advantageous Effects of Third Embodiment

According to the third embodiment, the local bit line LBLab is coupled in common to a plurality of blocks BLK.

In a write operation and a read operation in the first mode, the row decoder 120 turns only a local memory cell string LMS that includes a selected memory cell MC to be conductive in a selected tier; in a non-selected tier, on the other hand, all local memory cell strings LMS included in multiple blocks BLK coupled to a local bit line LBLab are turned to be conductive. It is thereby possible to reduce parasitic resistance caused in a current path in a non-selected tier compared to a case of a current flowing in only a single block BLK.

In the foregoing examples, a local bit line LBLab is shared between two blocks BLK; however, the embodiment is not limited to those examples. For example, the local bit line LBLab can be shared between three or more blocks BLK.

4. Modifications, Etc.

The first to third embodiments can be modified in various manners.

4.1 First Modification

In the first to third embodiments, the select transistor STDa in the tier A does not include a resistance change film 36; however, the embodiments are not limited to this case. For example, the select transistor STDa in the tier A can include a resistance change film 36.

Figure 29:
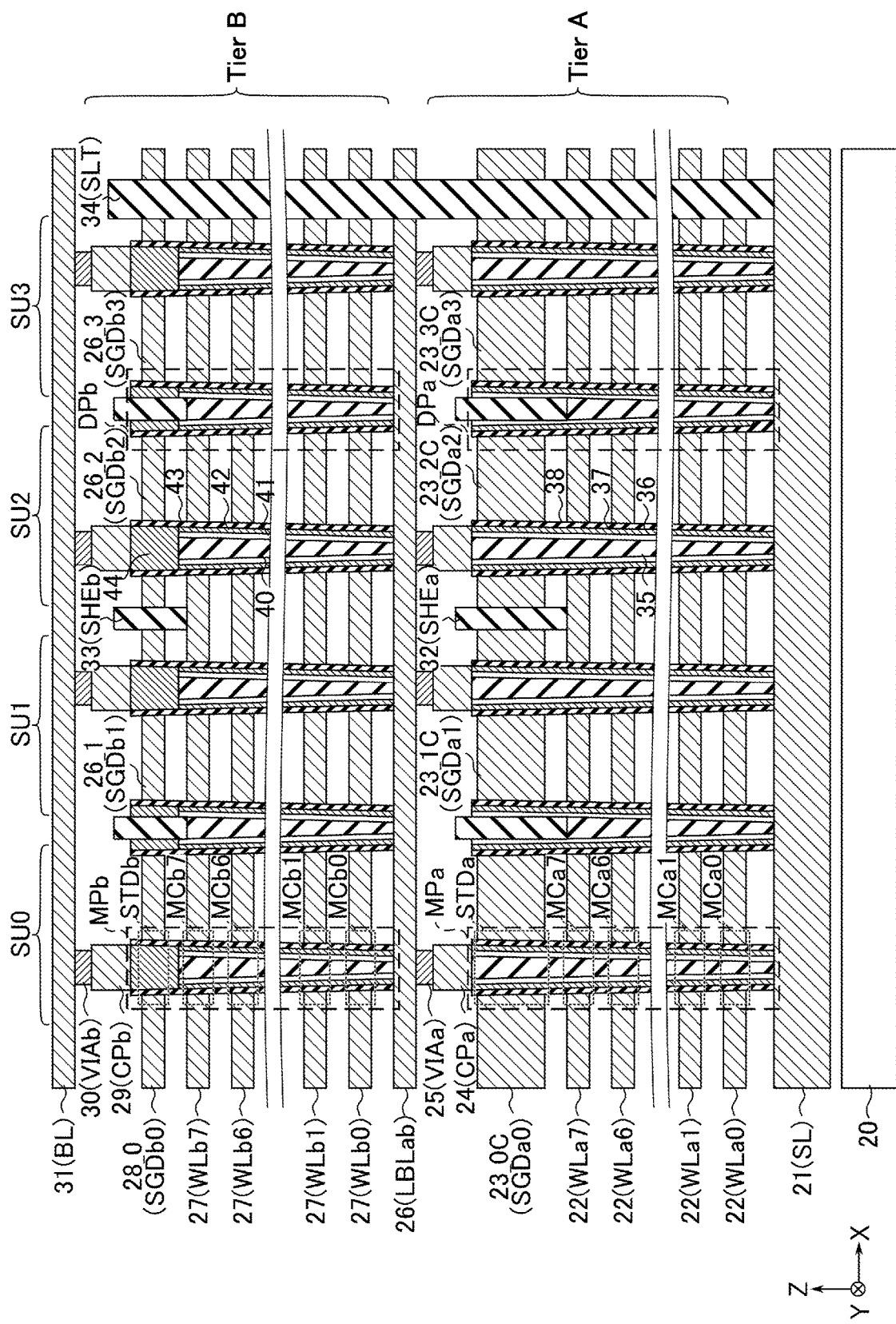
FIG. 29 is a circuit diagram for explaining a configuration of a memory cell array of a memory device according to a first modification.

FIGS. 29 and 30 are cross-sectional diagrams for explaining a configuration of a memory cell array of the memory device according to a first modification, and corresponds to FIG. 6 of the first embodiment. FIGS. 29 and 30 show different examples of the first modification.

In cases of both FIGS. 29 and 30, the memory pillars MPa do not include the semiconductor portion 39 and the upper ends thereof are located above the conductive layer 23C or 23D, for example. Specifically, the upper ends of the core film 35, the resistance change film 36, the semiconductor film 37, and the insulating film 38 are located above the conductive layer 23C or 23D.

Such a structure may be caused by restrictions on manufacturing processes, for example. This leads the select transistor STDa to include a resistance change film 36; as a result, the performance in cutting off a current may be degraded compared to a select transistor STDa not including a resistance change film 36.

In contrast, in the example shown in FIG. 29, a conductive layer 23C (23_0C through 23_3C) used as the select gate line SGDa is provided above the uppermost conductive layer 22, with an insulating layer (not shown) being interposed therebetween. The conductive layer 23C is provided in such a manner that a film thickness thereof along the Z axis is thicker than that of the other conductive layers (such as the conductive layers 22, 27, and 28).

In the example shown in FIG. 30, a plurality of conductive layers 23D (23_0D through 23_3D) used as select gate lines SGDa are provided above the uppermost conductive layer 22, with an insulating layer (not shown) being interposed therebetween. Each of the conductive layers 23D has a film thickness similar to that of the other conductive layers (for example, the conductive layers 22, 27, and 28), for example.

It is thereby possible to increase the effective gate length of the select transistor STDa. Thus, even in a case in which the select transistor STDa has a resistance change film 36, it is possible to suppress the degradation of the current cutoff performance of the select transistor STDa.

4.2 Second Modification

In the foregoing first through third embodiments and the first modification, the memory pillars MPb and the dummy pillars DPb are provided so as to be in contact with the upper surface of the conductive layer 26; those embodiments are not limited to this example. For example, the memory pillars MPb may be coupled to the conductive layer 26 via contacts and vias. The dummy pillars DPb are not necessarily coupled to the conductive layer 26.

Figure 31:
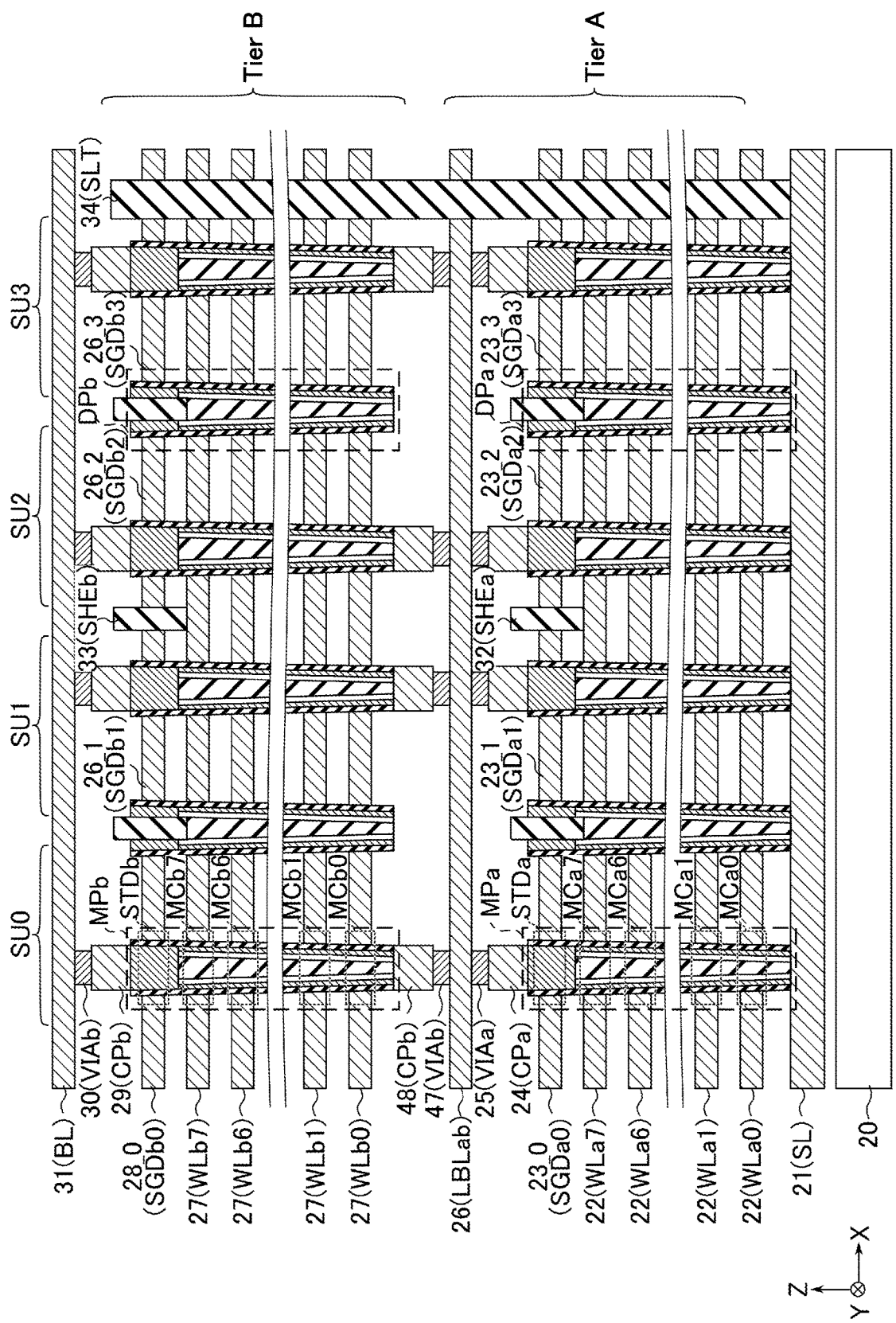
FIG. 31 is a cross-sectional diagram for explaining a configuration of a memory cell array of a memory device according to a second modification.

FIG. 31 is a cross-sectional diagram for explaining a configuration of the memory cell array of the memory device according to the second modification and corresponds to FIG. 6 of the first embodiment.

As shown in FIG. 31, of the upper surface of the conductive layer 26, multiple areas corresponding to the memory pillars MPb are provided with a conductive layer 47 used as a via VIAb. On the upper surface of the conductive layer 47, a conductive layer 48 used as a contact CPb is provided. On the upper surface of the conductive layer 48, the memory pillars MPb are provided.

According to the above-described configuration, the heights in the Z axis at which the memory pillars MPb, the word lines WLb0 through WLb7, and the select gate line SGDb are formed can be freely determined, and this makes it easy to couple the memory pillars MPb to the local bit line LBLab, which is minute. Since the dummy pillars DPb are physically separated from the local bit line LBLab, parasitic capacitance caused in the local bit line LBLab can be reduced.

4.3 Third Modification

In the foregoing first through third embodiments and the first and second modifications, two local memory cell strings LMS coupled by a single local bit line LBLab are provided along the Z axis; however, these modifications are not limited to these cases. For example, (n+1) local memory strings LMS coupled by n local bit lines LBL may be provided along the Z axis (n is an integer equal to or greater than 2).

Figure 32:
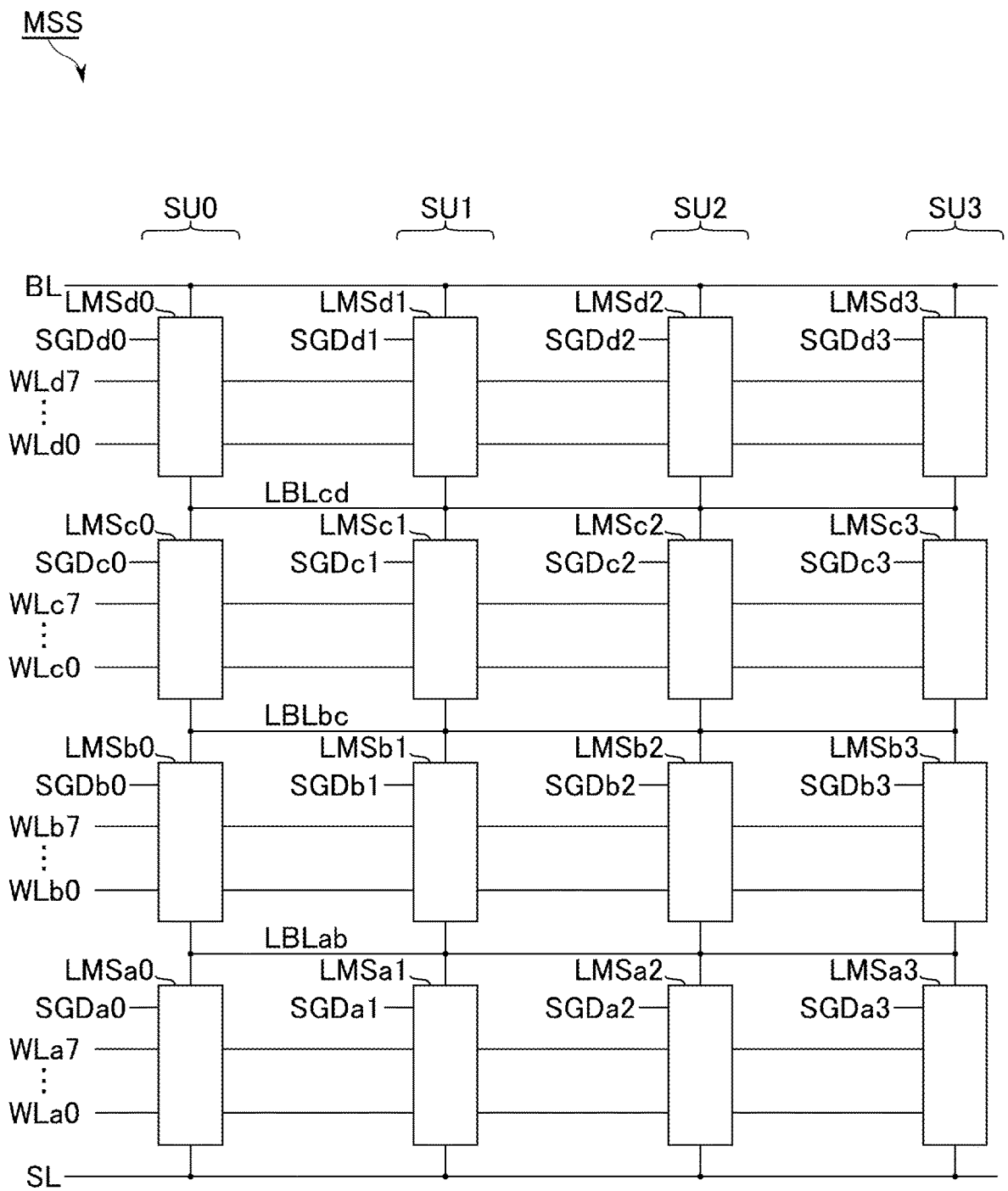
FIG. 32 is a circuit diagram for explaining a configuration of a memory string set of a memory device according to a third modification.

FIG. 32 is a circuit diagram for explaining a configuration of a memory string set of a memory device according to the third modification and corresponds to FIG. 3 of the first embodiment.

As shown in FIG. 32, the memory string set MSS includes multiple sets of local memory cell strings LMSa, LMSb, LMSc, and LMSd each associated with a bit line BL. Each of the string units SU0 through SU3 includes a plurality of local memory strings LMSa0, LMSb0, LMSc0, and LMSd0 through LMSa3, LMSb3, LMSc3, and LMSd3. Since the configuration of the local memory strings LMSc and LMSd is the same as that of the local memory cell strings LMSa and LMSb, the descriptions are omitted.

In the same memory string set MSS, the first ends of the local memory strings LMSd0, LMSd1, LMSd2, and LMSd3 are coupled in common to a corresponding bit line BL. The second ends of the local memory strings LMSd0, LMSd1, LMSd2. LMSd3 and the first ends of the local memory strings LMSc0, LMSc1, LMSc2, and LMSc3 are coupled in common to a local bit line LBLcd. The second ends of the local memory strings LMSc0, LMSc1, LMSc2, LMSc3 and the first ends of the local memory strings LMSb0, LMSb1, LMSb2, and LMSb3 are coupled in common to a local bit line LBLbc. The second ends of the local memory strings LMSb0, LMSb1, LMSb2, LMSb3 and the first ends of the local memory strings LMSa0, LMSa1, LMSa2, and LMSa3 are coupled in common to a local bit line LBLab. The second ends of the local memory strings LMSa0, LMSa1, LMSa2, and LMSa3 are coupled in common to a source line SL.

FIG. 33 is a cross-sectional diagram for explaining a configuration of the memory cell array of the memory device according to the third modification and corresponds to FIG. 7 of the first embodiment.

As shown in FIG. 33, a conductive layer 51 is provided above the conductive layer 28, with conductive layers 29 and 30 interposed therebetween. For example, the conductive layer 51 is used as a local bit line LBLbc.

Above the conductive layer 51, a stacked structure consisting of insulating layers (not shown) and conductive layers 52 that are alternately stacked is provided. For example, the conductive layers 52 are used as word lines WLc0 to WLc7 in the order from the side of the semiconductor substrate 20.

The conductive layer 53 is provided above the uppermost conductive layer 52, with an insulating layer (not shown) interposed therebetween. The conductive layer 53 is used as a select gate line SGDc.

The conductive layers 52 and 53 are formed in a shape of a plate extending along the XY plane, for example.

A conductive layer 56 is provided above the conductive layer 53, with conductive layers 54 and 55 interposed therebetween. For example, the conductive layer 56 is used as a local bit line LBLcd.

Above the conductive layer 56, a stacked structure consisting of insulating layers (not shown) and conductive layers 57 that are alternately stacked is provided. For example, the conductive layers 57 are used as word lines WLd0 to WLd7 in the order from the side of the semiconductor substrate 20.

The conductive layer 58 is provided above the uppermost conductive layer 57, with an insulating layer (not shown) interposed therebetween. The conductive layer 58 is used as a select gate line SGDd.

The conductive layers 57 and 58 are formed in a shape of a plate extending along the XY plane, for example.

A conductive layer 31 used as a bit line BL is provided above the conductive layer 58, with conductive layers 59 and 60 interposed therebetween.

The memory pillars MPc and MPd extend along the Z axis, similarly to the memory pillars MPa and MPb. Since the configuration of the memory pillars MPc and MPd is the same as that of the memory pillars MPa and MPb, the descriptions are omitted.

The memory pillars MPc penetrate through the conductive layers 52 and 53, and the lower ends thereof are in contact with the conductive layer 51, and the upper ends thereof are in contact with the conductive layer 54 used as a contact CPc. On the upper surface of the conductive layer 54, a conductive layer 55 used as a via VIAc is provided. On the upper surface of the conductive layer 55, a conductive layer 56 is provided. Thus, the conductive layer 56 and the conductive layer 51 are coupled to each other by the memory pillars MPc.

The memory pillars MPd penetrate through the conductive layers 57 and 58, and the lower ends thereof are in contact with the conductive layer 56, and the upper ends thereof are in contact with the conductive layer 59 used as a contact CPd. On the upper surface of the conductive layer 59, a conductive layer 60 used as a via VIAd is provided. On the upper surface of the conductive layer 60, a conductive layer 31 is provided. Thus, the conductive layer 31 and the conductive layer 56 are coupled to each other by the memory pillars MPd.

With the above-described structure, even in the case in which the memory pillars MP are stacked in three or more tiers along the Z axis, it is possible to cause a current to flow, via a local bit line LBL, in all local memory cell strings LMS in a non-selected tier in a single memory string set MSS.

4.4 Fourth Modification

In the foregoing first through third embodiments and the first through third modifications, the local memory strings LMS coupled by a single bit line BL are provided along the Z axis only on the semiconductor substrate 20 side (the side below the bit line BL); however, those embodiments and modifications are not limited to this example. For example, the local memory cell strings LMS coupled to the same bit line BL may be provided not only on the side below the bit line BL but also the side above the bit line BL.

FIG. 34 is a circuit diagram for explaining a configuration of a memory string set of a memory device according to the third modification and corresponds to FIG. 3 of the first embodiment.

As shown in FIG. 34, a block BLK is divided into string units SU provided in a number corresponding to a sum of the number of sets of local memory strings LMSa and LMSb and the number of sets of local memory strings LMSc and LMSd included in each memory string set MSS (in the example of FIG. 34, eight string units SU0 through SU7). Each of the string units SU0 through SU3 includes the local memory strings LMSa0 and LMSb0 through LMSa3 and LMSb3, and each of the string units SU4 through SU7 includes the local memory strings LMSc0 and LMSd0 through LMSc3 and LMSd3.

The memory string set MSS includes two subsets SS (SS0 and SS1). The subset SS0 includes local memory strings LMSa0 through LMSa3 and LMSb0 through LMSb3 coupled between a bit line BL and a source line SLA. The subset SS1 includes local memory strings LMSc0 through LMSc3 and LMSd0 through LMSd3 coupled between a bit line BL and a source line SLB. The source lines SLA and SLB may be electrically coupled or electrically insulated so as to be independently controllable.

In the memory string set MSS, the first ends of the local memory strings LMSd0, LMSd1, LMSd2, and LMSd3 are coupled in common to a corresponding source line SLB. The second ends of the local memory strings LMSd0, LMSd1, LMSd2, LMSd3 and the first ends of the local memory strings LMSc0, LMSc1, LMSc2, and LMSc3 are coupled in common to a local bit line LBLcd. The second ends of the local memory strings LMSc0, LMSc1, LMSc2, LMSc3 and the first ends of the local memory strings LMSb0, LMSb1, LMSb2, and LMSb3 are coupled in common to a bit line BL. The second ends of the local memory strings LMSb0, LMSb1, LMSb2, LMSb3 and the first ends of the local memory strings LMSa0, LMSa1, LMSa2, and LMSa3 are coupled in common to a local bit line LBLab. The second ends of the local memory strings LMSa0, LMSa1, LMSa2, and LMSa3 are coupled in common to a source line SLA.

Figure 35:
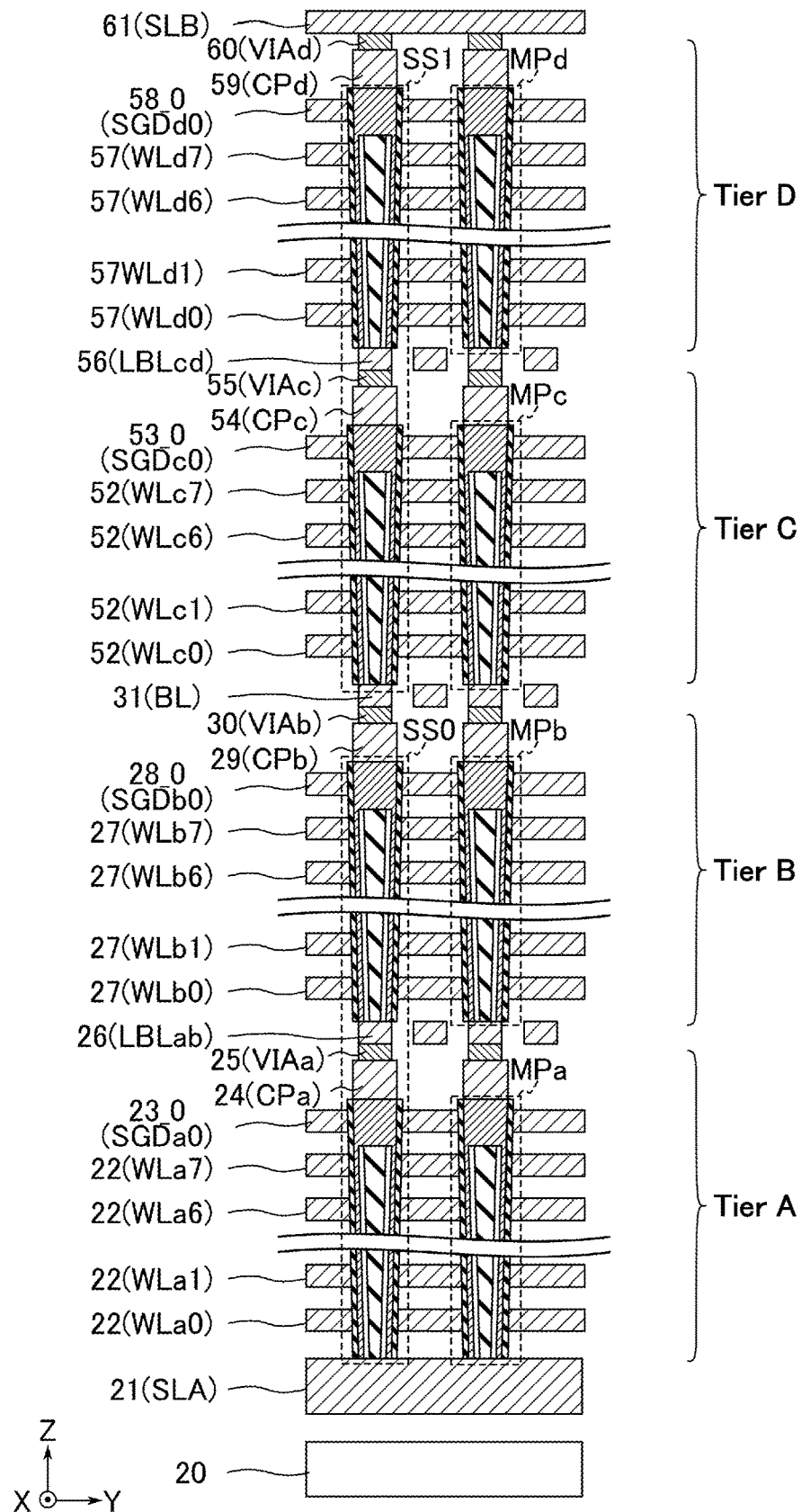
FIG. 35 is a cross-sectional diagram for explaining a configuration of a memory cell array of the memory device according to the fourth modification.

FIG. 35 is a cross-sectional diagram for explaining a configuration of the memory cell array of the memory device according to the fourth modification and corresponds to FIG. 7 of the first embodiment.

As shown in FIG. 35, a stacked structure consisting of insulating layers (not shown) and conductive layers 52 that are alternately stacked is provided above the conductive layer 31. For example, the conductive layers 52 are used as word lines WLc0 to WLc7 in the order from the side of the semiconductor substrate 20.

The conductive layer 53 is provided above the uppermost conductive layer 52, with an insulating layer (not shown) interposed therebetween. The conductive layer 53 is used as a select gate line SGDc.

The conductive layers 52 and 53 are formed in a plate shape extending along the XY plane, for example.

A conductive layer 56 is provided above the conductive layer 53, with conductive layers 54 and 55 interposed therebetween. For example, the conductive layer 56 is used as a local bit line LBLcd.

Above the conductive layer 56, a stacked structure consisting of insulating layers (not shown) and conductive layers 57 that are alternately stacked is provided. For example, the conductive layers 57 are used as word lines WLd0 to WLd7 in the order from the side of the semiconductor substrate 20.

The conductive layer 58 is provided above the uppermost conductive layer 57, with an insulating layer (not shown) interposed therebetween. The conductive layer 58 is used as a select gate line SGDd.

A conductive layer 61 used as a bit line SLB is provided above the conductive layer 58, with conductive layers 59 and 60 interposed therebetween.

The conductive layers 57, 58 and 61 are formed in a plate shape extending along the XY plane, for example.

The memory pillars MPc and MPd extend along the Z axis, similarly to the memory pillars MPa and MPb. Since the configuration of the memory pillars MPc and MPd is the same as that of the memory pillars MPa and MPb, the descriptions are omitted.

The memory pillars MPc penetrate through the conductive layers 52 and 53, and the lower ends thereof are in contact with the conductive layer 31, and the upper ends thereof are in contact with the conductive layer 54 used as a contact CPc. On the upper surface of the conductive layer 54, a conductive layer 55 used as a via VIAc is provided. On the upper surface of the conductive layer 55, a conductive layer 56 is provided. Thus, the conductive layer 56 and the conductive layer 31 are coupled to each other by the memory pillars MPc.

The memory pillars MPd penetrate through the conductive layers 57 and 58, and the lower ends thereof are in contact with the conductive layer 56, and the upper ends thereof are in contact with the conductive layer 59 used as a contact CPd. On the upper surface of the conductive layer 59, a conductive layer 60 used as a via VIAd is provided. On the upper surface of the conductive layer 60, a conductive layer 61 is provided. Thus, the conductive layer 61 and the conductive layer 56 are coupled to each other by the memory pillars MPd.

As described above, with the configuration wherein a bit line BL is provided between two source lines SLA and SLB provided at different locations along the Z axis, the local memory strings LMS coupled to the same bit line BL may be provided on both sides below and above the bit line BL.

FIG. 36 is a timing chart for explaining a write operation and a read operation in a first mode in the memory device of the fourth modification and corresponds to FIG. 21, etc. of the third embodiment.

As shown in FIG. 36, at time T10 (or time T50), the row decoder 120 applies a voltage to the select gate lines SGD and the word lines WL to perform a write operation or a read operation in a first mode.

Specifically, the row decoder 120 applies the voltage VPP to a selected select gate line SGD and all non-selected select gate lines SGD belonging to the non-selected tier in the selected subset SS, and turns the corresponding select transistors STD to an on state. The row decoder 120 maintains the supply of the voltage VSS to all non-selected select gate lines SGD belonging to the selected tier in the selected subset SS and all non-selected select gate lines SGD in the non-selected subset SS, and turns the corresponding select transistors STD to an off state.

Furthermore, the row decoder 120 applies a voltage VSS to the selected word line WL and subsequently applies the voltage VPP to all non-selected word lines WL.

Thus, in the memory string sets MSS coupled to the selected bit line BL, it is possible to cause a current to flow in all local memory cell strings LMS belonging to the non-selected tier in the selected subset SS, while the current path to the non-selected subset SS is cut off.

FIG. 37 is a timing chart for explaining a read operation in a second mode in the memory device of the fourth modification and corresponds to FIG. 27 of the third embodiment.

As shown in FIG. 37, at time T50, the row decoder 120 applies voltages to the select gate lines SGD and the word lines WL to perform a read operation in a first mode.

Specifically, the row decoder 120 applies the voltage VPP to the selected gate line SGD and the non-selected select gate lines SGD belonging to the selected string unit SU in the selected subset SS, and maintains the supply of the voltage VSS to the rest of the non-selected select gate lines SGD. The row decoder 120 applies the voltage VSS to the selected word line WL and subsequently applies the voltage VPP to all non-selected word lines WL.

Thus, in the memory string sets MSS coupled to the selected bit line BL, it is possible to cause a current to flow in only one local memory cell string LMS in the non-selected tier in the selected subset SS, while the current path to the non-selected subset SS is cut off.

4.5 Fifth Modification

In the fourth modification described above, the conductive layers 21 and 61 that function as the source lines SLA and SLB respectively are formed in a shape of a plate extending on the XY plane; however, the modification is not limited to this example. For example, the film thickness of the conductive layer 21 and the conductive layer 61 may differ between the area coupled to the memory pillars MP and the area between the blocks BLK. Hereinafter, the differences from the fourth modification will be described.

Figure 38:
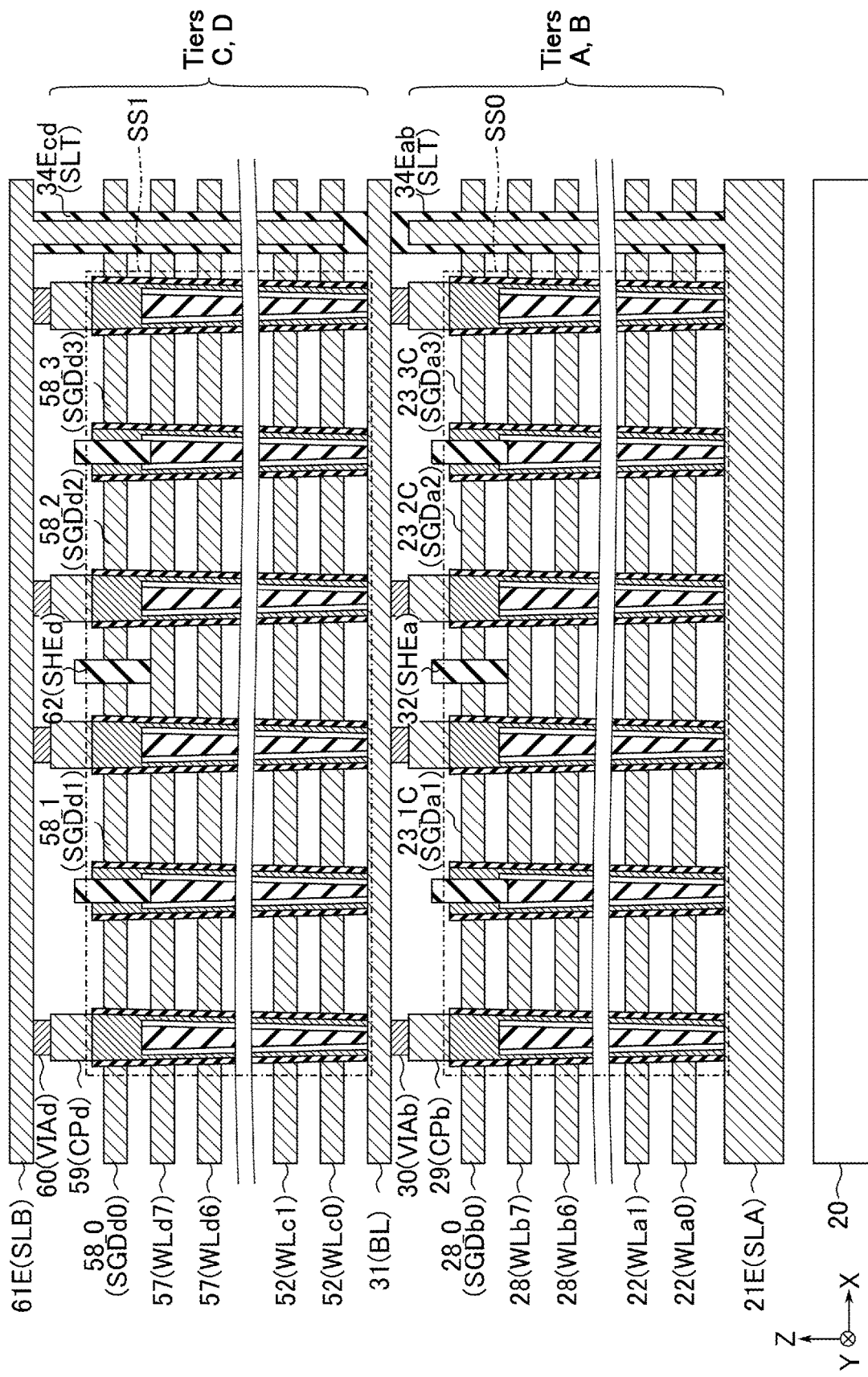
FIG. 38 is a cross-sectional diagram for explaining a configuration of a memory cell array of a memory device according to a fifth modification.

FIG. 38 is a cross-sectional view showing the configuration of the memory cell array of the memory device according to the fifth modification.

As shown in FIG. 38, the film thickness of the conductive layer 21E is larger in the region between the blocks BLK than in the region coupled to the memory pillars MPa. Specifically, for example, the upper end of the conductive layer 21E in the region between the blocks BLK may be located below the conductive layer 31 and above at least one of the conductive layers 22 through 28. In the region between the blocks BLK, in order to prevent a contact between the conductive layer 21E and the conductive layers 22 through 28, the conductive layer 21E may be located inside the insulating layer 34Eab used as the slit SLT in the subset SS0.

The film thickness of the conductive layer 61E may be larger in the region between the blocks BLK than in the region coupled to the memory pillars MPd. Specifically, for example, the lower end of the conductive layer 61E in the region between the blocks BLK may be located above the conductive layer 31 and below at least one of the conductive layers 52 through 58. In the region between the blocks BLK, in order to prevent a contact between the conductive layer 61E and the conductive layers 52 through 58, the conductive layer 61E may be located inside the insulating layer 34Ecd used as the slit SLT in the subset SS1.

With the above-described configuration, it is possible to increase the cross sectional areas of the source lines SLA and SLB. It is thus possible to suppress the increase of resistance in the source lines SLA and SLB.

5. Fourth Embodiment

Next, a memory device according to the fourth embodiment will be described. The fourth embodiment differs from the first modification mainly in that the stacking of the memory pillars MPa and the memory pillars MPb are formed at the same time (in the same step). Hereinafter, the same configurations and operations as those of the first modification will be omitted, and configurations, manufacturing methods, and operations differing from those of the first modification will mainly be described.

5.1 Configuration

Figure 39:
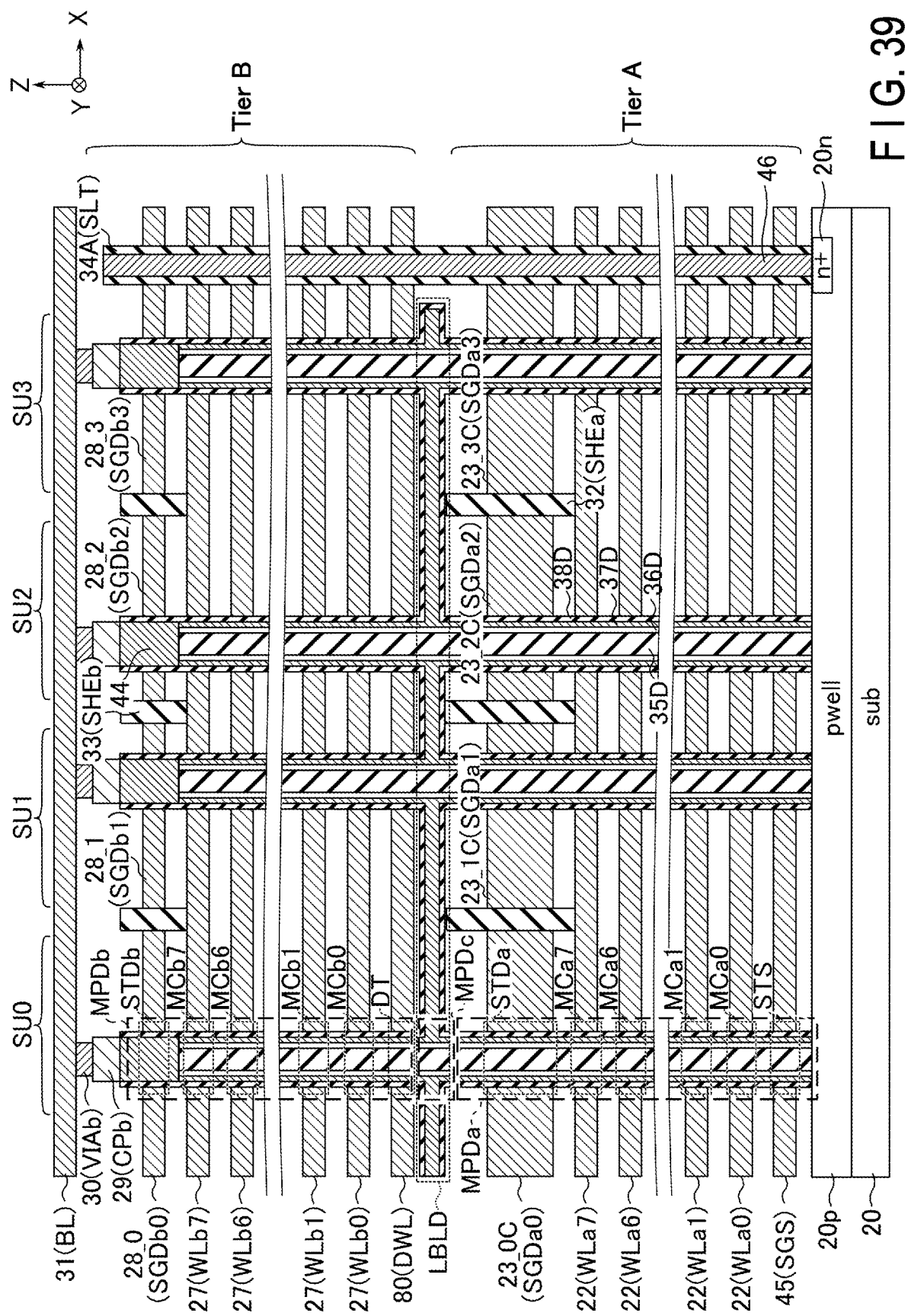
FIG. 39 is a cross-sectional diagram for explaining a memory cell array of a memory device according to Configuration Example A of a fourth embodiment.
Figure 40:
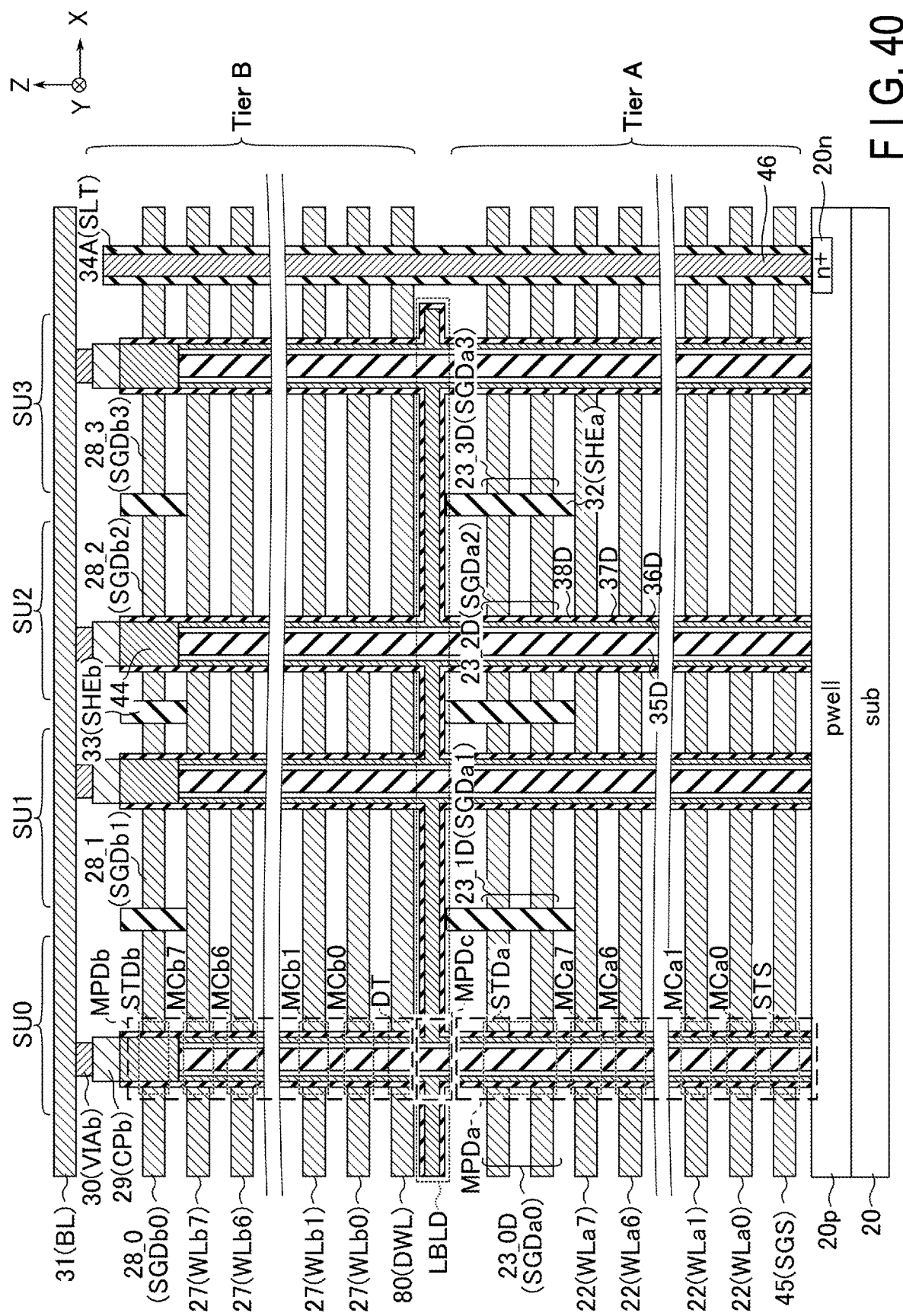
FIG. 40 is a cross-sectional diagram for explaining a cross-sectional structure of a memory cell array of the memory device according to Configuration Example B of the fourth embodiment.

FIGS. 39 and 40 each show an example of a cross-sectional structure of the memory cell array of the memory device in the fourth embodiment. FIGS. 39 and 40 show the cross sections of the same area as those shown in FIGS. 29 and 30 of the first modification. In FIGS. 39 and 40, insulating layers may be omitted for improved visibility or for other reasons. The configuration shown in FIGS. 39 and 40 may be referred to as "Configuration Example A" and "Configuration Example B" of the fourth embodiment.

In Configuration Example A of the fourth embodiment (FIG. 39), similarly to FIG. 29, the select transistor STDa of the tier A includes a resistance change film 36, and the thickness of the conductive layer 23C along the Z axis is thicker than that of, for example, the other conductive layers (e.g., the conductive layer 22). In Configuration Example B of the fourth embodiment (FIG. 40), similarly to FIG. 30, the select transistor STDa of the tier A includes a resistance change film 36, and the conductive layer 23D is constituted by a plurality of conductive layers. Configuration Example B is the same as Configuration Example A except that the conductive layer 23D is constituted by a plurality of conductive layers.

In each of Configuration Example A and Configuration Example B, the memory cell array 110 of the fourth embodiment differs from that of the first modification (FIGS. 29 and 30) in the structures of the local bit line LBLab. To distinguish from the local bit line LBLab in the first modification, the local bit lines in the fourth embodiment may be called "local bit line LBLD" hereinafter.

The memory cell array 110 according to the fourth embodiment differs from that of the first modification in the structures of the memory pillars MP. To distinguish from the memory pillars MP in the first modification, the memory pillars in the fourth embodiment may be called "memory pillars MPD" hereinafter. Details of the local bit lines LBLD and the memory pillars MPD will be described below.

In Configuration Example A and Configuration Example B, the structure relating to the slits SLT and the source lines SL is based on an example in which the same structure as the second embodiment is adopted. Specifically, a p-type well region 20$p$ is formed above the semiconductor substrate 20. The area between the p-type well region 20$p$ and the conductive layer 22 includes a conductive layer 45 that functions as a select gate line SGS.

In the p-type well region 20p, an n-type impurity diffusion region 20n is formed in the area that overlaps the slit SLT in a plan view. On the upper surface of the n-type impurity diffusion region 20n, a conductive layer 46 used as a contact of the source line SL is formed. The upper end of the conductive layer 46 is located above the conductive layer 28, for example. It is thereby possible to apply a potential of a source line SL arranged above the memory cell array 110 to one end of the select transistor STS, via the conductive layer 46, the n-type impurity diffusion region 20n, and the p-type well region 20p. The side surface of the conductive layer 46 is covered by, for example, an insulating layer 34A used as a slit SLT. The conductive layer 46 is thereby insulated from the conductive layers 22 through 28 and 45. The structure relating to the slits SLT and the source lines SL in the fourth embodiment may have the same structure as the first embodiment.

The structure of the local bit line LBLD in the fourth embodiment is described below. The local bit line LBLD and the memory pillars MPD are provided, intersecting each other. The local bit line LBLD is formed in a line extending along the X-axis, similarly to the local bit line LBLab in the first embodiment. In areas not shown in FIGS. 39 and 40, a plurality of the local bit lines LBLD are aligned along the Y axis. The local bit line LBLD is formed between the conductive layer 23_C and the conductive layer 27. The local bit line LBLD is constituted by multiple layers including insulating layers and conductive layers, for example. Details of the local bit line LBLD will be described later.

The memory cell array 110 in the fourth embodiment includes a conductive layer 80 between the local bit line LBLD and the conductive layer 27 as shown in FIGS. 39 and 40. The conductive layer 80 is used as a dummy word line DWL. A specific function of the dummy word lines DWL will be described later. The conductive layer 80 is formed in a plate shape extending along the XY plane, for example. The conductive layer 80 contains, for example, tungsten.

Next, the configuration of the memory pillars MPD in the fourth embodiment will be described. The memory pillars MPD are provided between the p-type well region 20p and the conductive layer 31. Specifically, the memory pillars MPD are provided, extending along the Z axis. The memory pillars MPD pass through the conductive layers 45, 22, 23, 80, 27, and 28 and are in contact with the p-type well region 20p at their bottoms.

Each memory pillar MPD includes, for example, a lower pillar MPDa, an upper pillar MPDb, and a connecting section MPDc between the lower pillar MPDa and the upper pillar MPDb.

The connecting section MPDc is provided on the lower pillar MPDa, and the upper pillar MPDb is provided on the connecting section MPDc. The connecting section MPDc connects the lower pillar MPDa and the upper pillar MPDb. In other words, in the memory pillar MPD, the portion included in the tier A is called a "lower pillar MPDa". In the memory pillar MPD, the portion included in the tier B is called an "upper pillar MPDb". In the memory pillar MPD, the portion intersecting the local bit line LBLD is called a "connecting section MPDc". Thus, the memory pillar MPD has a structure continuous between the tier A and the tier B. The connecting section MPDc is connected to the local bit line LBLD. A specific structure of the connecting section MPDc will be described later.

Each memory pillar MPD includes, for example, a core film 35D, a resistance change film 36D, a semiconductor film 37D, an insulating film 38D, and a semiconductor portion 44. Of the core film 35D, the portion included in the lower pillar MPDa, the portion included in the upper pillar MPDb, and the portion included in the connecting section MPDc will be referred to as "core film 35Da", "core film 35Db", and "core film 35Dc", respectively.

OF the resistance change film 36D, the portion included in the lower pillar MPDa, the portion included in the upper pillar MPDb, and the portion included in the connecting section MPDc will be referred to as "resistance change film 36Da", "resistance change film 36Db", and "resistance change film 36Dc", respectively.

OF the semiconductor film 37D, the portion included in the lower pillar MPDa, the portion included in the upper pillar MPDb, and the portion included in the connecting section MPDc will be referred to as "semiconductor film 37Da", "semiconductor film 37Db", and "semiconductor film 37Dc", respectively.

Of the insulating film 38D, the portion included in the lower pillar MPDa, the portion included in the upper pillar MPDb, and the portion included in the connecting section MPDc will be referred to as "insulating film 38Da", "insulating film 38Db", and "insulating film 38Dc", respectively.

The core film 35D extends along the Z direction. The upper end of the core film 35D is located above the uppermost conductive layer 27, and the lower end thereof is located below the lowermost conductive layer 45. The core film 35D includes an insulator, such as silicon oxide. The resistance change film 36D covers the side surface of the core film 35D. The upper end of the resistance change film 36D is located above the uppermost conductive layer 27, and the lower end thereof is in contact with the p-type well region 20p.

In the lower pillar MPDa, the semiconductor film 37Da covers the side surface of the resistance change film 36Da. The upper end of the semiconductor film 37Da is the upper end of the lower pillar MPDa, and the lower end thereof is in contact with the p-type well region 20p. The semiconductor film 37Da and the p-type well region 20p are electrically coupled. The insulating film 38Da covers the side surface of the semiconductor film 37Da. The upper end of the insulating film 38Da is the upper end of the lower pillar MPDa, and the lower end thereof is located below the lowermost conductive layer 45.

In the upper pillar MPDb, the semiconductor film 37Db covers the side surface of the resistance change film 36Db. The upper end of the semiconductor film 37Db is located above the uppermost conductive layer 27, and the lower end thereof is the lower end of the upper pillar MPDb. The insulating film 38Db covers the side surface of the semiconductor film 37Db. The upper end of the insulating film 38Db is located above the conductive layer 28, and the lower end thereof is the lower end of the upper pillar MPDb.

The semiconductor portion 44 covers the upper surface of the core film 35Db, the resistance change film 36Db, and the semiconductor film 37Db, and is in contact with the inner surface of the portion of the insulating film 38Db extending upward and located above the upper surfaces of the core film 35Db, the resistance change film 36Db, and the semiconductor film 37Db. The semiconductor portion 44 is electrically coupled to the semiconductor film 37Db and the resistance change film 36Db.

The conductive layer 29 that functions as a contact CPb is provided on the upper surface of the semiconductor portion 44. A conductive layer 30 that functions as a via VIAb is provided on the upper surface of the conductive layer 29. The conductive layer 30 has, for example, a diameter smaller than that of the conductive layer 29, and the upper end thereof is in contact with a single corresponding conductive layer 31 (bit line BL). The semiconductor portion 44, the conductive layer 29, and the conductive layer 30 are electrically coupled to each other.

Each memory pillar MPD has a structure in which the lower pillar MPDa and the upper pillar MPDb are connected to each other by the connecting section MPDc. For this reason, the memory pillars MPD do not have contacts CPa and vias VIAa between the lower pillars MPDa and the upper pillars MPDb, unlike the first modification.

Figure 41:
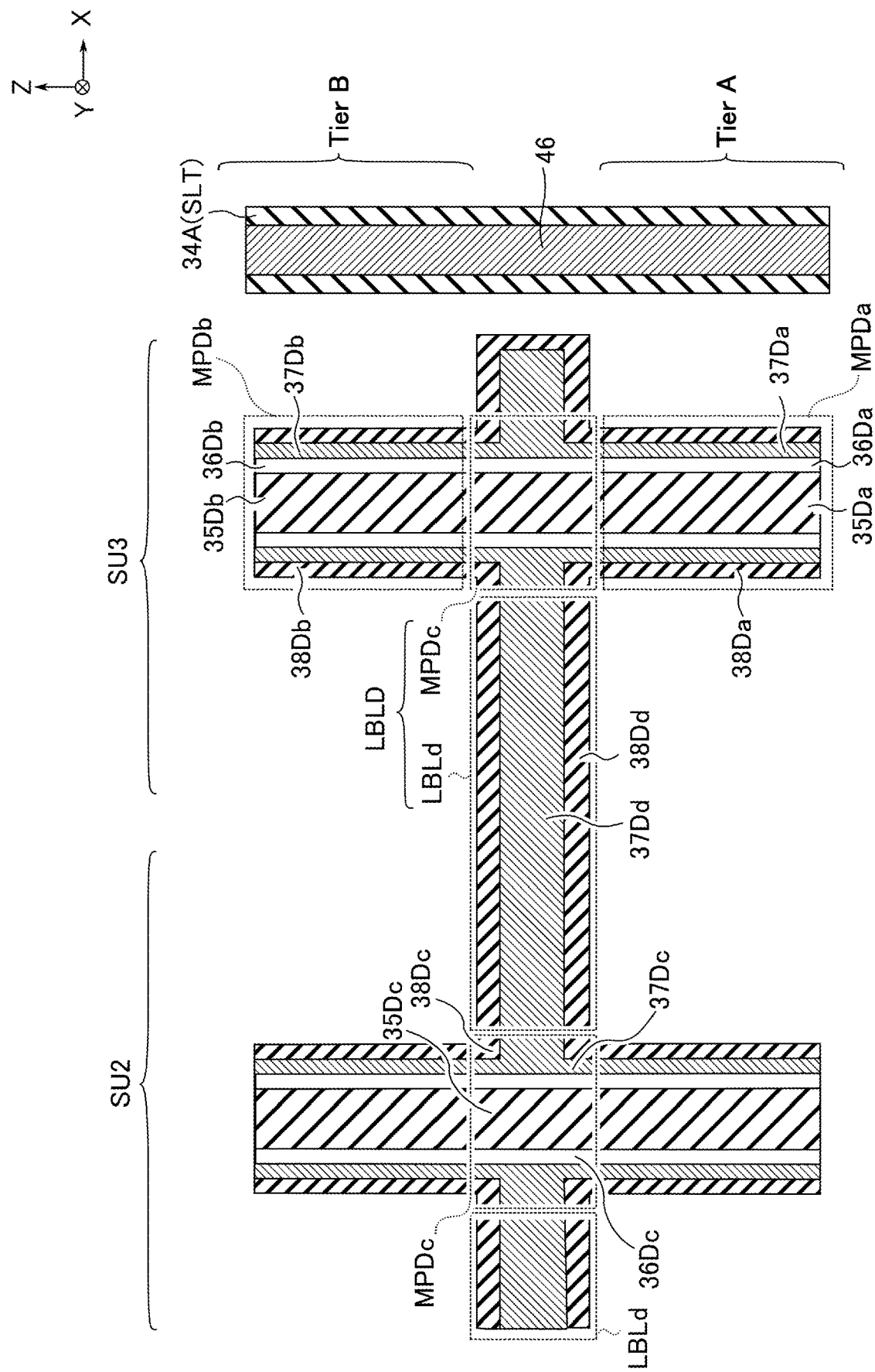
FIG. 41 is a partially enlarged diagram of FIG. 4 for explaining a cross-sectional structure of a memory cell array of the memory device according to the fourth embodiment.

The connecting section MPDc will be described later with reference to FIG. 41.

The insulating layer 32 is formed in a plate shape along the YZ plane between the lower pillars MPDa aligned along the X axis, for example. The insulating layer 32 functions as a slit SHEa that divides the conductive layer 23 along the X axis. The insulating layer 32 divides the conductive layer 23_C into the conductive layers 23_0C through 23_3C respectively corresponding to the select gate lines SGDa0 through SGDa3 in the string units SU0 through SU3, for example. The upper end of the insulating layer 32 is located between the conductive layer 23_C and the local bit line LBLD, and the lower end thereof is located between the conductive layer 23_C and the uppermost conductive layer 22. The insulating layer 32 includes an insulator such as silicon oxide.

The insulating layer 33 is formed in a plate shape along the YZ plane between the upper pillars MPDb aligned along the X axis, for example. The insulating layer 33 functions as a slit SHEb that divides the conductive layer 28 along the X axis. The insulating layer 33 divides the conductive layer 28 into the conductive layers 28_0 through 28_3 respectively corresponding to the select gate lines SGDb0 through SGDb3 in the string units SU0 through SU3, for example. The upper end of the insulating layer 33 is located between the conductive layer 28 and the conductive layer 31, and the lower end thereof is located between the conductive layer 28 and the uppermost conductive layer 27. The insulating layer 33 includes an insulator such as silicon oxide.

FIGS. 39 and 40 are based on an example in which a structure not having dummy pillars is adopted. With a structure not having dummy pillars, parasitic capacitance caused in the local bit line LBLD can be reduced. The memory cell array 110 in the fourth embodiment may have dummy pillars provided under slits SHE, similarly to the first embodiment. In this case, the dummy pillars are preferably electrically insulated from the select gate lines SGD by the slits SHE.

In the above-described structure of the memory pillars MPD, in the lower pillar MPDa, the portions intersecting with the conductive layers 22 function as memory cells MCa0 through MCa7 each having a resistance change element MR and a switch SW that are coupled in parallel. Similarly, in the upper pillars MPDb, the portions intersecting with the conductive layers 27 function as memory cells MCb0 through MCb7 each having a resistance change element MR and a switch SW that are coupled in parallel. In the lower pillar MPDa, the portions intersecting the conductive layer 45 and the conductive layer 23_C function as the select transistors STS and STDa, respectively. In the upper pillar MPDb, the portion intersecting the conductive layer 28 functions as the select transistor STDb.

The local bit line LBLD and the connecting section MPDc are described hereinafter with reference to FIG. 41. FIG. 41 is a partially enlarged view of FIGS. 39 and 40. As shown in FIG. 41, the lower pillar MPDa and the upper pillar MPDb are connected to each other by the connecting section MPDc, and the local bit line LBLD and the memory pillar MPD intersect each other at the connecting section MPDc. In other words, the local bit line LBLD and the memory pillar MPD share the connecting section MPDc.

The portion other than the connecting section MPDc in the local bit line LBLD will be referred to as an "inter-MPD local bit line LBLd". In other words, the local bit line LBLD includes inter-MPD local bit lines LBLd and connecting sections MPDc. The inter-MPD local bit lines LBLd are connected to each other via the connecting section MPDc, and each inter-MPD local bit line LBLd is connected to the lower pillars MPDa and the upper pillars MPDb via the connecting sections MPDc.

The inter-MPD local bit lines LBLd include a semiconductor film 37Dd and an insulating film 38Dd. The semiconductor film 37Dd is provided extending along the X axis at the center of the inter-MPD local bit line LBLd. For example, one end of the semiconductor film 37Dd is in contact with the connecting section MPDc of the memory pillar MPD, and the other end thereof is in contact with the connecting section MPDc of another memory pillar MPD adjacent to the memory pillar MPD along the X axis.

The insulating film 38Dd covers the semiconductor film 37Dd. One end of the insulating film 38Dd is in contact with the connecting section MPDc of the memory pillar MPD, and the other end thereof is in contact with the connecting section MPDc of another memory pillar MPD adjacent to the memory pillar MPD along the X axis.

The connecting section MPDc includes a core film 35Dc, a resistance change film 36Dc, a semiconductor film 37Dc, and an insulating film 38Dc. The semiconductor film 37Dc covers the side surface of the resistance change film 36Dc and is connected to the semiconductor film 37Dd of the inter-MPD local bit line LBLd. The semiconductor film 37Dc is interposed between the semiconductor film 37Da and the semiconductor film 37Db along the Z axis, and the semiconductor film 37Da, the semiconductor film 37Db, and the semiconductor film 37Dc are connected to each other along the Z axis. The semiconductor film 37Da, the semiconductor film 37Db, the semiconductor film 37Dc, and the semiconductor film 37Dd are electrically coupled. In the following, the semiconductor film 37Da, the semiconductor film 37Db, the semiconductor film 37Dc, and the semiconductor film 37Dd may be collectively referred to as a "semiconductor film 37D".

Thus, the semiconductor film 37Dd of the local bit line LBLD, the p-type well region 20$p$, and the conductive layer 31 are electrically coupled to each other through a set of the semiconductor film 37Da, the semiconductor film 37Db, and the semiconductor film 37Dc, or the resistance change film 36D in the memory pillar MPD.

The insulating film 38Dc covers the side surface of the semiconductor film 37Dc and is connected to the insulating film 38Dd of the inter-MPD local bit line LBLd along the X axis. The insulating film 38Dc is interposed between the insulating film 38Da and the insulating film 38Db along the Z axis, and the insulating film 38Da, the insulating film 38Db, and the insulating film 38Dc are connected to each other along the Z axis. In the following, the insulating film 38Da, the insulating film 38Db, the insulating film 38Dc, and the insulating film 38Dd may be collectively referred to as "insulating film 38D".

The configuration of the memory cell array 110 of the fourth embodiment described above is merely an example, and the memory cell array 110 may have other configurations. For example, the number of the conductive layers 22 and that of the conductive layer 27 are determined based on the number of the word lines WL. The structure of the select transistor SGDb and the select transistor STDb may have the same structure as that of the select gate line SGDa and the select transistor STDa. The upper pillar MPDb and the conductive layer 31 may be electrically coupled to each other via three or more contacts and vias, or another interconnect. Multiple types of insulators may be provided in the slit SLT. The memory cell array 110 according to the fourth embodiment may have local bit lines LBLD coupled between two or more blocks BLK as in the memory cell array 110 of the third embodiment, for example.

5.2 Manufacturing Process

5.2.1 Manufacturing Process of Configuration Example A

Hereinafter, an example of a series of manufacturing steps for formation of a stacked interconnect structure in the memory cell array 110 according to the fourth embodiment will be described. FIGS. 42 to 54 show an example of the cross-sectional structure of the memory cell array 110 during the manufacturing according to Configuration Example A of the fourth embodiment, and show the same cross section as that of FIG. 29.

As shown in FIG. 42, first a p-type well region 20p is formed on the semiconductor substrate 20. In the p-type well region 20p, an n-type impurity diffusion region 20n is formed in the area that overlaps the area where the slit SLT is planned to be formed in a plan view. The upper surface of the n-type impurity diffusion region 20n is an area where a conductive layer 46 used as a contact of the source line SL is planned to be formed.

On the upper surface of the p-type well region 20p, an insulating layer 71 and a sacrificial member 451 are stacked in that order. Thereafter, insulating layers 72 and sacrificial members 221 are alternately stacked on the upper surface of the sacrificial member 451, and a sacrificial member 231_C is formed on the upper surface of the uppermost insulating layer 72. An insulating layer 73a is formed on the uppermost sacrificial member 231_C. The sacrificial members 451, 221, and 231_C are formed in areas where the conductive layers 45, 22, and 23_C, which are to respectively function as select gate line SGS, a word line WL, and a select gate line SGDa, are planned to be formed, respectively. For example, the number of layers of the sacrificial member 221 to be formed is the same as the number of word lines WL to be stacked in a tier A. Insulating layers 71, 72, and 73a each include, for example, silicon oxide. The sacrificial members 451, 221, and 231_C include, for example, silicon nitride.

Figure 43:
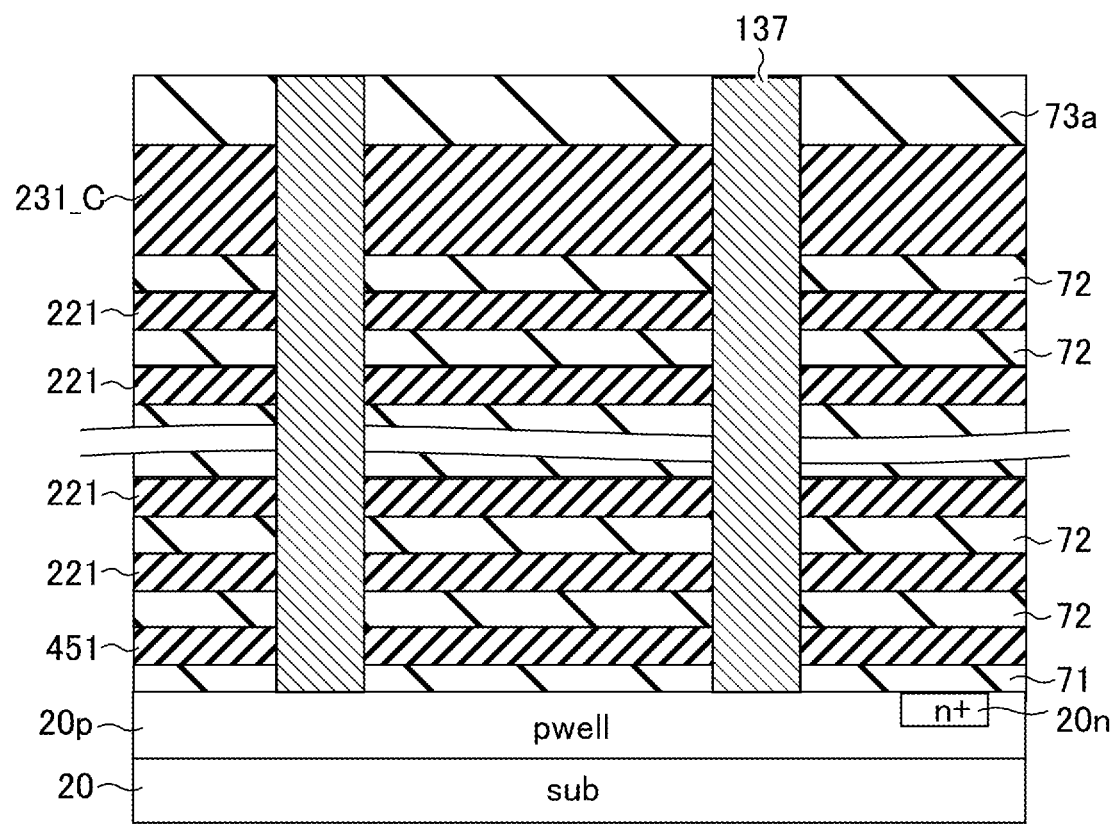

Next, a sacrificial member 137 is formed in an area where the lower pillar MPDa is planned to be formed as shown in FIG. 43. Specifically, first, a mask having openings at locations corresponding to areas where the lower pillars MPDa are planned to be formed is created by photolithography, etc. on the upper surface of the structure that has been obtained through the previous steps. Then, an area where the lower pillar MPDa is planned to be formed is etched by anisotropic etching using the mask thereby formed. The sacrificial member 137 is then embedded in this area.

The sacrificial member 137 penetrates through the insulating layers 71, 72, and 73a, and the sacrificial members 451, 221, and 231_C, and the bottom of the sacrificial member 137 is located within the p-type well region 20p, for example. The anisotropic etching in this step is, for example, reactive ion etching (RIE). The sacrificial member 137 includes silicon, for example non-dope amorphous silicon.

Thereafter, slits SHEa are formed as shown in FIG. 44. Specifically, a mask having openings at locations corresponding to areas where the slits SHEa are planned to be formed is first created by photolithography, etc. on the upper surface of the structure that has been obtained through the previous steps. Subsequently, an area where the slit SHEa is planned to be formed is etched by anisotropic etching using the formed mask. The insulating layer 32 is then embedded in this area.

The slits SHEa formed in this step split each of the insulating layer 73a and the sacrificial member 231_C, and the bottom of the slit SHEa stops within the insulating layer 72, for example. The bottoms of the slits SHEa need to reach at least the insulating layer 72. The sacrificial member 231_C is divided into the sacrificial members 231_0C, 231_1C, 231_2C, and 231_3C by the slit SHEa. The sacrificial members 231_0C through 231_3C are formed in areas where the conductive layers 23_0C through 23_3C, which function as select gate lines SGDa0 through SGDa3, respectively, are planned to be formed. The anisotropic etching in this step is, for example, RIE.

Figure 45:
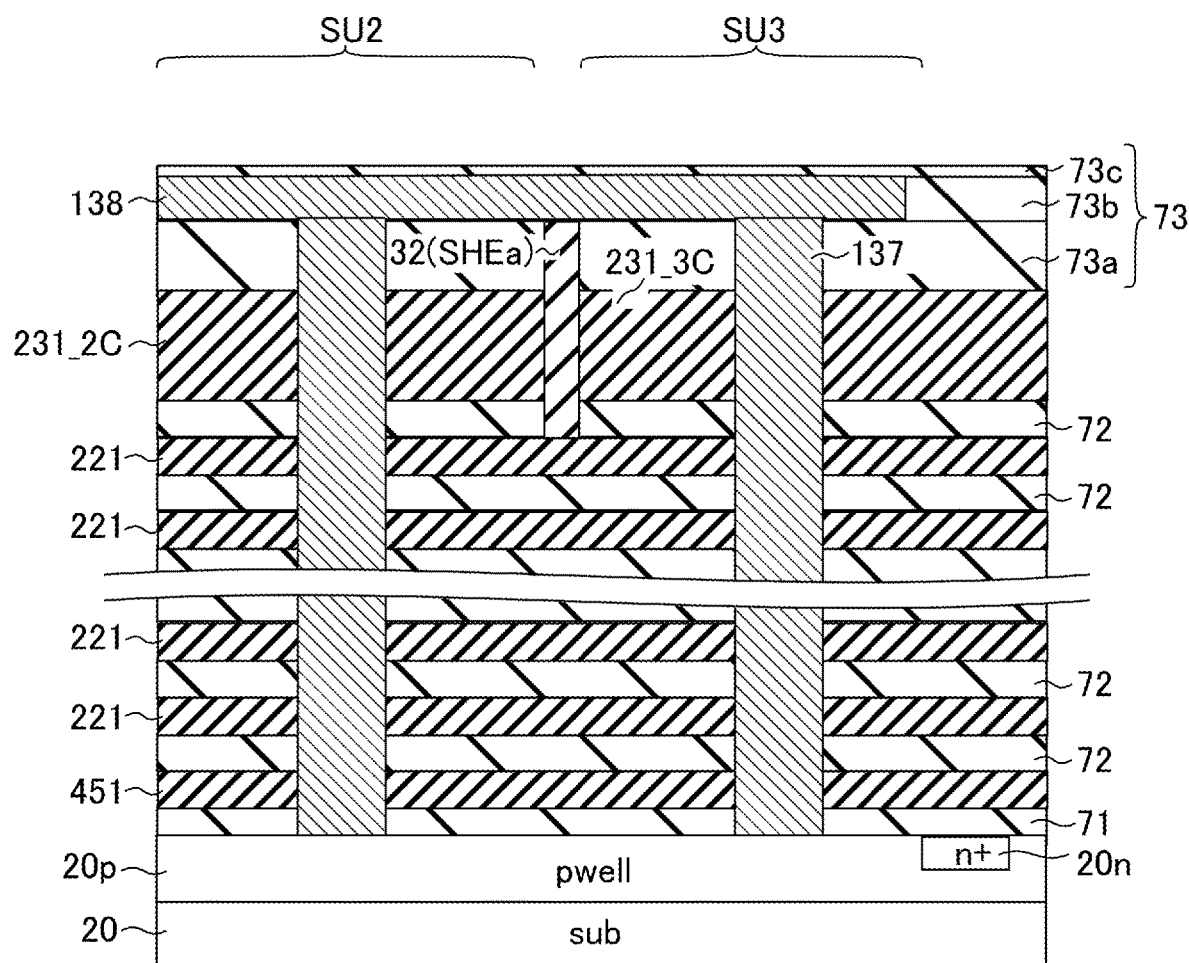

Next, a sacrificial member 138 is formed in an area where the local bit line LBLD is planned to be formed as shown in FIG. 45. In particular, first, an insulating layer 73b is formed on the upper surfaces of the insulating layer 73a and the sacrificial member 137. Thereafter, a mask having an opening at a location corresponding to an area where the local bit line LBLD is to be formed is created by photolithography, etc. on the upper surface of the sacrificial member 137. In the insulating layer 73b, the area where the local bit line LBLD is planned to be formed is etched by anisotropic etching using the formed mask. The sacrificial member 138 is then embedded in this area. Then, an insulating layer 73c is formed on the insulating layer 73b and the sacrificial member 138. Hereinafter, the insulating layer consisting of the insulating layer 73a, the insulating layer 73b, and the insulating layer 73c may be referred to as an "insulating layer 73". The insulating layer 73 contains, for example, silicon oxide.

The sacrificial member 138 is in contact with the upper surface of the sacrificial member 137. The sacrificial member 138 includes silicon, for example non-dope amorphous silicon. The sacrificial member 138 includes a material similar to that of the sacrificial member 137, for example. The anisotropic etching in this step is, for example, RIE.

Figure 46:
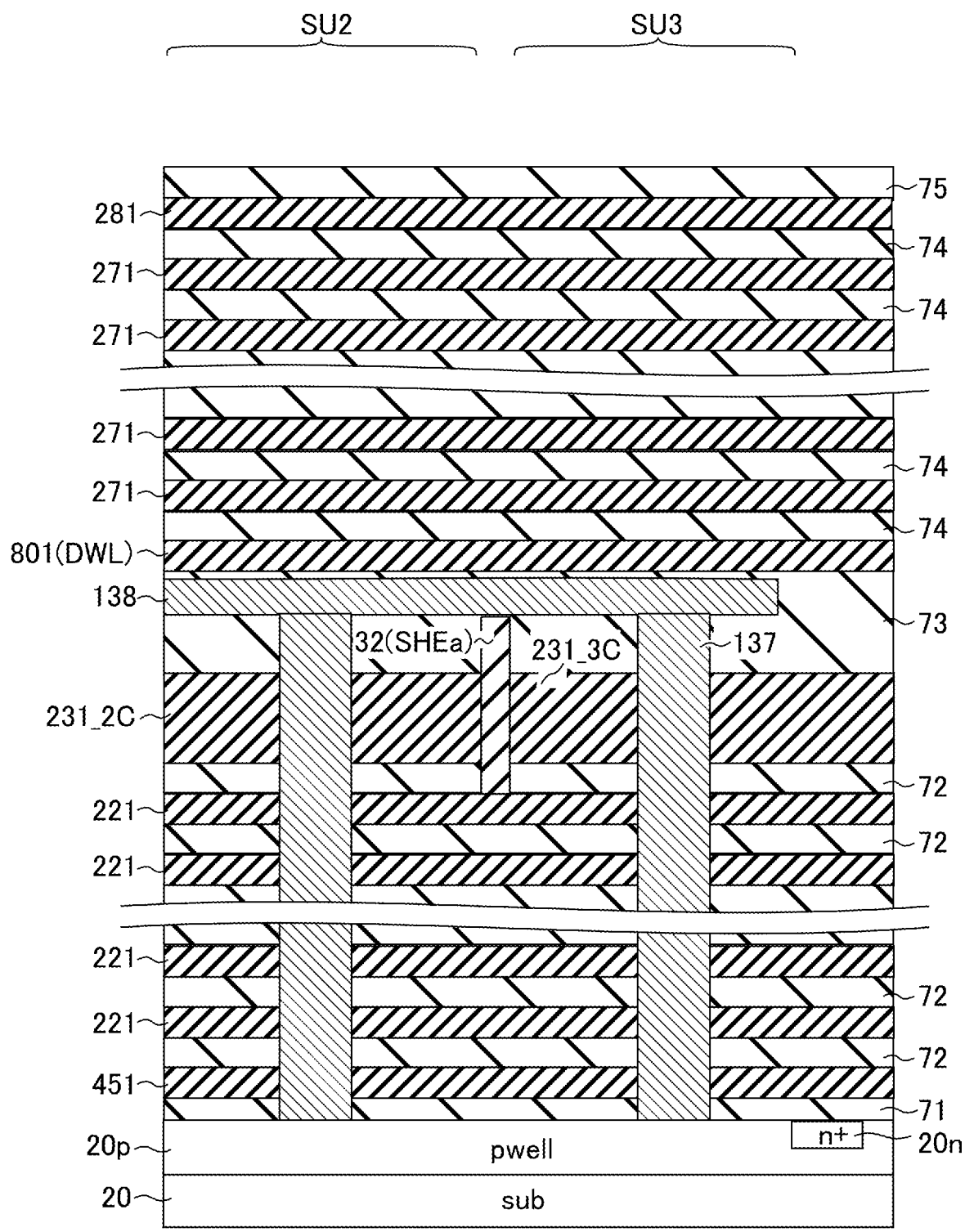

Thereafter, a stack structure of the tier B is formed as shown in FIG. 46. First, a sacrificial member 801 is formed on the upper surface of the insulating layer 73. Multiple insulating layers 74 and sacrificial members 271 are alternately stacked on the upper surface of the sacrificial member 801, and a sacrificial member 281 is formed on the upper surface of the uppermost insulating layer 74. An insulating layer 75 is formed on the uppermost sacrificial member 281. The sacrificial members 801, 271, and 281 are formed in areas where the conductive layers 80, 27, and 28, which are to respectively function as the dummy word line DWL, the word line WL, and the select gate line SGDb, are planned to be formed, respectively. For example, the number of layers of sacrificial members 271 to be formed corresponds to the number of word lines WL stacked on the tier B. Each of the insulating layers 74 and 75 includes silicon oxide. The sacrificial members 801, 271, and 281 include, for example, silicon nitride.

Figure 47:
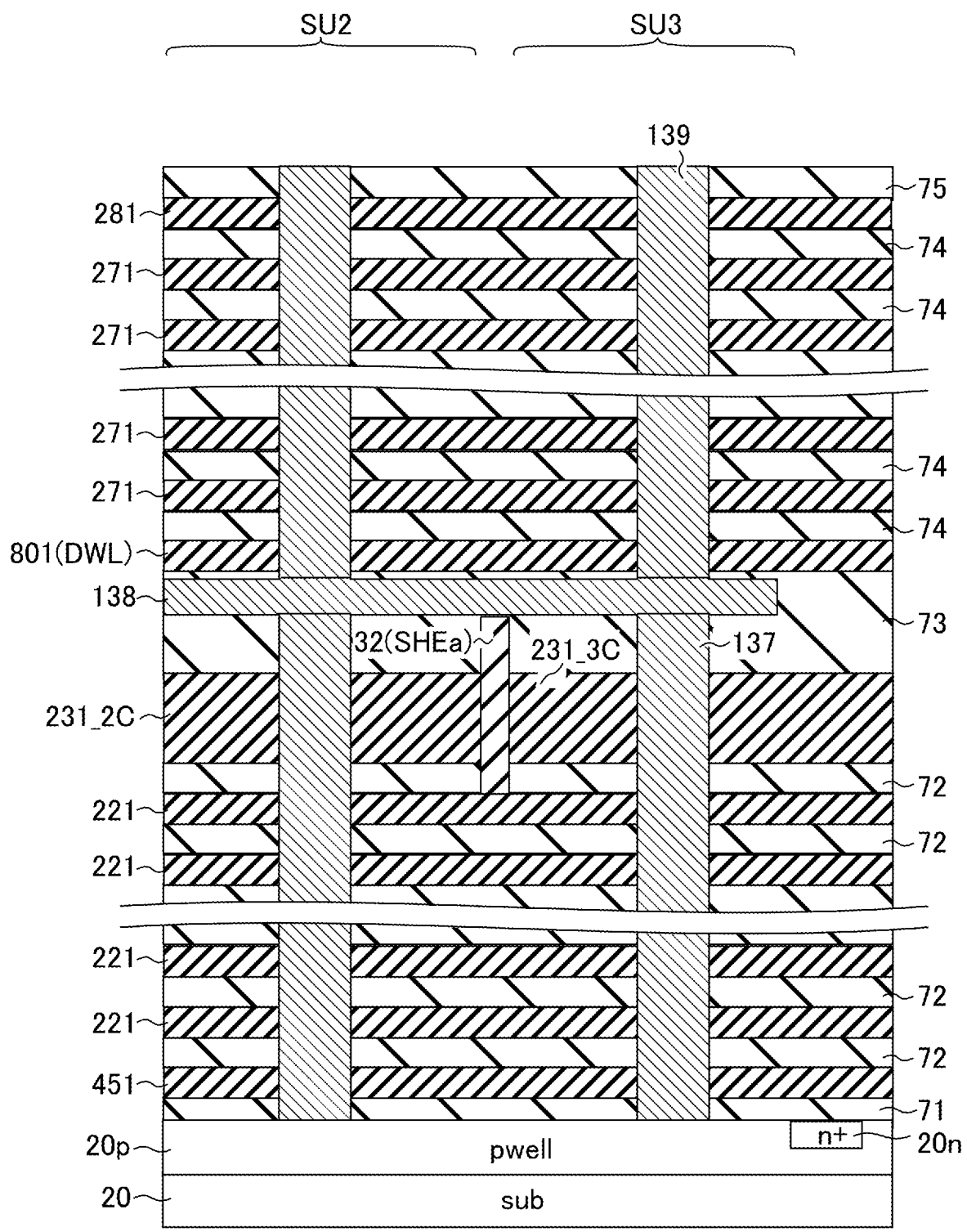

Next, a sacrificial member 139 is formed in an area where the upper pillar MPDb is planned to be formed as shown in FIG. 47. Specifically, first, a mask having openings at locations corresponding to areas where the upper pillars MPDb are planned to be formed is created by photolithography, etc. on the upper surface of the structure that has been obtained through the previous steps. Then, an area where the upper pillar MPDb is planned to be formed is etched by anisotropic etching using the mask thereby formed. The sacrificial member 139 is then embedded in this area.

The sacrificial member 139 penetrates through the insulating layer 74 and 75 and the sacrificial members 801, 271, and 281. The bottom of the sacrificial member 139 stops within the insulating layer 73, for example, and is located at the sacrificial member 138. The anisotropic etching in this step is, for example, RIE. The sacrificial member 139 includes silicon, for example non-dope amorphous silicon. The sacrificial member 139 includes a material similar to that of the sacrificial members 137 and 138, for example.

Figure 48:
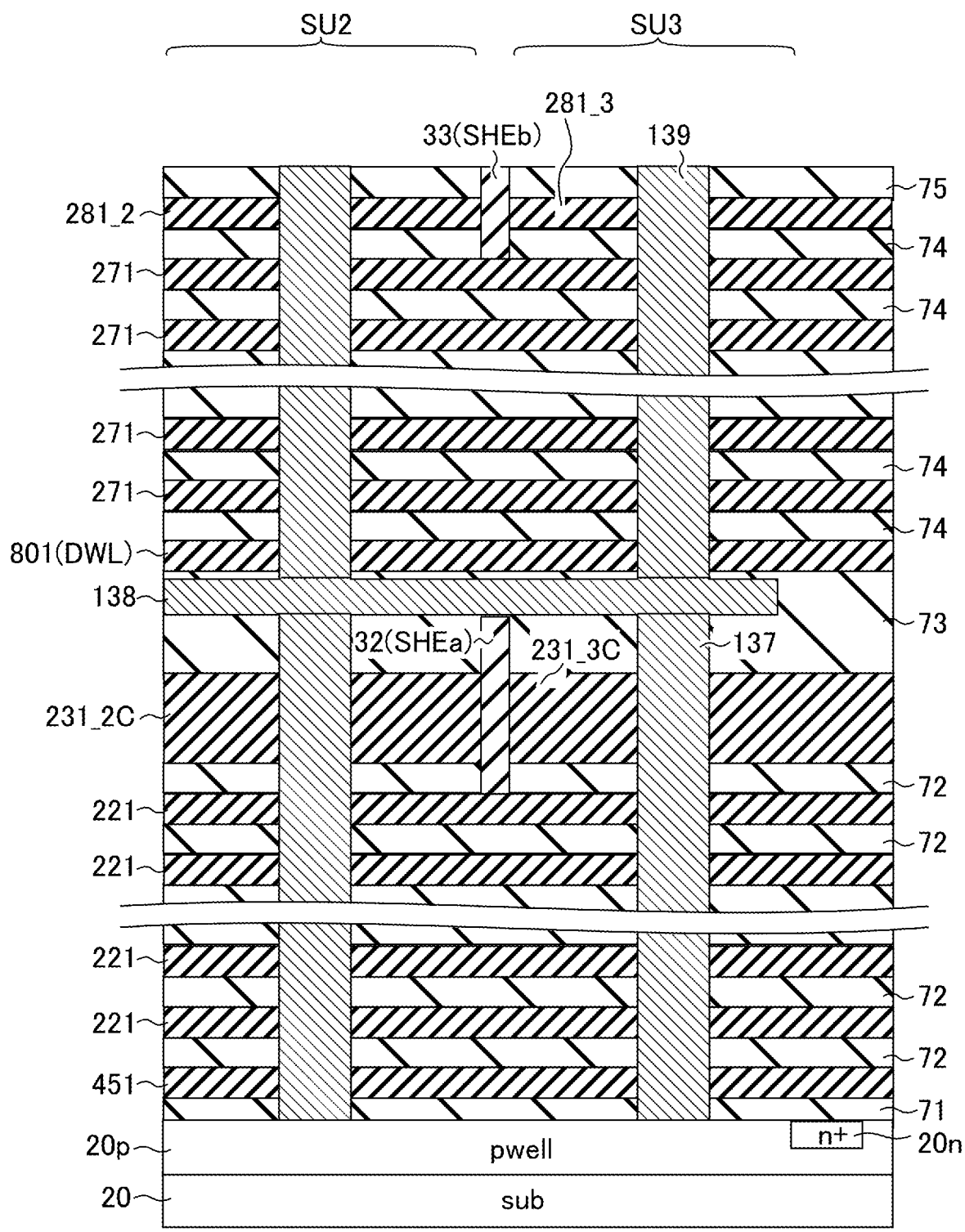

Thereafter, the slits SHEb are formed as shown in FIG. 48. Specifically, first, a mask having openings at locations corresponding to areas where the slits SHEb are planned to be formed is created by photolithography, etc. on the upper surface of the structure that has been obtained through the previous steps. Thereafter, an area where the slit SHEb is planned to be formed is etched by anisotropic etching using the formed mask. The insulating layer 33 is then embedded in this area.

The slits SHEb formed in this step split each of the insulating layer 75 and the sacrificial member 281, and the bottom of the slit SHEb stops within the insulating layer 74, for example. The bottoms of the slits SHEb need to reach at least the insulating layer 74. The sacrificial member 281 is divided into the sacrificial members 281_0, 281_1, 281_2, and 281_3 by the slits SHEb. The sacrificial members 281_0 through 281_3 are formed in areas where the conductive layers 28_0C through 28_3C, which function as select gate lines SGDb0 through SGDb3, respectively, are planned to be formed. The anisotropic etching in this step is, for example, RIE.

Figure 49:
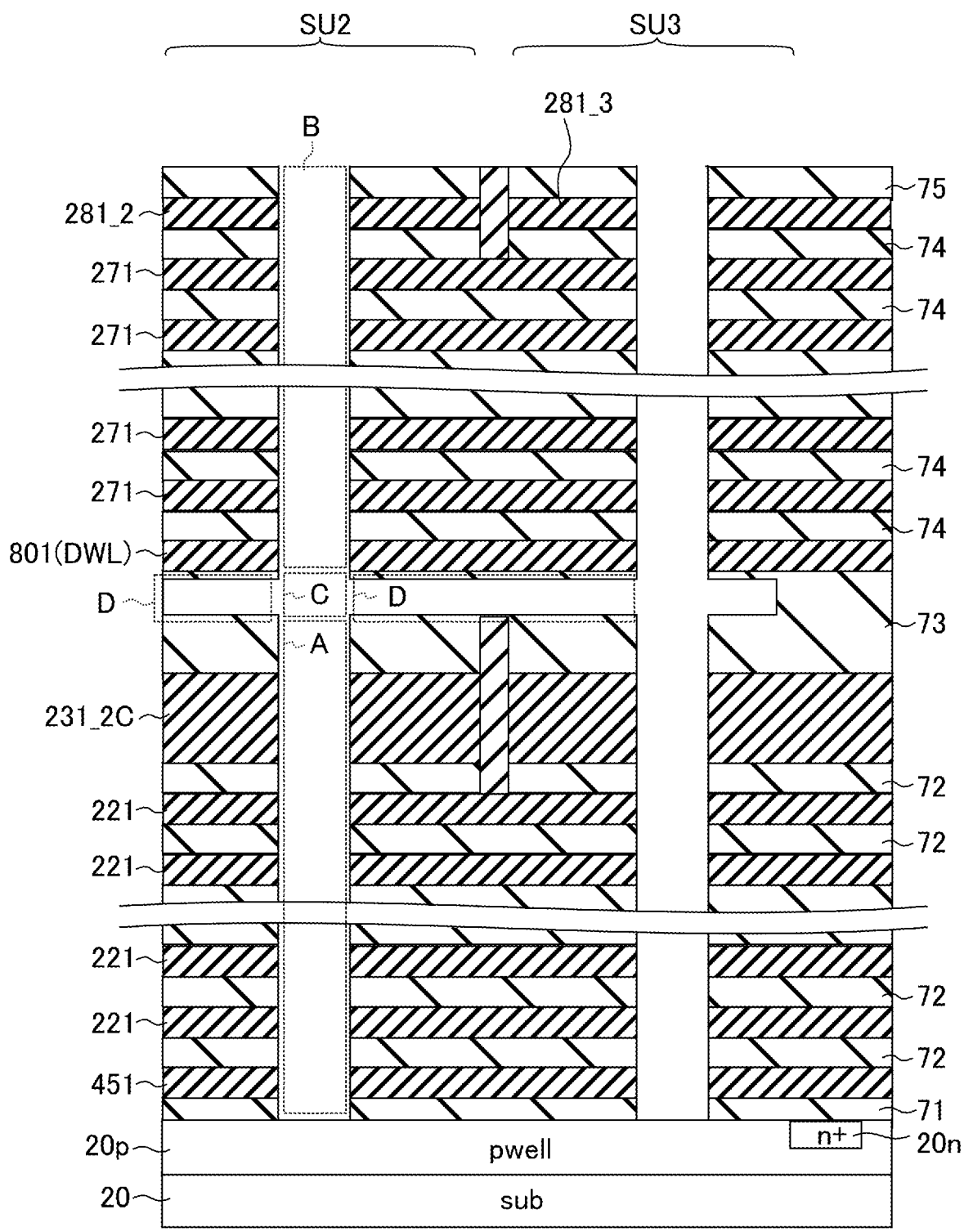

Thereafter, the sacrificial members 137 through 139 are removed as shown in FIG. 49. Specifically, the sacrificial members 137 through 139 are removed by etching. As the etching technique, a wet etching technique using hydrofluoric acid, a dry etching technique such as RIE, or a combination of these techniques may be adopted. Thus, spaces are formed in areas where the memory pillars MPD and the local bit line LBLD are planned to be formed. The spaces where the lower pillar MPDa, the upper pillar MPDb, the connecting section MPDc, and the inter-MPD local bit line LBLd are planned to be formed are referred to as "space A", "space B", "space C", and "space D", respectively.

Figure 50:
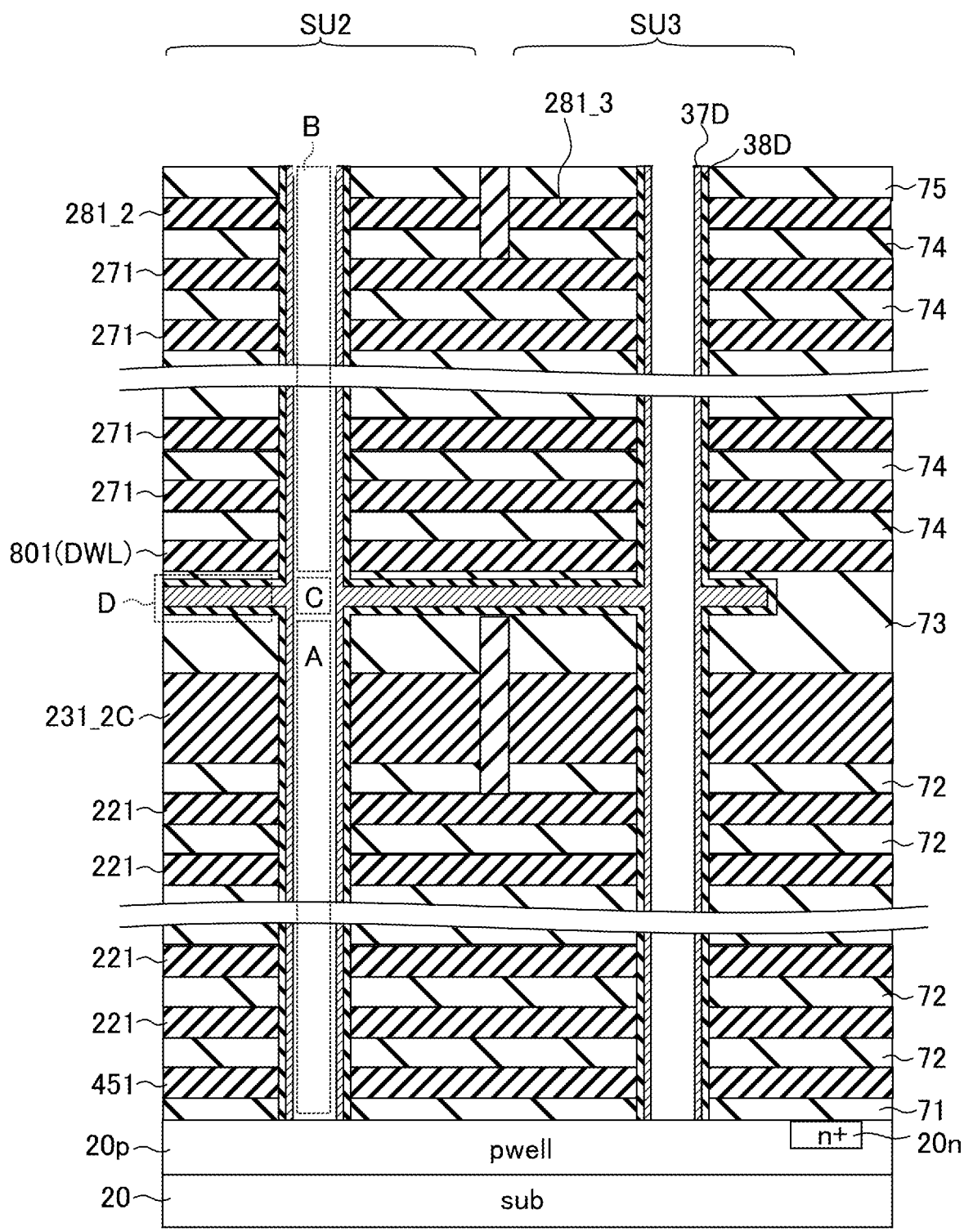

Thereafter, the insulating film 38D and the semiconductor film 37D are formed as shown in FIG. 50. Specifically, an insulating film 38D is formed on surfaces of the areas exposed to the spaces A through D. The insulating film 38D in the spaces A through D is continuous. The bottom of the insulating film 38D in the space A is in contact with the p-type well region 20p.

Next, the semiconductor film 37D is formed so as to cover the side surface of the insulating film 38D. Ideally, the semiconductor film 37D is formed so as to fill the space D. Even after the semiconductor film 37D is formed, the spaces A through C partially remain as spaces. The semiconductor film 37D in the spaces A through D is continuous and electrically coupled. The bottom of the semiconductor film 37D in the space A is in contact with the p-type well region 20p and is electrically coupled thereto.

Figure 51:
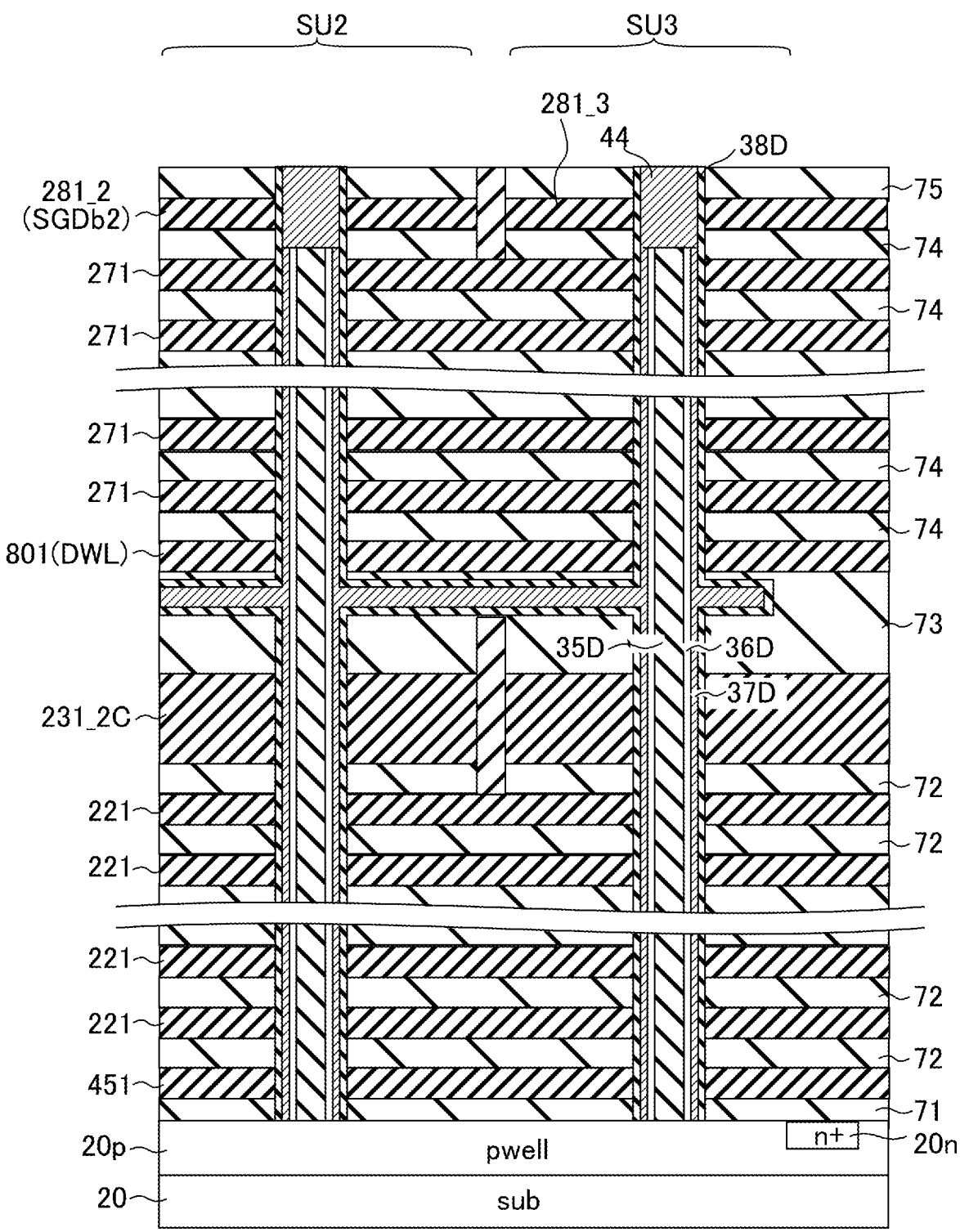

Thereafter, the memory pillars MPD are formed, as shown in FIG. 51. Specifically, the resistance change film 36D is formed so as to cover the side surface of the semiconductor film 37D. Ideally, since the space D is filled by the semiconductor film 37D, the resistance change film 36D is formed so as to cover the side surface of the semiconductor film 37D in the spaces A through C. In the case where the space D is not completely filled by the semiconductor film 37D for, for example, manufacturing-related reasons, however, the resistance change film 36D is also formed on the side surface of the semiconductor film 37D in the space D. Even in this case, since the semiconductor film 37D is formed so as to cover the periphery of the resistance change film 36D, the semiconductor film 37D in the spaces A through D is electrically coupled without fail.

The resistance change film 36 in the spaces A through C or the spaces A through D is continuous and electrically coupled. The bottom of the resistance change film 36D in the space A is in contact with the p-type well region 20p and is electrically coupled thereto.

Next, a core film 35D is formed so as to cover the side wall of the resistance change film 36, and the spaces A through C are thereby filled. The core film 35D in the spaces A through C is continuous. The bottom of the core film 35D in the space A is in contact with the p-type well region 20p.

Next, in the memory pillars MPD, the upper portions of the semiconductor film 37D, the resistance change film 36D, and the core film 35D are removed, and the semiconductor portion 44 is embedded in the area from which those upper portions are removed. The semiconductor portion 44 is electrically coupled to the semiconductor film 37D and the resistance change film 36D.

Thus, in the memory pillars MPD according to the fourth embodiment, the stacked structure of the lower pillar MPDa, the upper pillar MPDb, and the connecting section MPDc is formed at once through the same steps.

Figure 52:
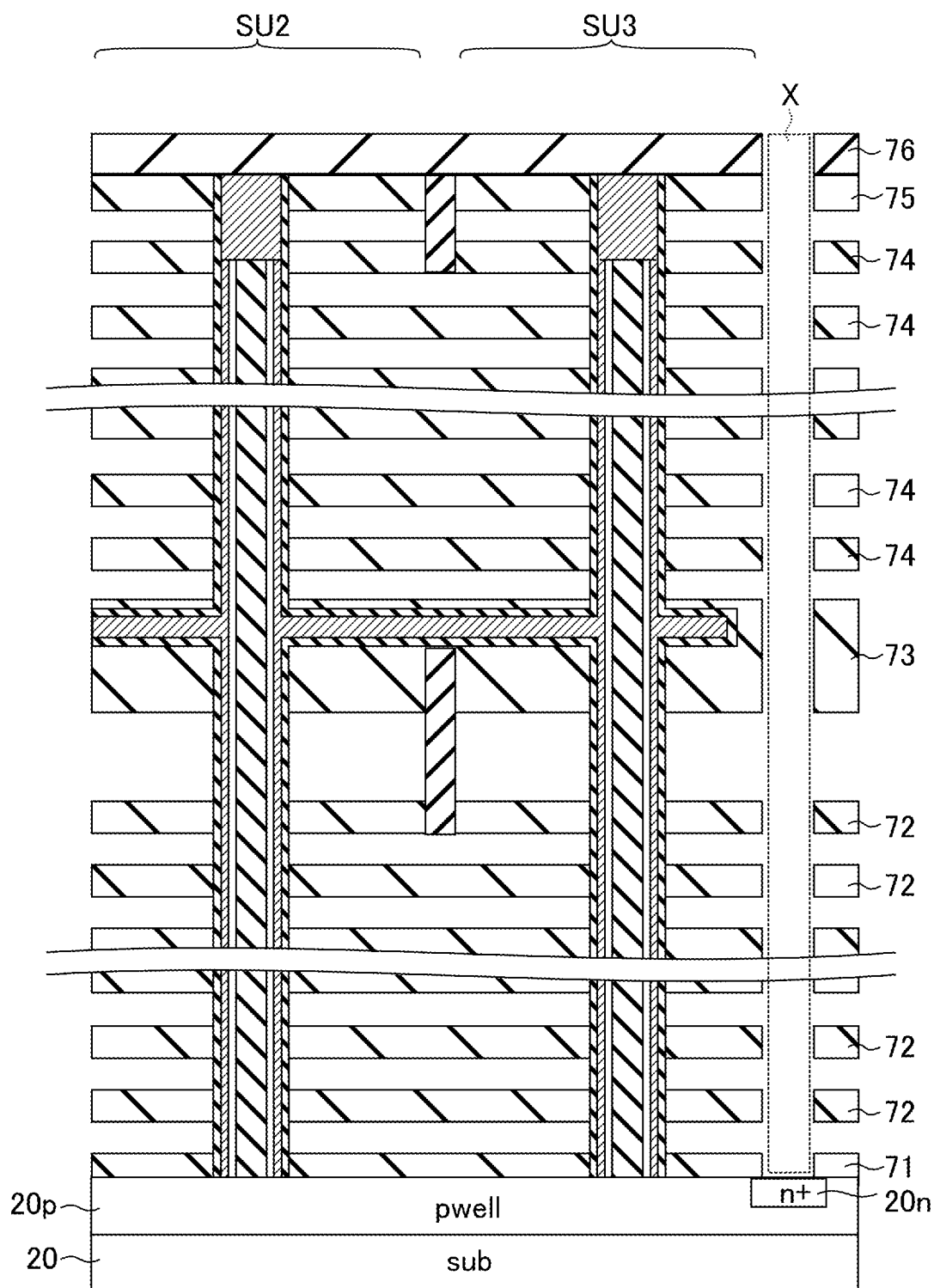

Next, the sacrificial members 451, 221, 231_C, 801, 271, and 281 are removed as shown in FIG. 52. Specifically, the insulating layer 76 is first formed on the memory pillars MPD, the slits SHEb, and the insulating layer 75.

After that, a mask having an opening at a location corresponding to an area where the insulating layer 34A and the conductive layer 46 are planned to be formed is created by photolithography, etc. on the upper surface of the insulating layer 76. Thereafter, a space X is formed in the area by anisotropic etching using the formed mask.

The space X formed in this step splits the insulating layers 71 through 76 and the sacrificial members 451, 221, 231_C, 801, 271, and 281, and thereby the upper surface of the n-type impurity diffusion region 20n is exposed. The anisotropic etching in this step is, for example, RIE.

Subsequently, the sacrificial members 451, 221, 231_C, 801, 271, and 281 are selectively removed by, for example, wet etching using thermal phosphoric acid.

At this time, etching is performed on, for example, the sacrificial members 451, 221, 231_0C, 231_3C, 801, 271, 281_0, and 281_3 via the space X. In contrast, it is difficult to perform etching on the sacrificial members 231_1C, 231_2C, 281_1 and 281_2 via the space X, since they are interposed between the slits SHEa or SHEb. For this reason, for the sacrificial members 231_1C, 231_2C, 281_1, and 281_2, a replacement hole may be formed in an area (not shown) in the string units SU1 and SU2 so that etching can be performed through this hole.

The three-dimensional conformation of the structure from which sacrificial members 451, 221, 231_C, 801, 271, and 281 have been removed is maintained by, for example, a plurality of memory pillars MPD, etc. Through the removal of the sacrificial members 451, 221, 231_C, 801, 271, and 281, spaces are formed in the areas where the sacrificial members 451, 221, 231_C, 801, 271, and 281 have been formed.

Figure 53:
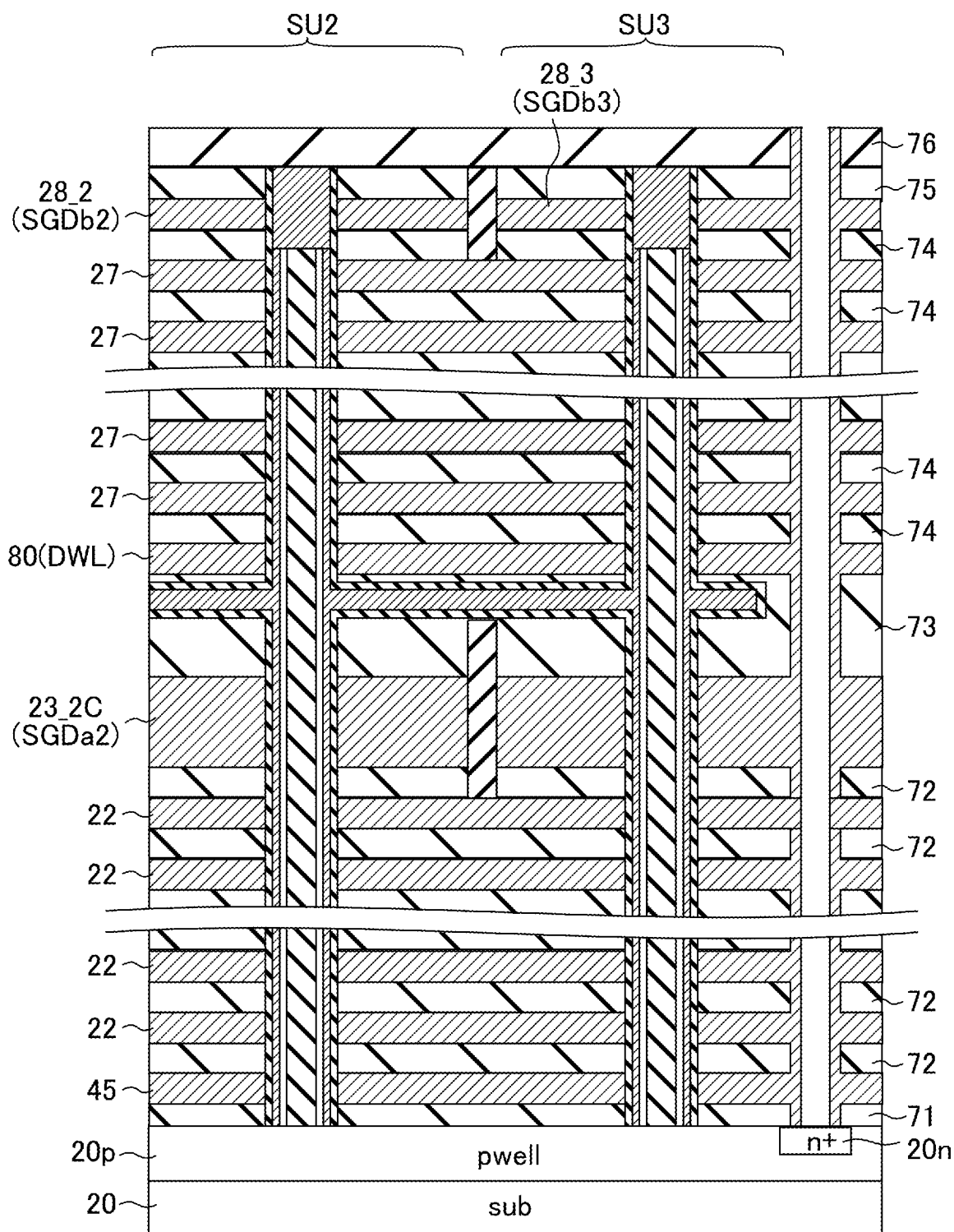

Thereafter, as shown in FIG. 53, the spaces formed by removing the sacrificial members are filled by the conductive layers 45, 22, 23C, 80, 27, and 28. For example, the conductive layers 45, 22, 23C, 80, 27, and 28 grow from the portions exposed by the etching, for example the side surface of the memory pillars MPD.

Figure 54:
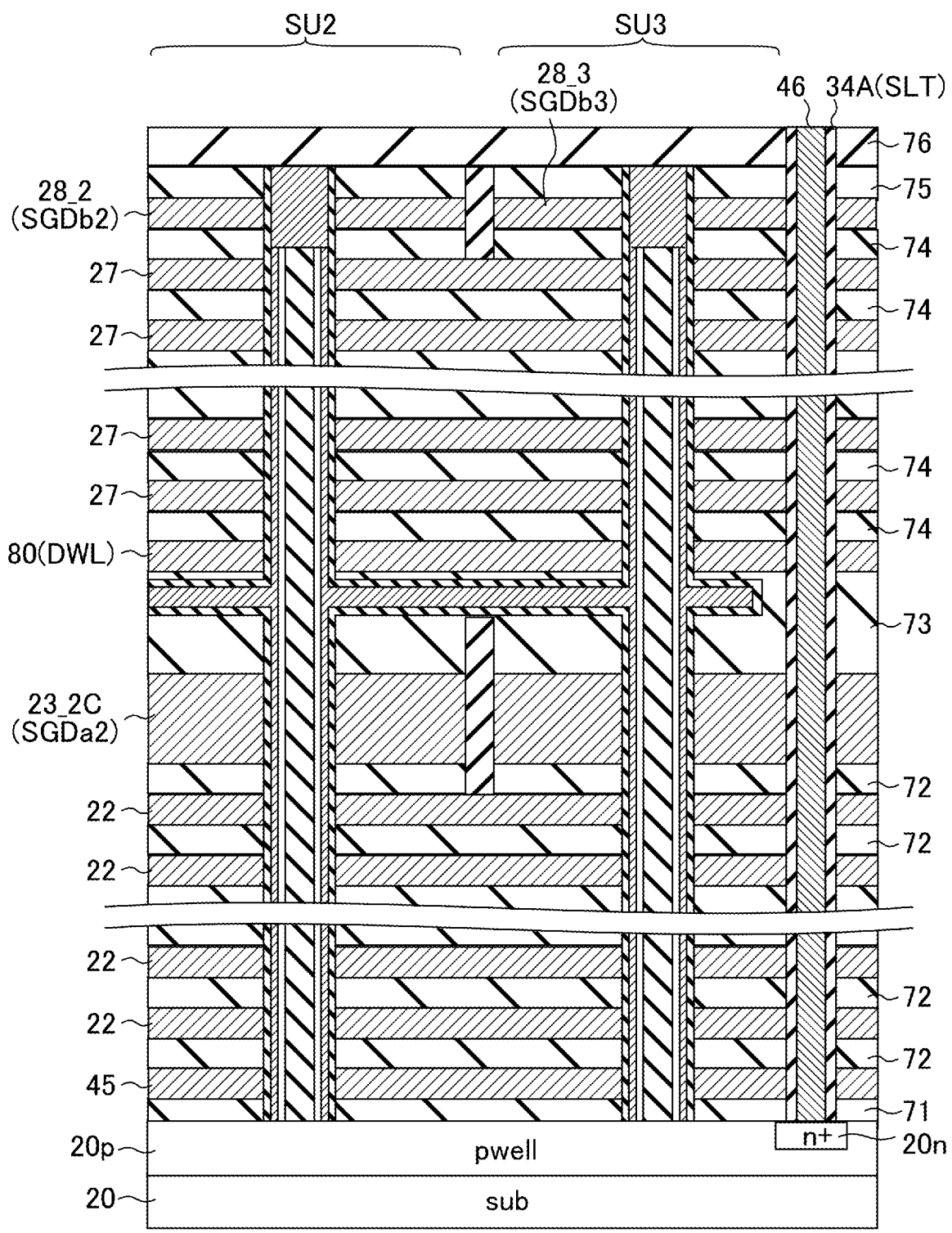

Subsequently, the insulating layer 34A (slit SLT) and the conductive layer 46 are formed as shown in FIG. 54. Specifically, the conductors formed in the space X are first removed. Thus, the conductive layer 45 functioning as the select gate line SGS, a plurality of conductive layers 22 functioning as the word lines WL, the conductive layer 23_C functioning as the select gate line SGDa, the conductive layer 80 functioning as the dummy word line DWL, a plurality of conductive layers 27 functioning as the word lines WL, and the conductive layer 28 functioning as the select gate line SGDb are formed. The conductive layers 45, 22, 23C, 80, 27, and 28 may include a barrier metal. Then, the insulating layer 34A is formed on the side surface of the space X, and the conductive layer 46 is embedded in the remaining space. The conductive layer 46 is in contact with the upper surface of the n-type impurity diffusion region 20n and used as a contact of the source line SL. The insulating layer 34A functions as the slit SLT.

Then, as shown in FIG. 39, the conductive layer 29 that functions as a contact CPb is provided on the upper surface of the semiconductor portion 44. On the upper surface of the conductive layer 29, a conductive layer 30 that functions as a pillar-shaped via VIAb is provided. The upper end of the conductive layer 30 is in contact with the conductive layer 31 (bit line BL).

Through the above-described manufacturing process of the memory cell array 110 according to the fourth embodiment, the memory pillars MPD and the components coupled to the memory pillars MP, namely the word lines WL, the select gate lines SGS, SGDa, an SGDb, and the dummy word lines DWL, are formed. The above-described manufacturing steps are mere examples. Another step may be interposed between these manufacturing steps, and the order of these manufacturing steps may be altered unless a problem occurs.

5.2.2 Manufacturing Process of Configuration Example B

Next, an example of the manufacturing process for forming a stacked interconnect structure in the memory cell array 110 according to Configuration Example B of the fourth embodiment will be described mainly with respect to the differences from Configuration Example A. FIG. 55 is an example of a cross-sectional structure of the memory cell array 110 in the middle of the manufacturing according to Configuration Example B of the fourth embodiment, and shows a cross section similar to that of FIG. 30. FIG. 55 shows the part of the manufacturing step of Configuration Example B of the fourth embodiment that corresponds to FIG. 42, which shows a part of the manufacturing process of Configuration Example A of the fourth embodiment. Of the steps to form the structure shown in FIG. 55, the steps up to the step of stacking the insulating layer 72 is the same as those explained with reference to FIG. 42.

After the insulating layers 72 are stacked, the sacrificial members 231_D and the insulating layer 2311 are alternately stacked on the uppermost insulating layer 72. The insulating layer 73a is formed on the uppermost sacrificial member 231_D. The sacrificial member 231_D is formed in areas where the conductive layer 23_D functioning as select gate lines SGDa is planned to be formed.

FIG. 55 is based on an example where there are two layers of the sacrificial member 231; however, the number of the sacrificial member 231_D is not limited to two. For example, the number of the sacrificial member 231_D layers is equal to the number of a select gate line SGDa stacked in the tier A. The sacrificial member 231_D includes nitride silicon, for example, similarly to the sacrificial members 451 and 221.

The process thereafter is the same as that shown in FIGS. 43 through 54, which show the manufacturing process in Configuration Example A of the fourth embodiment. The sacrificial member 231_D is divided into the sacrificial members 231_0D through 231_3D, with the insulating layer 32 (slit SHEa) being interposed therebetween, similarly to the sacrificial member 231_C.

The sacrificial members 231_1D and 231_2D are etched via the space X shown in FIG. 52, similarly to the sacrificial member 231_C. In the sacrificial members 231_0D and 231_3D, similarly to the sacrificial member 231_C, replacement holes may be formed in an area in the string units SU1 and SU2, so that etching is performed through these holes. The space formed by etching is filled by the conductive layer 23_D. The conductive layer 23_D functions as a select gate line SGDa.

5.3 Operation

Figure 56:
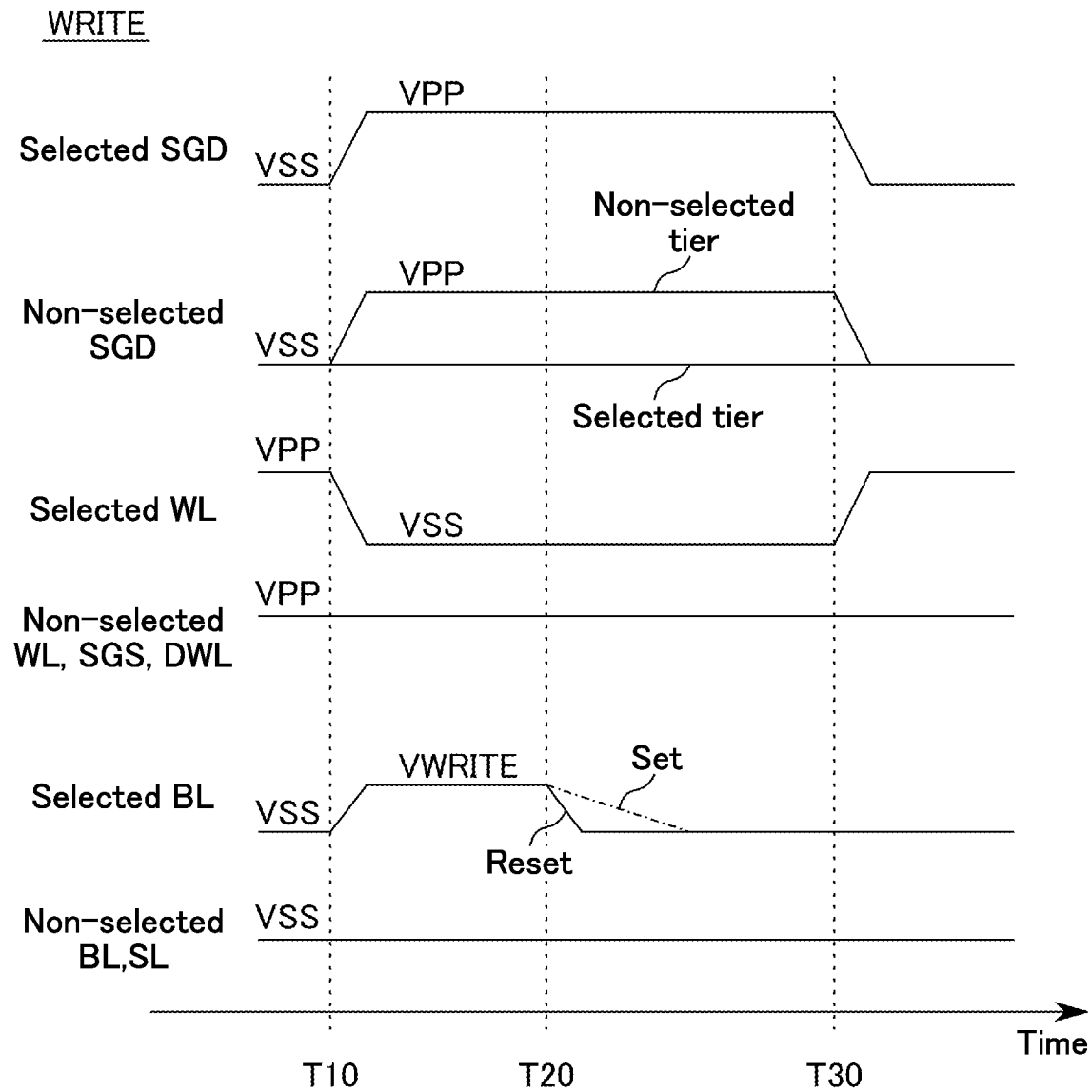
FIG. 56 is a timing chart for explaining a write operation in the memory device of the fourth embodiment.
Figure 57:
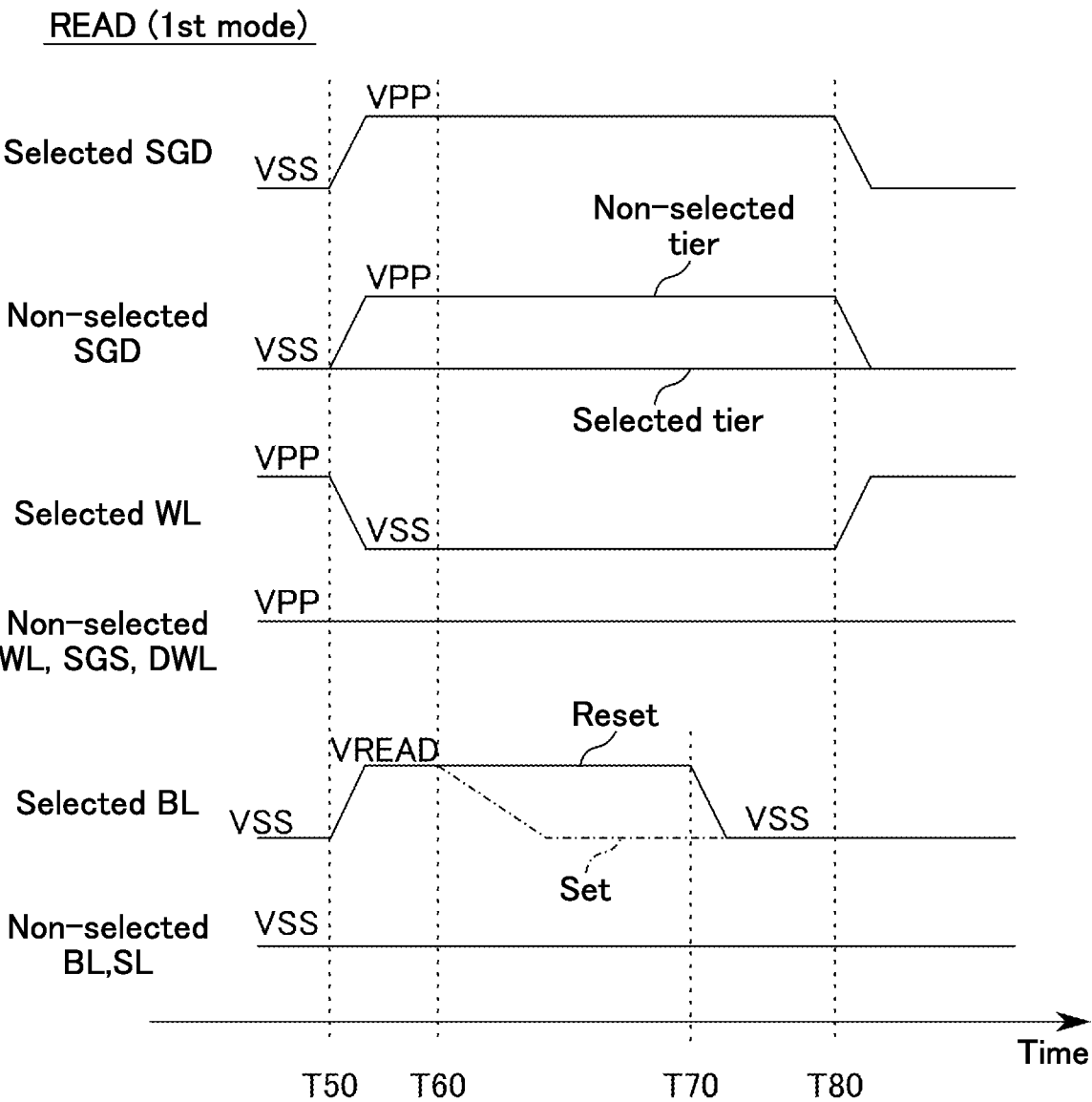
FIG. 57 is a timing chart for explaining a read operation in a first mode in the memory device of the fourth embodiment.

FIG. 56 is a timing chart showing a write operation in the memory device according to the fourth embodiment, and it corresponds to FIG. 16 of the second embodiment. FIG. 57 is a timing chart showing a read operation in a first mode in the memory device of the fourth embodiment, and it corresponds to FIG. 17 of the second embodiment. The timing chart showing a read operation in a second mode performed in the memory device according to the fourth embodiment is the same as FIG. 18, which is a timing chart showing a read operation in a second mode in the memory device according to the second embodiment; the descriptions of the timing chart are thus omitted.

As shown in FIGS. 56 and 57, in a standby state, the row decoder 120 applies the voltage VPP to the dummy word line DWL. The dummy transistor DT in a standby state is thereby turned to an on state. In either the write operation or the first-mode read operation, the on state of the select transistor DT is maintained during the entire operation.

5.4 Advantageous Effects of Present Embodiment

According to the fourth embodiment, similarly to the first embodiment, it is possible to use the discretionarily determined number of non-selected local memory strings LMS belonging to a non-selected tier as current paths in the operation of flowing a current into a selected memory cell MC. According to the fourth embodiment, since the memory device 100 has two read modes similarly to the first embodiment, the memory cell array 110 can select a more advantageous current path.

According to the fourth embodiment, similarly to the second embodiment, even when the lower pillars MPDa are not in contact with the source line SL (namely, in contact with the semiconductor substrate 20), the memory cell array 110 can allow a current to flow from a bit line BL to the source line SL.

According to the fourth embodiment, the memory cell array 110 can increase an effective gate length of the select transistor STDa, similarly to the first modification. Thus, even in a case in which the select transistor STDa has a resistance change film 36, the memory cell array 110 can suppress the degradation of cutoff performance of the select transistor STDa.

According to the fourth embodiment, it is possible to form the stacking of the lower pillar MPDa, the local bit line LBLD, and the upper pillar MPDb at once (through the same steps). Through forming the lower pillar MPDa, the local bit line LBLD, and the upper pillar MPDb in the same process, it is possible to simplify the manufacturing process in the memory cell array 110 of the fourth embodiment, compared to the case where the lower pillar MPDa, the local bit line LBLD, and the upper pillar MPDb are separately manufactured. Since the memory cell array 110 of the fourth embodiment negates the necessity of a contact between the lower pillar MPDa and the local bit line LBLD, it is possible to omit the space for the contact.

Figure 58:
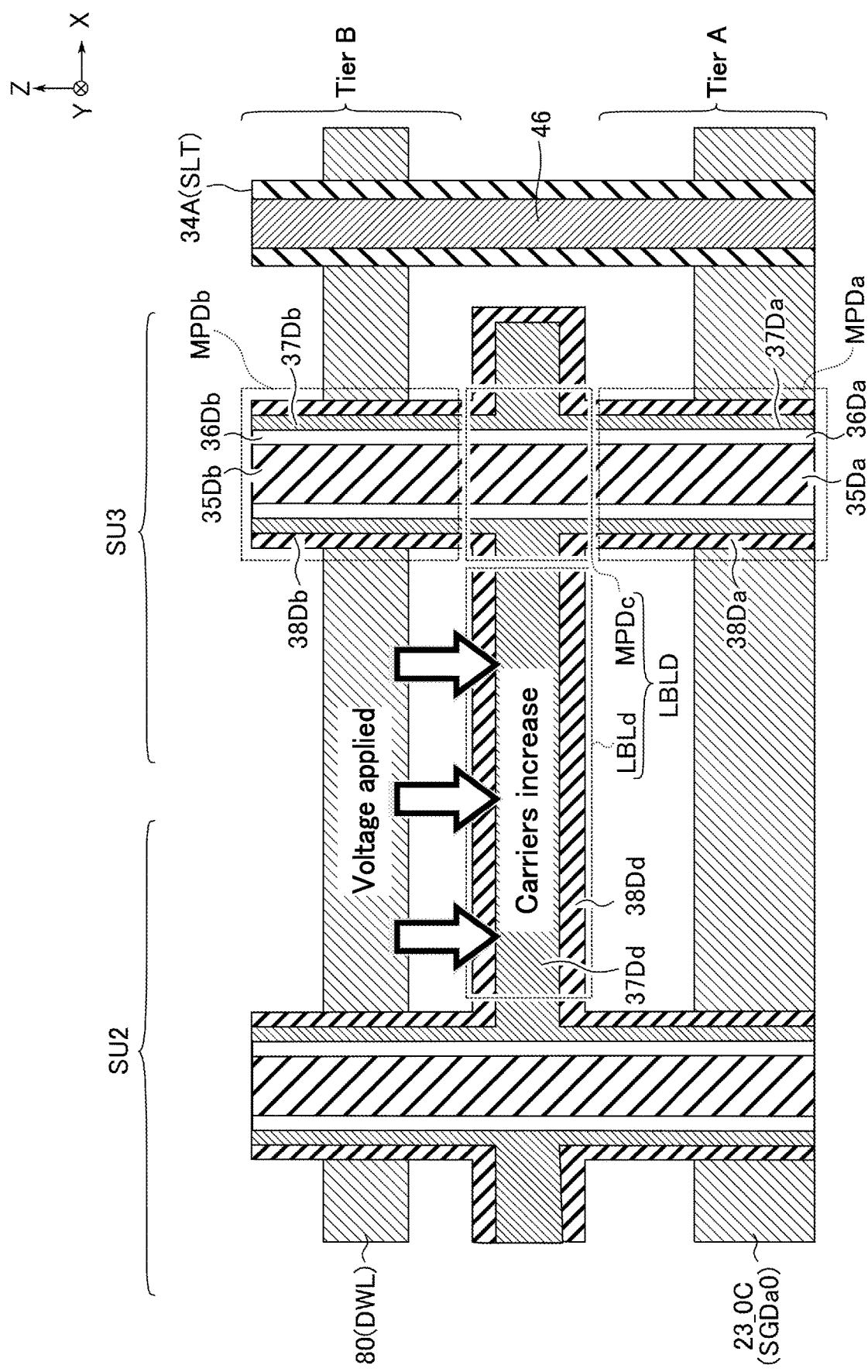
FIG. 58 is a cross-sectional diagram for explaining advantageous effects of a memory cell array of the memory device according to the fourth embodiment.

The memory cell array 110 of the fourth embodiment has a dummy word line DWL, unlike the other embodiments. Effects of the dummy word line DWL will be described with reference to FIG. 58. FIG. 58 is a drawing showing effects of applying a voltage to the dummy word line DWL according to the fourth embodiment. As shown in FIG. 58, the voltage VPP is applied to the dummy word line DWL in a standby state. While the voltage VPP is applied to the dummy word line DWL, an electric field is generated in the inter-MPD local bit line LBLd, and carriers increase in the semiconductor film 37Dd.

In other words, electric resistance decreases in the semiconductor film 37Dd, and a current can more easily flow in the local bit line LBLD.

5.5 Configuration Example C of Fourth Embodiment

Next, a memory device according to Configuration Example C of the fourth embodiment will be described. The inter-MPD local bit line LBLd in the local bit line LBLD according to Configuration Examples A and B of the fourth embodiment is constituted by the semiconductor film 37Dd and the insulating film 38Dd. The inter-MPD local bit line LBLd, however, may have a different structure as long as the structure achieves electrical couplings between the memory pillars MPD. For example, inter-MPD local bit line LBLd has a structure that includes a metal such as tungsten or a silicon doped with an atom such as phosphorous or boron. The configuration having such a structure will be referred to as "Configuration Example C" of the fourth embodiment. Hereinafter, the differences in the configurations and manufacturing methods between Configuration Example C and Configuration Examples A and B will be described.

5.5.1 Configuration of Configuration Example C

FIG. 59 shows an example of a cross-sectional structure of the memory cell array 110 of the memory device in Configuration Example C of the fourth embodiment. FIG. 59 shows a cross section of an area that is the same as the area shown in FIG. 39 of the Configuration Example A. In FIG. 59, insulating layers, etc., may be omitted for improved visibility or other reasons. FIG. 59 is based on an example to which Configuration Example C is applied to Configuration Example A; however, Configuration Example C can be applied to Configuration Example B.

Configuration Example C differs from Configuration Examples A and B in that the inter-MPD local bit line LBLd includes a conductive layer 26D. The conductive layer 26D includes a metal such as tungsten or a silicon doped with an atom such as phosphorous or boron, for example. The conductive layer 26D has, when no voltage is applied thereto, a high electrical conductivity, compared to, for example, the semiconductor film 37D.

Configuration Example C does not necessarily have a dummy word line DWL. In Configuration Example C, the conductive layer 26D, instead of the semiconductor film 37D, may be embedded in the inter-MPD local bit line LBLd. The conductive layer 26D has a high electric conductivity when no voltage is applied thereto, compared to, for example, the semiconductor film 37D; for this reason, it is not necessary to apply a voltage to the inter-MPD local bit lines LBLd from the dummy word line DWL.

The semiconductor layer 26D of the local bit line LBLD is in contact with the semiconductor film 37D of the memory pillar MPD and electrically coupled thereto. Thus, the semiconductor layer 26D of the local bit line LBLD, the p-type well region 20p, and the conductive layer 31 are electrically coupled to each other through the semiconductor film 37D or the resistance change film 36D in the memory pillar MPD. The conductive layer 26D may have a multi-layer structure in which, for example, titanium nitride is interposed between tungsten and the semiconductor film 37D. In this case, titanium nitride can prevent diffusion of silicon from the semiconductor film 37D to the conductive layer 26D.

5.5.2 Manufacturing Process of Configuration Example C

Figure 60:
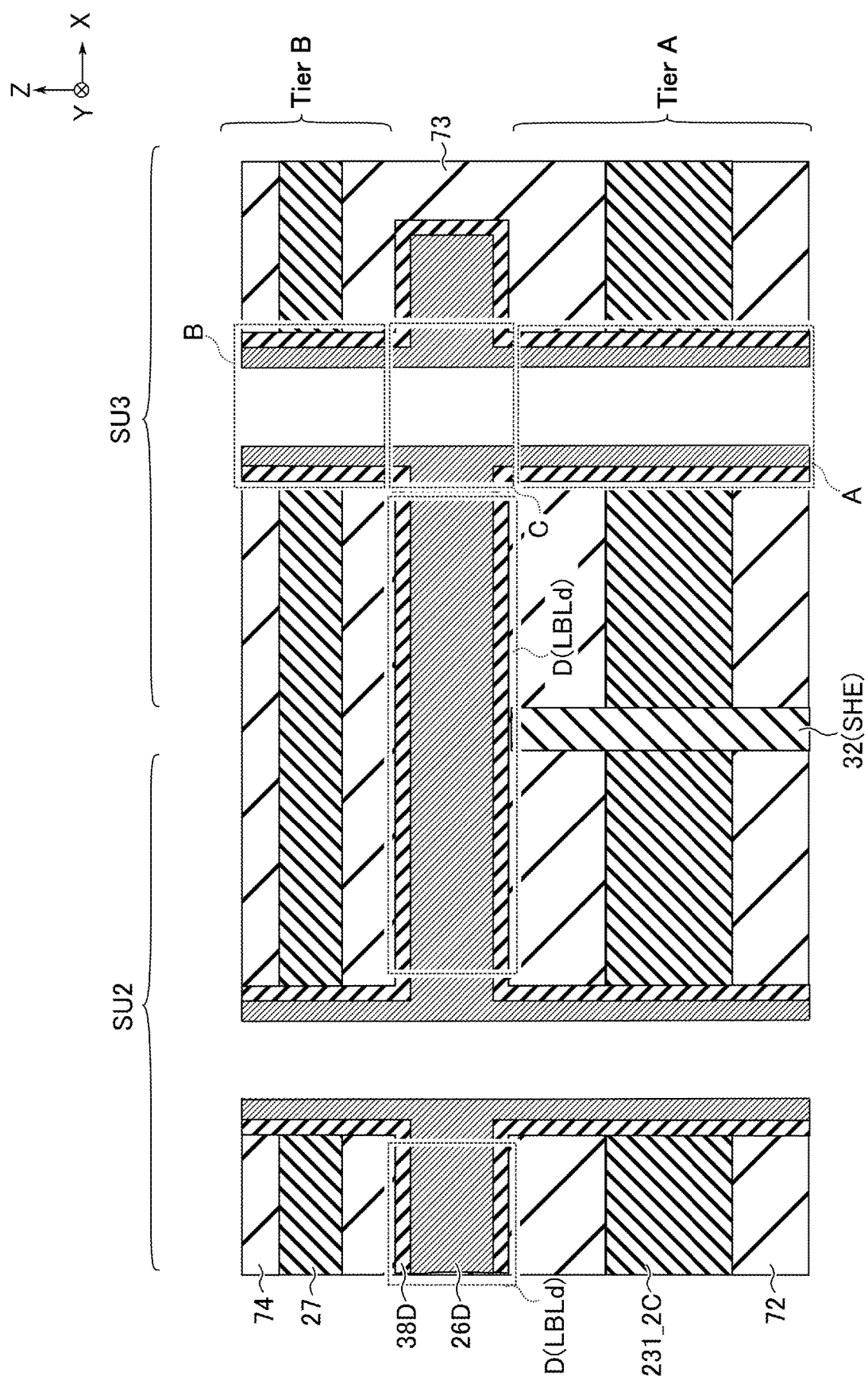
Figure 61:
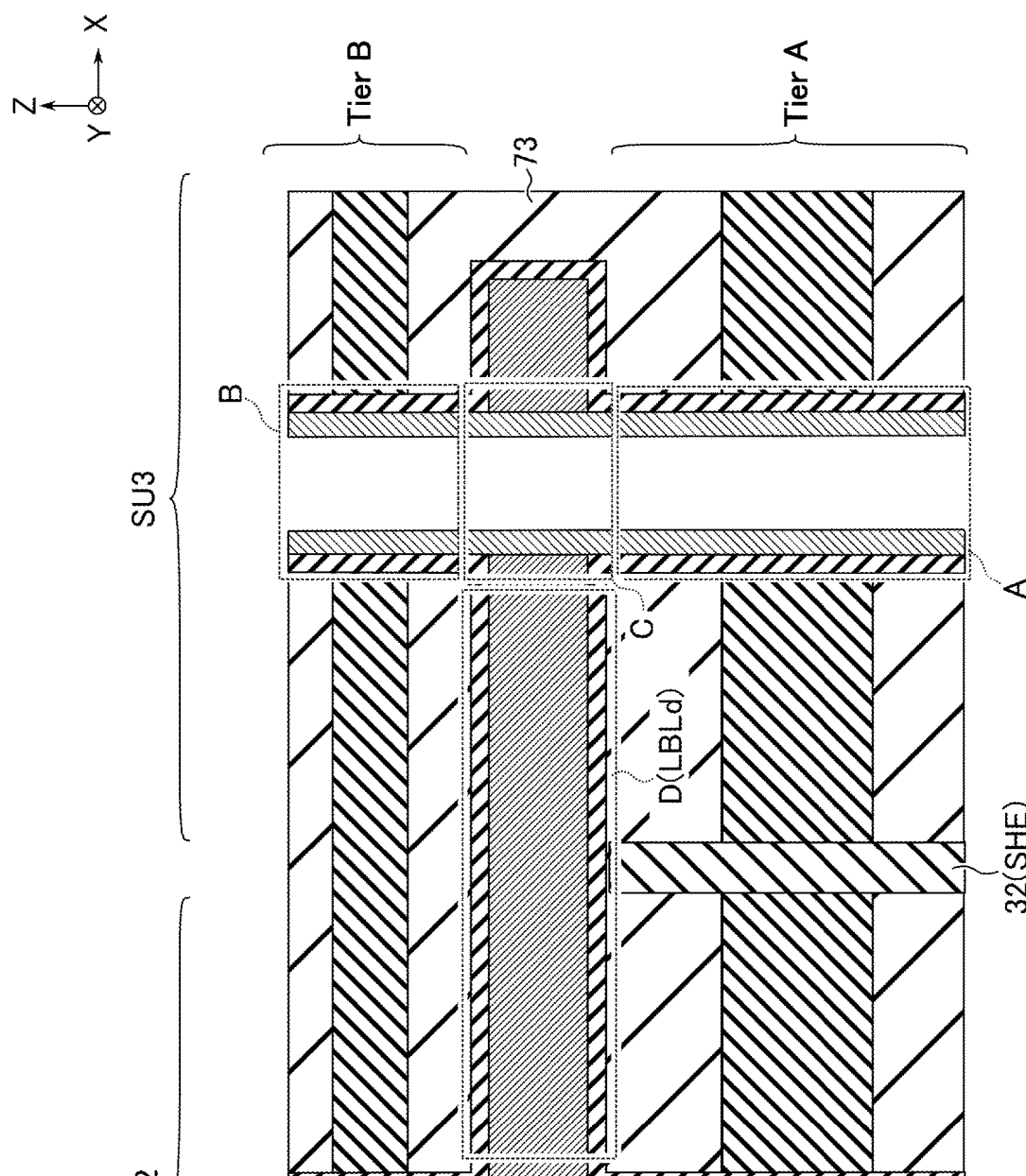
Figure 62:
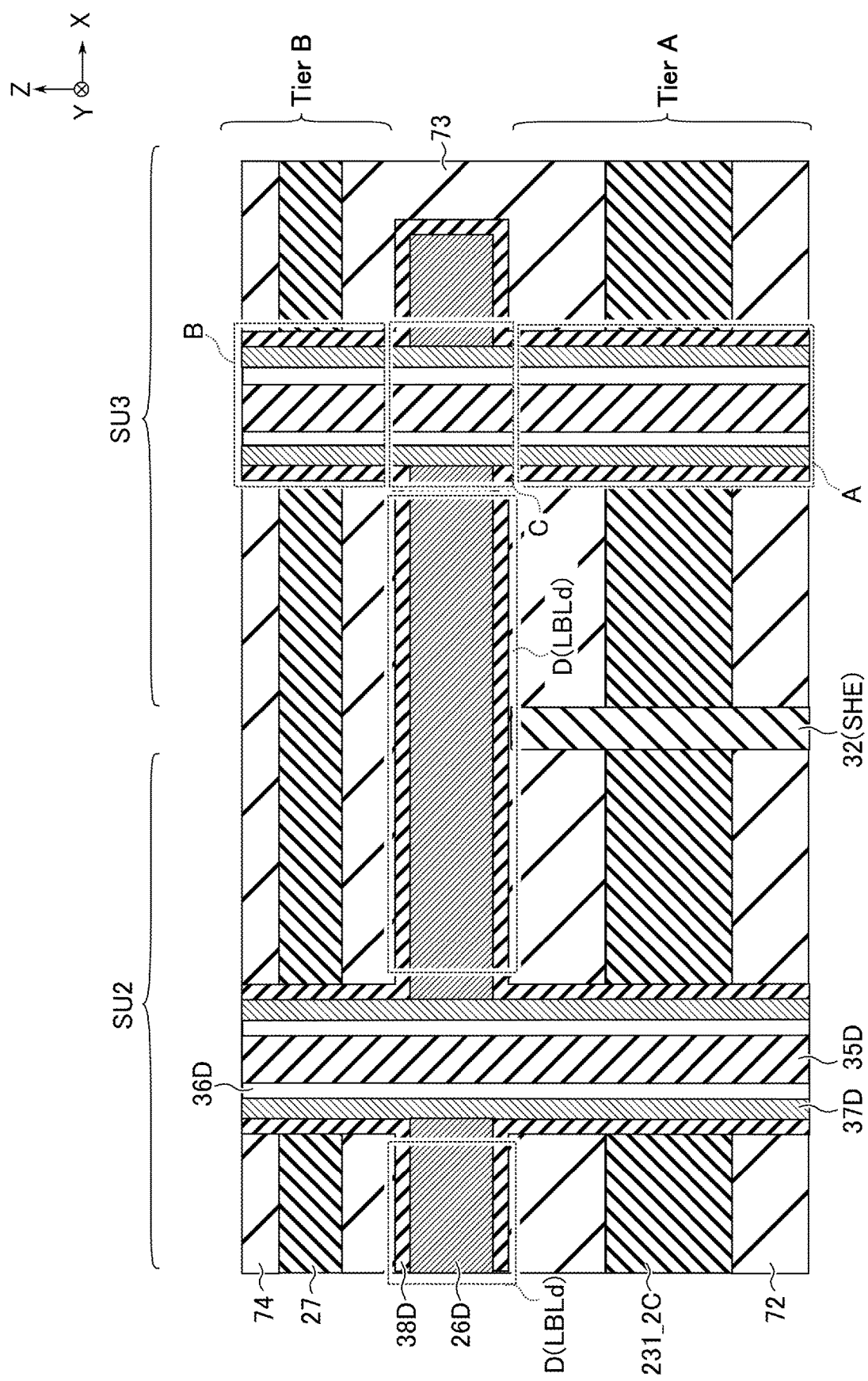

Hereinafter, the differences in the manufacturing steps between Configuration Examples A and C will mainly be described. FIGS. 60 through 62 show an example of a cross-sectional structure of the local bit line LBLD in the middle of the manufacturing according to Configuration Example C of the fourth embodiment. FIGS. 60 through 62 show the cross sections of the same area as that shown in FIG. 41.

The steps shown in FIGS. 60 and 61 correspond to the step shown in FIG. 50, which is part of the manufacturing process of Configuration Example A of the fourth embodiment. The manufacturing steps in Configuration Example C are the same as those of Configuration Example A up to the step of forming the insulating film 38D shown in FIG. 50. Thereafter, the conductive layer 26D is formed as shown in FIG. 60. The conductive layer 26D is embedded in the space D so as to cover the side surface of the insulating film 38D. The conductive layer 26D is ideally embedded in the space D, but it may also be formed in the spaces A to C.

Then, the semiconductor film 37D is formed in the spaces A to C, as shown in FIG. 61. Specifically, the conductors formed in the spaces A to C are first removed in the process of forming the conductive layer 26D. The conductive layer 26D that functions as the inter-MPD local bit line LBLd is thus formed.

The semiconductor film 37D is formed on the surface of the exposed portions in the spaces A to C. The semiconductor film 37D in the spaces A through C is continuous. The bottom of the semiconductor film 37D in the space A is in contact with the p-type well region 20p and is electrically coupled thereto. The semiconductor layer 26D in the space D and the semiconductor film 37D in the spaces A through C are continuous and electrically coupled. The spaces A through C partially remain as spaces even after the semiconductor film 37D is formed.

Thereafter, the memory pillars MPD are formed, as shown in FIG. 62. Specifically, the resistance change film 36D is formed so as to cover the side surface of the semiconductor film 37D in the spaces A through C. The resistance change film 36 in the spaces A to C are continuous and electrically coupled. The bottom of the resistance change film 36D in the space A is in contact with the p-type well region 20p and is electrically coupled thereto.

Next, a core film 35D is formed so as to cover the side wall of the resistance change film 36, and the spaces A through C are thereby filled. The core film 35D in the spaces A through C is continuous. The bottom of the core film 35D in the space A is in contact with the p-type well region 20p.

Next, in the memory pillars MPD, the upper portions of the semiconductor film 37D, the resistance change film 36D, and the core film 35D are removed, and the semiconductor portion 44 is then embedded into the area from which the upper portions are removed. The semiconductor portion 44 is electrically coupled to the semiconductor film 37D and the resistance change film 36D.

Thus, in the memory pillars MPD according to Configuration Example C of the fourth embodiment, the stacked structure of the lower pillar MPDa, the upper pillar MPDb, and the connecting section MPDc is formed at once through the same steps. The process thereafter is the same as the manufacturing process in Configuration Example A of the fourth embodiment.

5.5.3 Advantageous Effects of Configuration Example C

According to Configuration Example C of the fourth embodiment, the following advantageous effects can be achieved in addition to those achieved in Configuration Examples A and B. According to Configuration Example C of the fourth embodiment, a material having a high electric conductivity, such as the conductive layer 26D, can be selected to be embedded in the inter-MPD local bit line LBLd; it is thereby possible to allow a current to flow easily in the local bit line LBLD.

Since Configuration Example C of the fourth embodiment does not have a dummy word line DWL, it is possible to reduce the circuit surface area compared to Configuration Examples A and B. Since there is no need to apply a voltage to the dummy word line DWL in Configuration Example C of the fourth embodiment, it is possible to reduce consumption power and to simplify the control.

5.6. Others

In the foregoing first through fourth embodiments and the first through third modifications, a single set of the structures from the source line SL to the bit line BL is provided above the semiconductor substrate 20; however, those embodiments and modifications are not limited to this example. For example, two or more sets of the structures from the source line SL to the bit line BL may be repeatedly stacked above the semiconductor substrate 20, along the Z axis.

Similarly, in the foregoing fourth and fifth modifications, one set of the structures from the source line SLA to the source line SLB is provided above the semiconductor substrate 20; however, the modifications are not limited to this.

For example, two or more sets of the structures from the source line SLA to the source line SLB may be repeatedly stacked on the semiconductor substrate 20, above the Z axis.

In the case where two sets of the structures from the source line SLA to the source line SLB are stacked along the Z axis, the source line SLB in the lower stacked structure and the source line SLA in the upper stacked structure may be integrated by a single conductive layer. If a conductive layer having a function of integrating the source line SLB in the lower stacked structure to the source line SLA in the upper stacked structure is applied to the fifth modification, this conductive layer may be in a shape projecting both downwardly and upwardly in the area between blocks BLK as compared to the area coupled to the memory pillar MP.

In the above-described fourth and fifth modifications, the memory string set MSS is associated with two subsets SS0 and SS1 each belonging to one of the string units SU0 through SU3; however, the association is not limited to this example. For example, the memory string set MSS may be associated with eight string units SU.

In the foregoing first through third embodiments and the first through fifth modifications, a phase change random access memory (PCRAM) storing data using a resistance change element in which a resistance value changes in accordance with a phase change of itself is explained as an example; however, the embodiments and modifications are not limited to this example. For example, a resistance change type memory using a resistance change element based on a principle differing from that of a PCRAM, such as an interfacial phase change random access memory (iPCRAM) and a resistive random access memory (ReRAM) may be used.

In the first through fourth embodiments, the configuration of the memory cell array 110 may be different from the above-described configuration. For example, the lower pillar MPDa and the upper pillar MPDb may have a tapered shape or a reversed tapered shape. The locations of the lower pillar MPDa and the upper pillar MPDb may be deviated on the XY plane for reasons such as errors due to manufacturing variations.

The drawings referenced to in the descriptions of the first through fourth embodiments show each memory pillar MP having a circular cross-sectional structure; however, the shape of the cross-sectional structure may be oval, or designed as any other shape.

Herein, the term "couple" refers to electrical coupling, and does not exclude interposition of another component. Expressions such as "electrically coupled" cover insulator-interposed coupling that allows for the same operation as electrical coupling without an insulator.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A memory device comprising:
 a first conductive layer, at least a single second conductive layer, a third conductive layer, a fourth conductive layer, and a fifth conductive layer being stacked above a substrate in this order in a first direction;

a first insulating layer splitting each of the first conductive layer, the second conductive layer, the third conductive layer, the fourth conductive layer, and the fifth conductive layer into a first portion and a second portion aligned in a second direction orthogonal to the first direction;

a second insulating layer splitting the first portion of the second conductive layer into a first sub portion and a second sub portion aligned in the second direction;

a third insulating layer splitting the first portion of the fifth conductive layer into a first sub portion and a second sub portion aligned in the second direction;

a first structure extending in the first direction in the first portion of the first conductive layer and the first sub portion of the second conductive layer, and being in contact with a lower surface of the first portion of the third conductive layer;

a second structure extending in the first direction in the first portion of the first conductive layer and the second sub portion of the second conductive layer and being in contact with a lower surface of the first portion of the third conductive layer;

a third structure extending in the first direction in the first portion of the fourth conductive layer and the first sub portion of the fifth conductive layer and being in contact with an upper surface of the first portion of the third conductive layer; and a fourth structure extending in the first direction in the first portion of the fourth conductive layer and the second sub portion of the fifth conductive layer and being in contact with an upper surface of the first portion of the third conductive layer, wherein:

each of the first structure and the second structure includes:
- a first resistance change film extending in the first direction in the first conductive layer;
- a first semiconductor film extending in the first direction in the first conductive layer and the second conductive layer and being in contact with the first resistance change film in the first direction; and
- a first insulating film provided between the first conductive layer and the first semiconductor film and between the second conductive layer and the first semiconductor film; and each of the third structure and the fourth structure includes:
- a second resistance change film extending in the first direction in the fourth conductive layer;
- a second semiconductor film extending in the first direction in the fourth conductive layer and the fifth conductive layer and being in contact with the second resistance change film in the first direction; and
- a second insulating film provided between the fourth conductive layer and the second semiconductor film and between the fifth conductive layer and the second semiconductor film.

2. The memory device according to claim 1, wherein the first resistance change film in each of the first structure and the second structure extends in the first direction in the first conductive layer and the second conductive layer.

3. The memory device according to claim 2, wherein a thickness of the second conductive layer in the first direction is greater than a thickness of the fifth conductive layer in the first direction.

4. The memory device according to claim 2, wherein a number of the second conductive layers stacked in the first direction is greater than a number of the fifth conductive layers stacked in the first direction.

5. The memory device according to claim 1, wherein a lower end of each of the first structure and the second structure is in contact with the substrate.

6. The memory device according to claim 1, further comprising a sixth conductive layer provided between the substrate and the first conductive layer and being in contact with a lower end of each of the first structure and the second structure.

7. The memory device according to claim 6, wherein a thickness of the sixth conductive layer in the first direction is greater in an area where the sixth conductive layer is in contact with the first structure and the second structure than in an area between the first portion and the second portion of the first conductive layer.

8. A memory device comprising:

a first conductive layer, at least a single second conductive layer, a third conductive layer, and a fourth conductive layer being stacked in this order in a first direction;

a first insulating layer splitting the second conductive layer into a first portion and a second portion in a second direction orthogonal to the first direction;

a first structure extending in the first direction through the first conductive layer, the first portion of the second conductive layer, the third conductive layer, and the fourth conductive layer; and a second structure extending in the first direction through the first conductive layer, the second portion of the second conductive layer, the third conductive layer, and the fourth conductive layer, wherein:

the first structure includes a first resistance change film and a first semiconductor film being in contact with the first resistance change film in the first direction, the second structure includes a second resistance change film and a second semiconductor film being in contact with the second resistance change film in the first direction, the first semiconductor film is located between the first resistance change film and the third conductive layer, the second semiconductor film is located between the second resistance change film and the third conductive layer, and the first semiconductor film, the second semiconductor film, and the third conductive layer are connected to each other.

9. The memory device according to claim 8, further comprising a fifth conductive layer provided on a side of the fourth conductive layer in the first direction, wherein:

the first resistance change film extends in the first direction through the first conductive layer, the second conductive layer, the third conductive layer, and the fourth conductive layer, the first semiconductor film extends in the first direction through the first conductive layer, the second conductive layer, the third conductive layer, the fourth conductive layer, and the fifth conductive layer, the second resistance change film extends in the first direction through the first conductive layer, the second conductive layer, the third conductive layer, and the fourth conductive layer, and the second semiconductor film extends in the first direction through the first conductive layer, the second conductive layer, the third conductive layer, the fourth conductive layer, and the fifth conductive layer.

10. The memory device according to claim 8, further comprising:
- a fifth conductive layer provided on a side of the fourth conductive layer in the first direction; and
- a second insulating layer splitting the fifth conductive layer into a third portion and a fourth portion aligned in the second direction, wherein:
the first structure extends in the first direction through the third portion of the fifth conductive layer, and
the second structure extends in the first direction through the fourth portion of the fifth conductive layer.

11. The memory device according to claim 8, wherein:
the first structure further comprises a first insulating film provided between the first conductive layer and the first semiconductor film, between the second conductive layer and the first semiconductor film, and between the fourth conductive layer and the first semiconductor film, and
the second structure further comprises a second insulating film provided between the first conductive layer and the second semiconductor film, between the second conductive layer and the second semiconductor film, and between the fourth conductive layer and the second semiconductor film.

12. The memory device according to claim 8, wherein the third conductive layer includes tungsten, silicon, or silicon doped with phosphorous or boron.

13. The memory device according to claim 8, wherein:
the third conductive layer includes a first material,
the first semiconductor film includes the first material, and
the second semiconductor film includes the first material.

14. The memory device according to claim 8, further comprising:
a fifth conductive layer that is provided between the third conductive layer and the fourth conductive layer and applies a voltage to the third conductive layer.

15. The memory device according to claim 8, further comprising a fifth conductive layer provided on a side of the fourth conductive layer in the first direction,
wherein a thickness of the second conductive layer in the first direction is greater than a thickness of the fifth conductive layer in the first direction.

16. The memory device according to claim 8, further comprising a fifth conductive layer provided on a side of the fourth conductive layer in the first direction,
wherein a number of the second conductive layers stacked in the first direction is greater than a number of the fifth conductive layers stacked in the first direction.

17. The memory device according to claim 10, further comprising:
- a substrate below the first conductive layer with respect to the first direction; and
- a third insulating layer splitting each of the first conductive layer, the second conductive layer, the third conductive layer, the fourth conductive layer, and the fifth conductive layer into a fifth portion and a sixth portion aligned in the second direction, wherein the fifth portion includes the first and second portions of the second conductive layer, and the third and fourth portions of the fifth conductive layer.

18. The memory device according to claim 11, further comprising:
a second insulating layer that surrounds the third conductive layer,
wherein:
the second insulating layer is in contact with the first insulating film and the second insulating film,
the second insulating layer includes a second material,
the first insulating film includes the second material, and
the second insulating film includes the second material.

19. The memory device according to claim 17, wherein a lower end of each of the first structure and the second structure is in contact with the substrate.

20. The memory device according to claim 17 further comprising:
a sixth conductive layer provided between the substrate and the first conductive layer and being in contact with a lower end of each of the first structure and the second structure.

21. The memory device according to claim 18, wherein:
the third conductive layer includes silicon or silicon doped with phosphorous or boron, and
the memory device further comprises a fifth conductive layer that is provided between the third conductive layer and the fourth conductive layer and applies a voltage to the third conductive layer.

22. The memory device according to claim 20, wherein a thickness of the sixth conductive layer in the first direction is greater in an area where the sixth conductive layer is in contact with the first structure and the second structure than in an area between the first portion and the second portion of the first conductive layer.

* * * * *